(12) United States Patent
Jen et al.

(10) Patent No.: US 8,343,636 B2
(45) Date of Patent: Jan. 1, 2013

(54) CROSSLINKABLE HOLE-TRANSPORTING MATERIALS FOR ORGANIC LIGHT-EMITTING DEVICES

(75) Inventors: Kwan-Yue Jen, Kenmore, WA (US); Shi Michelle Liu, Kenmore, WA (US); Yu-Hua Niu, Seattle, WA (US)

(73) Assignee: University of Washington, Seattle, WA (US)

( * ) Notice: Subject to any disclaimer, the term of this patent is extended or adjusted under 35 U.S.C. 154(b) by 561 days.

(21) Appl. No.: 12/267,309

(22) Filed: Nov. 7, 2008

(65) Prior Publication Data

US 2009/0278445 A1    Nov. 12, 2009

Related U.S. Application Data

(63) Continuation of application No. PCT/US2007/011301, filed on May 9, 2007.

(60) Provisional application No. 60/799,064, filed on May 9, 2006.

(51) Int. Cl.
*H01L 51/54* (2006.01)

(52) U.S. Cl. ........ 428/690; 428/917; 313/504; 313/505; 313/506; 564/426; 564/434; 257/40; 257/E51.05; 257/E51.026; 257/E51.032

(58) Field of Classification Search ............... 428/690, 428/917; 313/504, 505, 506; 257/40, E51.05, 257/E51.026, E51.032; 564/426, 434
See application file for complete search history.

(56) References Cited

FOREIGN PATENT DOCUMENTS

| EP | 0861845 A2 | 9/1998 |
|---|---|---|
| WO | 97/49548 A1 | 12/1997 |
| WO | 2005/060624 A2 | 7/2005 |

OTHER PUBLICATIONS

Jen et. al., Thermally crosslinkable hole transporing layers,2006, Applied Physics Letters, vol. 88, pp. 093505-1 to 093505-3.*
Cui et. al., Anode interfacial . . . Hole Transport layer . . . , 2002, Langmuir, vol. 18, pp. 9958-9970.*
Bai et. al., A Hole Transporting Martertial . . . Triphenylamine, 2006,Advanced Functional Materials, vol. 16., pp. 1343-1348.*
Jen et. al., Perfluorocyclobutan-Baed Arylamine . . . , 2002, Advanced Functional Materials, vol. 12, Issues 11-12, pp. 745-751.*
Jen et. al., Thermally crosslinked hole-trnasporting layers for cascade hole-injection and effective electron-blocking.exciton-confinement in phosphorescent polymer light-emitting diodes, 2006, Applied Physics Letters, vol. 88, pp. 093505-1 to 093505-3.*
Cui, J., et al., "Anode Interfacial Engineering Approaches to Enhancing Anode/Hole Transport Layer Interfacial Stability and Charge Injection Efficiency in Organic Light-Emitting Diodes," Langmuir 18(25):9958-9970, Dec. 2002.
Huang, Q., et al., "Covalently Bound Hole-Injecting Nanostructures. Systematics of Molecular Architecture, Thickness, Saturation, and Electron-Blocking Characteristics on Organic Light-Emitting Diode Luminance, Turn-on Voltage, and Quantum Efficiency," Journal of the American Chemical Society 127(29):10227-10242, Jul. 2005.
Huang, Q., et al., "Molecularly 'Engineered' Anode Adsorbates for Probing OLED Interfacial Structure-Charge Injection/Luminance Relationships: Large, Structure-Dependent Effects," Journal of the American Chemical Society 125(48):14704-14705, Dec. 2003.
Huang, Q., et al., "Systematic Investigation of Nanoscale Adsorbate Effects at Organic Light-Emitting Diode Interfaces: Interfacial Structure-Charge Injection-Luminance Relationships," Chemistry of Materials 18(9):2431-2442, May 2006.
International Search Report mailed Nov. 26, 2007, issued in corresponding International Application No. PCT/US2007/011301, filed May 9, 2007.
Bayerl, M.S., et al., "Crosslinkable Hole-Transport Materials for Preparation of Multilayer Organic Light Emitting Devices for Spin-Coating," Macromolecular Rapid Communications 20(4):224-228, Apr. 1999.
Yang, X., et al., "Highly Efficient Polymeric Electrophosphorescent Diodes," Advanced Materials 18(7):948-954, Apr. 2006.
Zacharias, P., et al., "New Crosslinkable Hole Conductors for Blue-Phosphorescent Organic Light-Emitting Diodes," Angewandte Chemie International Edition 46(23): 4388-4392, Jun. 2007.

* cited by examiner

*Primary Examiner* — Jennifer Chriss
*Assistant Examiner* — Gregory Clark
(74) *Attorney, Agent, or Firm* — Christensen O'Connor Johnson Kindness PLLC

(57) ABSTRACT

Crosslinkable compounds useful for making hole-transporting materials for organic light-emitting devices, hole-transporting layers made from the crosslinkable compounds, and light-emitting devices that include the hole-transporting layers.

12 Claims, 42 Drawing Sheets

Bu-TCTA, 9

FIGS. 20 A-D.

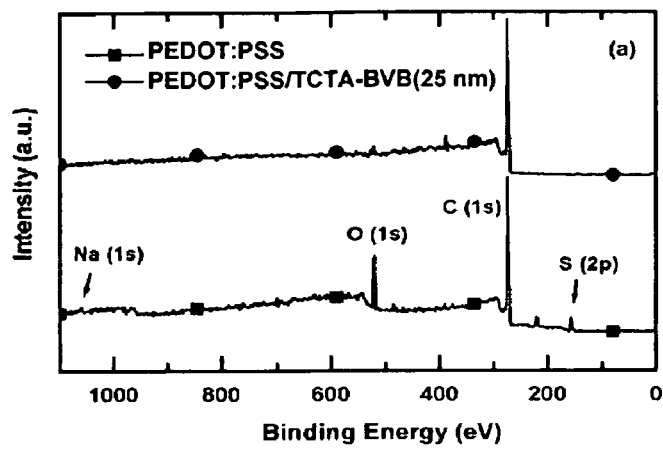
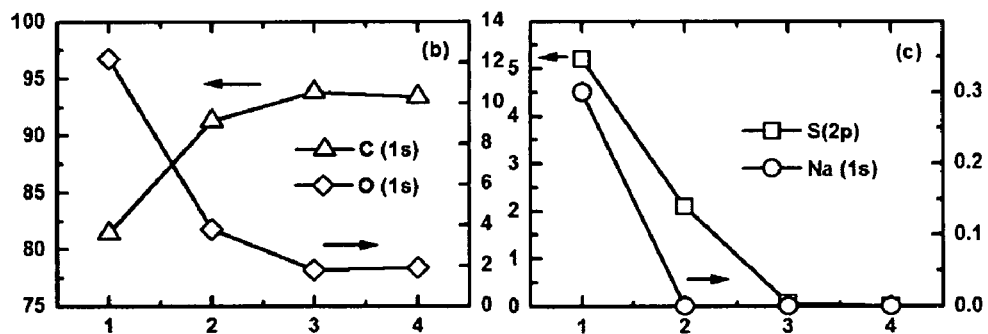
FIG. 35A.
FIG. 35B.   FIG. 35C.

CROSSLINKABLE HOLE-TRANSPORTING MATERIALS FOR ORGANIC LIGHT-EMITTING DEVICES

CROSS-REFERENCES TO RELATED APPLICATIONS

This application is a continuation of International Application No. PCT/US2007/011301, filed May 9, 2007, which claims the benefit of U.S. Provisional Application No. 60/799,064, filed May 9, 2006. Each application is expressly incorporated herein by reference in its entirety.

STATEMENT OF GOVERNMENT LICENSE RIGHTS

This invention was made with Government support under Contract No. DMR0103009, awarded by the National Science Foundation. The Government has certain rights in the invention.

BACKGROUND OF THE INVENTION

Organic and polymer light-emitting diodes (LEDs) have been the subject of intensive investigation in recent years because of their potential applications as emissive elements for flat panel displays and white light sources for general lighting. In general, LEDs comprise multilayer configurations having hole-transporting, emissive, and electron-transporting layers to balance the injection and transport of both holes and electrons. Holes and electrons are injected from opposing electrodes into the light-emitting layer and recombine to form excitons. Light emits as a result of the emissive decay of the excitons.

For LEDs based on small molecules, it is rather straightforward to adopt this multi-layer strategy via layer-by-layer vacuum deposition. For polymer-based LEDs, films can be formed by spin-coating techniques via solution processing.

There are several advantages of polymer-based LEDs made by spin-coating techniques. Spin-coating techniques can significantly reduce the production cost and allow for large area coating. In addition, using spin-coated hole-transporting polymers instead of the vapor-deposited small-molecule materials can potentially increase the glass transition temperature along with improving the thermal and morphological stability of the devices.

A challenge in fabricating multilayer devices by spin coating is that the first spin-coated layer can be adversely affected by being re-dissolved by the solvent used in spin coating the second layer. As a result, the first coated layer must have resistance against solvents used in forming the second layer.

Hole-transporting layers (HTLs) play an important role in fabricating high efficiency multilayer polymer light-emitting diodes (PLEDs). HTLs allow enhanced hole injection from an indium tin oxide (ITO) anode into a light-emitting layer (EML) and results in balanced charge injection/transport and better device performance. Hole-transporting materials (HTMs) are often the first layer applied to an anode followed by sequential layer-by-layer fabrication of a LED. Therefore, for use as a HTL in multilayer PLEDs, the hole-transporting material needs to have solvent resistance to allow spin-coating of a second overlying layer.

A variety of approaches have been reported to overcome interfacial mixing that occurs during the spin-coating process: thermal or photochemical crosslinking before applying the second layer; formation of a self-assembly layer on ITO; and utilization of solubility difference between polar and non-polar solvents. However, many of these approaches involve complicated and low efficiency polymer synthesis and produce devices with inconsistent and irreproducible quality. Therefore, there is a need for high purity and low-molecular-weight HTMs that can directly undergo in-situ crosslinking and simultaneously generate solvent-proof networks.

Recently, the efficiency of PLEDs has been significantly increased by incorporating phosphorescent dopants in polymer hosts to harvest both singlet and triplet excitons. In this case, both singlet and triplet excitons formed in the host can be transferred to the phosphorescent dopant by Förster and Dexter energy transfer processes, allowing the devices to reach high internal quantum efficiency. In blue- or green-emitting electrophosphorescent PLEDs that include high energy phosphors, large bandgap host materials with triplet energy higher than that of the phosphorescent emitter are needed in order to avoid back energy transfer from the triplet dopants to the host. Due to high HOMO energy level of these large gap hosts (usually greater than about −5.8 eV), it is difficult to achieve efficient hole injection from ITO into the EML if only a single HTL is employed in the device configuration. To alleviate these problems, multiple HTLs with stepped electronic profiles to provide cascade hole-injection and transport are needed to achieve improved hole injection and charge confinement, and to attain improved efficiency in PLED devices.

The same concept can be applied to the quantum dot (QD) OLEDs as well, where the hole injection is extremely inefficient due to the high HOMO energy levels of the QDs (usually greater than about −6.0 eV).

A challenge exists to realize a multi-HTL structure in PLEDs because the multilayer structure preferably includes HTLs having solvent resistance and compatibility. Recently, cascade hole injection has been demonstrated through the layer-by-layer deposition of a series of photocrosslinkable triarylamine derivatives with oxetane functionality. Other polymers, such as poly(p-phenylenevinylene) (PPV), poly (N-vinylcarbazole) (PVK), poly(2,7-(9,9-di-n-octylfluorene)-alt-(1,4-phenylene-((4-sec-butyl phenyl)imino)-1,4-phenylene) (TFB), and the ethanol-soluble PVK salt, PVK-$SO_3Li$, have also been mentioned as suitable materials for functioning as the second HTL between poly(3,4-ethylenedioxythiophene):(polystyrene sulfonic acid) (PEDOT:PSS) and EML. However, the polymers noted above either produce reactive by-products during conversion process (e.g., PPV) or bear metal ions (e.g., PVK-$SO_3Li$) that are detrimental to the long-term stability of the devices. In addition to these problems, none of above-mentioned materials possess significantly high triplet energies to confine blue-excitons, further limiting their use in electrophosphorescent devices. Therefore, there is a need for a multi-HTL structure in PLEDs in which the hole-transporting materials possess high triplet energies, as well as solvent resistance and compatibility.

Despite advances in the development of LED devices and hole-transporting materials, a need exists for compounds with solvent resistance and compatibility, for hole-transporting structures with improved hole injection and charge confinement, and for LED devices with long-term stability and high efficiency. The present invention seeks to fulfill these needs and provides further related advantages.

SUMMARY OF THE INVENTION

In one aspect, the present invention provides compounds that are useful as hole-transporting materials and for making hole-transporting layers in light-emitting devices.

In one embodiment, the present invention provides compound, comprising:

(a) a conjugated π-electron system comprising a triaryl amine moiety; and (b) two or more crosslinkable moieties;

wherein the compound is reversibly oxidizable in an anodic oxidation process to form stable cation radicals.

In one embodiment, the present invention provides compounds having the formula:

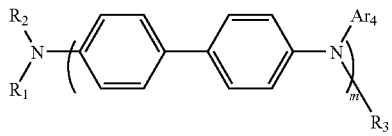

(I)

wherein
$R_1$ is $Ar_1$ or $Ar_1\text{-}(L_1)_n\text{-}L$;
$R_2$ is $Ar_2$ or $Ar_2\text{-}(L_2)_o\text{-}L$;
$R_3$ is $Ar_3$ or $Ar_3\text{-}(L_3)_p\text{-}L$;
$Ar_1$, $Ar_2$, $Ar_3$, and $Ar_4$ are independently selected from unsubstituted and substituted aryl groups;
$L_1$, $L_2$, and $L_3$ are linker moieties that covalently couple L to $Ar_1$, $Ar_2$, and $Ar_3$, respectively;
m, n, o, and p are independently selected from 0 or 1;
L is a crosslinkable moiety; and wherein the compound has two or more L moieties.

In one embodiment, the present invention provides compounds having the formula:

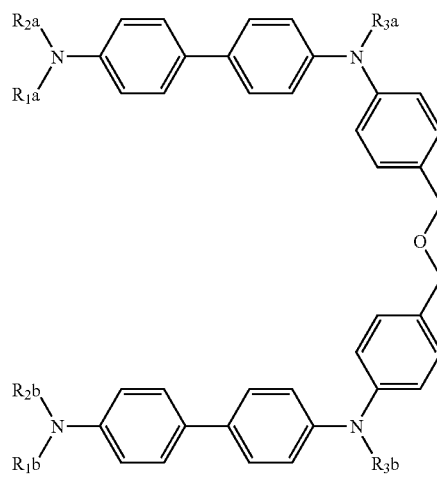

(II)

wherein
$R_{1a}$ is $Ar_{1a}$ or $Ar_{1a}\text{-}(L_{1a})_n\text{-}L$;
$R_{1b}$ is $Ar_{1b}$ or $Ar_{1b}\text{-}(L_{1b})_n\text{-}L$
$R_{2a}$ is $Ar_{2a}$ or $Ar_{2ba}\text{-}(L_{2a})_o\text{-}L$;
$R_{2b}$ is $Ar_{2b}$ or $Ar_{2b}\text{-}(L_{2b})_n\text{-}L$
$R_{3a}$ is $Ar_{3a}$ or $Ar_{3a}\text{-}(L_{3a})_p\text{-}L$;
$R_{3b}$ is $Ar_{3b}$ or $Ar_{3b}\text{-}(L_{3b})_n\text{-}L$
$Ar_{1a}$, $Ar_{1b}$, $Ar_{2a}$, $Ar_{2b}$, $Ar_{3a}$, and $Ar_{3b}$ are independently selected from unsubstituted and substituted aryl groups;
$L_{1a}$, $L_{1b}$, $L_{2a}$, $L_{2b}$, $L_{3a}$, and $L_{3b}$ are linker moieties that covalently couple L to $Ar_{1a}$, $Ar_{1b}$, $Ar_{2a}$, $Ar_{2b}$, $Ar_{3a}$, and $Ar_{3b}$, respectively;
n, o, and p are independently selected from 0 or 1;
L is a crosslinkable moiety, and wherein the compound has two or more L groups.

In one embodiment, the present invention provides compounds having the formula:

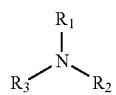

(III)

wherein
$R_1$ is $Ar_1$ or $Ar_1\text{-}(L_1)_n\text{-}L$;
$R_2$ is $Ar_2$ or $Ar_2\text{-}(L_2)_o\text{-}L$;
$R_3$ is $Ar_3$ or $Ar_3\text{-}(L_3)_p\text{-}L$;
$Ar_1$, $Ar_2$, and $Ar_3$ are independently selected from unsubstituted and substituted aryl groups;
$L_1$, $L_2$, and $L_3$ are linker moieties that covalently couple L to $Ar_1$, $Ar_2$, and $Ar_3$, respectively;
n, o, and p are independently selected from 0 or 1;
L is a crosslinkable moiety; and wherein the compound has two or more L groups.

In another aspect, the present invention provides hole-transporting layers useful in multilayer light-emitting devices.

In one embodiment, the hole-transporting layer of the invention comprises a crosslinked hole-transporting material derived from a crosslinkable compound having formula I.

In one embodiment, the hole-transporting layer of the invention comprises a crosslinked hole-transporting material derived from a crosslinkable compound having formula II.

In one embodiment, the hole-transporting layer of the invention comprises a hole-transporting material derived from a crosslinkable compound having formula III.

In another aspect, the present invention provides a bilayer hole-transporting structure useful in multilayer light-emitting devices.

In one embodiment, the hole-transporting bilayer comprises:
(a) a first layer comprising a crosslinked hole-transporting material and having a first solid state ionization potential;
(b) a second layer comprising a crosslinked hole-transporting material and having a second solid state ionization potential,
wherein the first solid state ionization potential is less than the second solid state ionization potential.

The crosslinked hole-transporting materials of the first or second layers can be derived from a crosslinkable compound of the invention having formulas I, II, or III.

In one aspect, the present invention provides an integrated hole-injection and hole-transporting layer useful in multilayer light-emitting devices.

In one embodiment, the integrated hole-injection and hole-transporting layer comprises:
(a) a hole-injection layer, and
(b) a hole-transporting layer, wherein the hole-transporting layer comprises a crosslinked hole-transporting material and wherein the crosslinked hole-transporting material is formed by crosslinking on the surface of the hole-injection layer.

The crosslinked hole-transporting materials can be derived from a crosslinkable compound of the invention having formulas I, II, or III.

In another aspect, the present invention provides light-emitting devices that include a hole-transporting layer made from one or more of the crosslinkable compounds of the invention.

In one embodiment, the device comprises,
(a) an anode;
(b) a cathode;
(c) an emissive layer intermediate the anode and the cathode; and
(d) a hole-transporting layer intermediate the anode and the emissive layer, wherein the hole-transporting layer comprises a crosslinked hole-transporting material derived from a crosslinkable compound having formula I, II, or III.

In one embodiment, the device comprises,
(a) an anode;
(b) a cathode;
(c) an emissive layer intermediate the anode and the cathode; and
(d) a hole-transporting layer intermediate the anode and the emissive layer, wherein the hole-transporting layer comprises a bilayer structure comprising:
  (i) a first layer comprising a crosslinked hole-transporting material and having a first solid state ionization potential;
  (ii) a second layer comprising a crosslinked hole-transporting material and having a second solid state ionization potential,
wherein the first solid state ionization potential is less than the second solid state ionization potential.

The crosslinked hole-transporting materials of the first or second layers can be derived from a crosslinkable compound of the invention having formulas I, II, or III.

In one embodiment, the device comprises,
(a) an anode;
(b) a cathode;
(c) an emissive layer intermediate the anode and the cathode; and
(d) an integrated hole-injection and hole-transporting layer intermediate the anode and the emissive layer, wherein the integrated hole-injection and hole-transporting layer comprises a hole-injection layer and a hole-transporting layer, wherein the hole-transporting layer comprises a crosslinked hole-transporting material derived from a crosslinkable compound having the formula I, II, or III.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 34A demonstrates the UV-Vis absorbance of the TCTA-BVB films partially crosslinked at 160° C. for 30 min; inset of FIG. 34A is the heat flow versus temperature results obtained through the differential scanning calorimetric (DSC) measurement showing that during the first ramp (■), the thermal crosslinking process of the pristine TCTA-BVB begins at around 150° C. and peaks at 170° C., with Tg around 80° C. and an exothermic peak summit at 170° C.; after isothermal for 30 min at 180° C., the sample was cooled down to the room temperature and re-scanned; during the second ramp (●), a broad transition with Tg centered at around 175° C. was detected; the ramp rate was 10° C./min in both scans; FIG. 25B demonstrates the UV-Vis absorbance of the TCTA-BVB films that were fully crosslinked at 180° C. for 30 min; inset of FIG. 34B shows the surface morphology of the crosslinked (180° C. for 30 min) TCTA-BVB film on top of a layer of PEDOT:PSS on ITO.

FIGS. 35A-35C show the measurements from X-ray photoelectron spectroscopy (XPS) conducted on both PEDOT:PSS film and the representative integrated hole-injection/transporting bilayers, PEDOT:PSS/crosslinked TCTA-BVB bilayers with different TCTA-BVB coverage thickness; FIG. 35A compares the XPS spectrum of a TCTA-BVB film crosslinked at 180° C. for 30 min on a layer of PEDOT:PSS on ITO and that of the PEDOT:PSS; FIGS. 35B and 35C are the variation of the relative surface atomic concentrations that were averaged from 3-spots test results; on the x-axis of FIGS. 35B and 35C, 1 corresponds to PEDOT:PSS film, 2 corresponds to PEDOT:PSS/TCTA-BVB (15 nm); 3 corresponds to PEDOT:PSS/TCTA-BVB (25 nm); and 4 corresponds to PEDOT:PSS/TCTA-BVB (34 nm); all the films were thermally cured at 180° C. for 30 min on a hotplate in argon-protected glovebox.

DETAILED DESCRIPTION OF THE INVENTION

Figure 1:
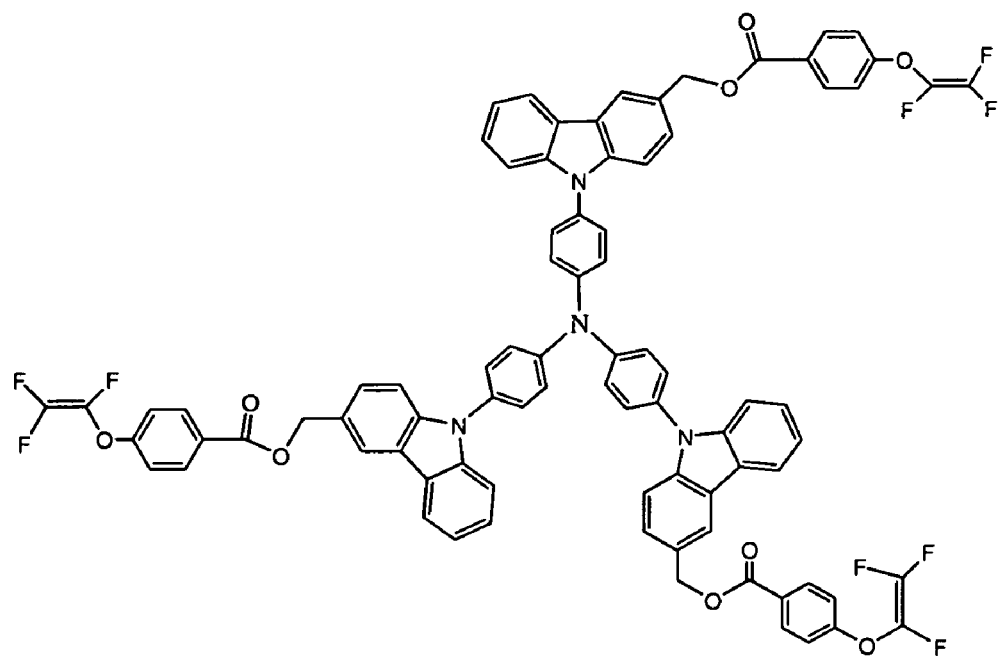
FIG. 1 shows the structure of tris(4-carbazole)triphenylamine-tris(trifluorovinyl ether) (TCTA-TTFV), a representative compound of the invention.
Figure 2:
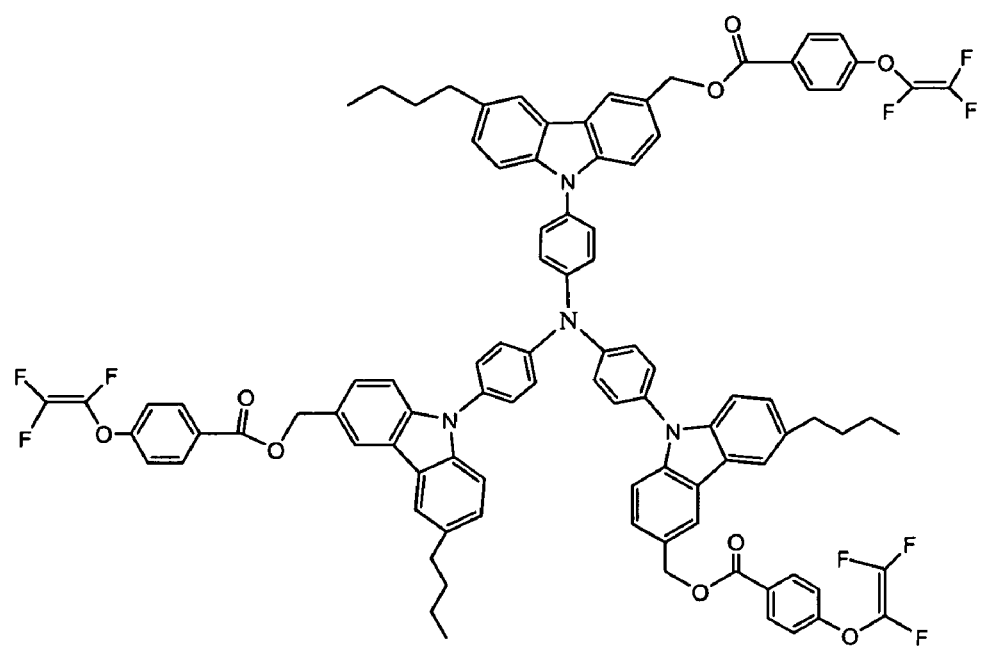
FIG. 2 shows the structure of 4,4',4''-tris(N-3-n-butyl-carbazole)triphenylamine-tris(trifluorovinyl ether) (Bu-TCTA-TTFV), a representative compound of the invention.
Figure 3:
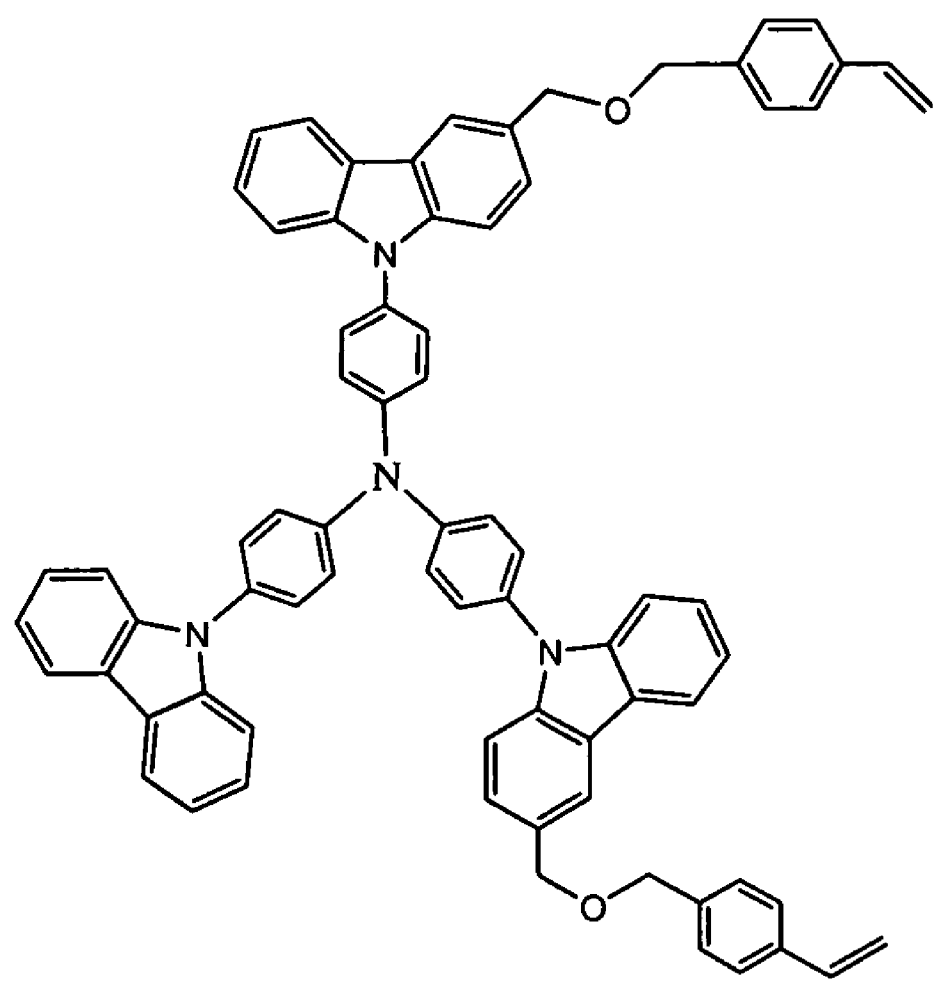
FIG. 3 shows the structure of tris(4-carbazole)triphenylamine-bis(vinyl benzyl ether) (TCTA-BVB), a representative compound of the invention.
Figure 4A:
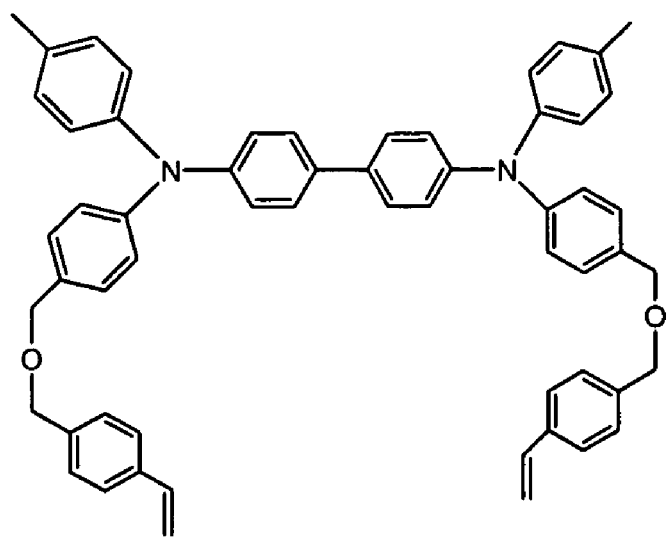
FIGS. 4A and 4B show the structures of TPD-BVB (1-TPD) and NPD-BVB (1-NPD), representative compounds of the invention.
Figure 4B:
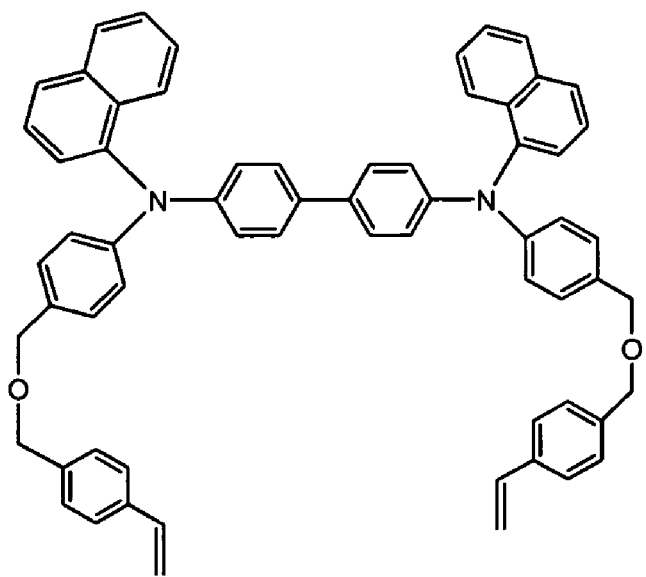
Figure 5A:
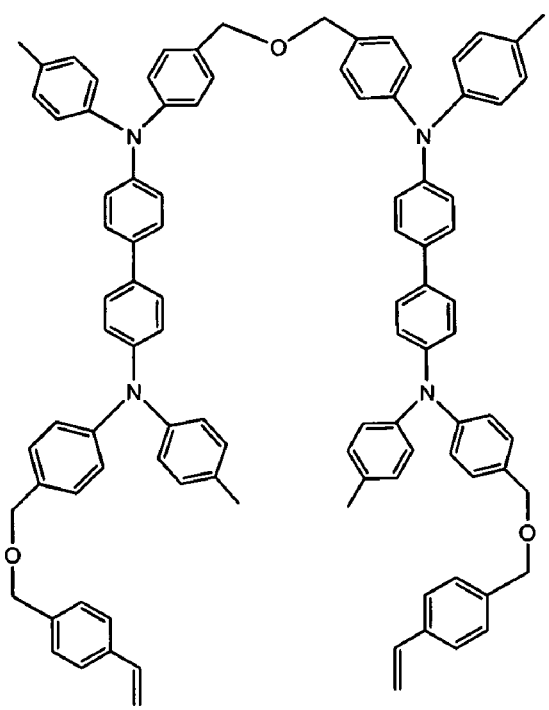
FIGS. 5A and 5B show the structures of BTPD-BVB (2-TPD) and BNPD-BVB (2-NPD), representative compounds of the invention.
Figure 5B:
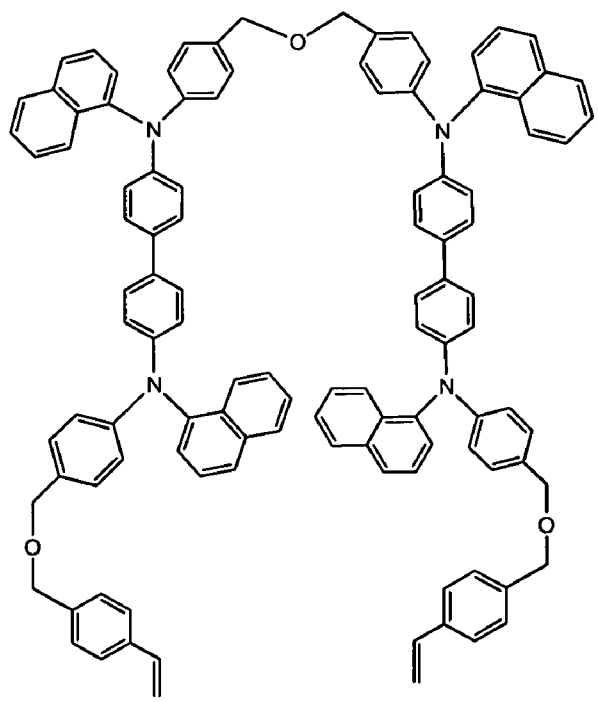
Figure 6:
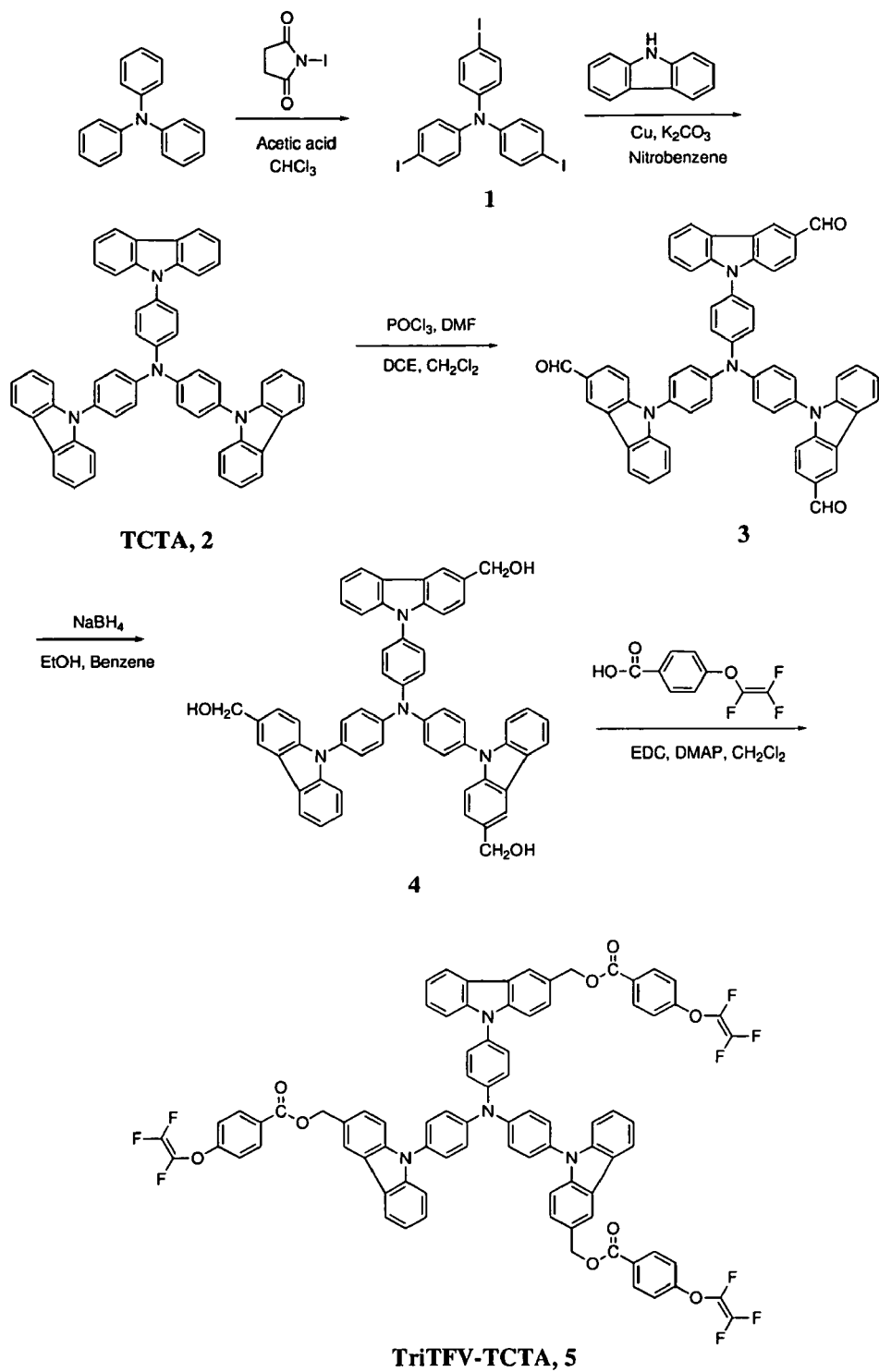
FIG. 6 is a schematic illustration of the preparation of a representative compound of the invention, TCTA-TTFV.
Figure 7:
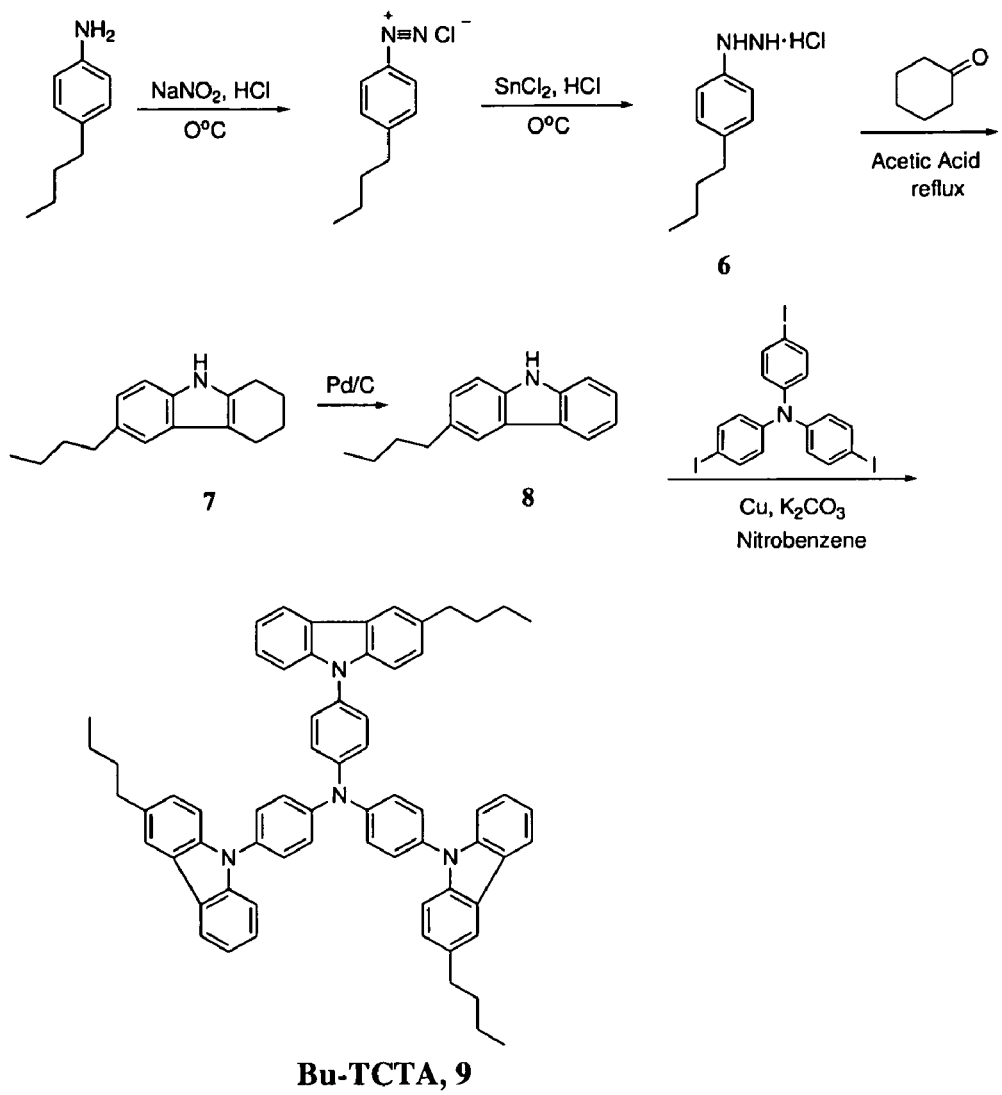
FIG. 7 is a schematic illustration of the preparation of 4,4',4''-tris(N-3-n-butyl-carbazole)triphenylamine (Bu-TCTA), a compound useful for making crosslinkable compounds of the invention.

The present invention provides compounds useful for making hole-transporting layers for light-emitting devices, hole-transporting layers for light-emitting devices made from the compounds, light-emitting devices that include the hole-transporting layers, and methods for making the compounds, layers, and devices. The compounds of the invention are crosslinkable compounds and, on crosslinking, form stable and efficient hole-transporting layers.

High-performance organic or polymer light-emitting devices have multilayer configurations having hole-transporting, emissive, and electron-transporting layers to balance the injection and transport of both holes and electrons. To form a hole-transporting layer, low-molecular weight hole-transporting material can be sublimated and deposited onto an anode under vacuum. Alternatively, the hole-transporting material can be spin-coated onto any anode via solution processing. The spin-coating technique can significantly reduce the production cost and allow for large area coating. In addition, using spin-coated hole-transporting polymers instead of the vapor-deposited small-molecule materials can potentially increase the glass transition temperature along with improving the thermal and morphological stability of the devices. The present invention provides crosslinkable compounds that can be spin coated onto anodes or onto the hole-transport layers (HTLs) having lower solid state ionization potentials and that undergo in-situ crosslinking reaction to generate solvent-proof networks as HTLs useful in light-emitting devices.

The basic principles of an organic light emitting device include the injection of electrons from one electrode and injection of holes from the other electrode. The electrons move through the electron-transport layer (ETL), while the holes move through the HTL, until the capture of the oppositely charged carriers or recombination, followed by the radiative decay of the excited electron-hole state or exciton. The color of the light emitted during this process is determined by the band gap of the exciton.

In order to obtain high efficiencies and the a long lifetime, a device must contain the following features: low injection barriers at the interface between the metal electrodes and organic material, allowing for as many charges as possible into the system; a balance of electron and hole density and mobility, so that, for example, the majority of the holes do not reach the cathode before they are captured by an electron, decreasing the efficiency of the system; a recombination zone away from the metal cathode, so that the holes are not annihilated by the cathode before recombination; and a high thermal stability of all of the organic material so that they can sustain fabrication conditions.

In order to obtain a balance of electron and hole density and mobility, where the rate of injection of positive charges is equal to the rate of injection of negative charges, the electron-transporting layer (ETL) should have an electron affinity (EA) close to the work function of the cathode, and the ionization potential (IP) of the hole-transporting material (HTM) should match the work function of the anode, usually indium-tin-oxide (ITO).

Because the role of hole-transporting layer is to facilitate hole injection from the anode into the organic layer, accepting holes, and transporting injected holes to the emitting layer, hole-transporting material must have lower solid state ionization potentials, close to the work function of the anode, or matched HOMO to assist in hole injection. In addition, in order to achieve high efficiency of the device, the hole-transporting layer should also block electrons from escaping from the emitting layer to the anode, which requires that hole-transporting material must have small electron affinities or high LUMO which assists in electron blocking.

ABBREVIATIONS

The following is a listing of abbreviations used herein and their definitions.

AFM atomic force microscopy
BNPD bi-N,N'-diphenyl-N,N'-bis(1-naphthyl)-1,1'-biphenyl-4,4'-diamine
BNPD-BVB bi-N,N'-diphenyl-N,N'-bis(1-naphthyl)-1,1'-biphenyl-4,4'-diamine-bis(vinyl benzyl ether) (2-NPD)
BTPD bi-N,N'-diphenyl-N,N'-bis-(3-methylphenyl)-(1,1')-biphenyl-4,4'-diamine
BTPD-BVB bi-N,N'-diphenyl-N,N'-bis-(3-methylphenyl)-(1,1')-biphenyl-4,4'-diamine-bis(vinyl benzyl ether) (2-TPD)
Bu-TCTA 4,4',4''-tris(N-3-n-butyl-carbazole)triphenylamine
Bu-TCTA-PFCB 4,4',4''-tris(N-3-n-butyl-carbazole)triphenylamine-perfluorocyclobutane
Bu-TCTA-TTFV 4,4',4''-tris(N-3-n-butyl-carbazole)triphenylamine-tris(trifluorovinyl ether)
BVB bis(vinyl benzyl)
Cv cyclic voltammetry
DCE 1,2-dichloroethane
DMAP 4-(dimethylamino)pyridine
DMF N'N-dimethylformamide
DSC differential scanning calorimeter
EDC 1-[3-(dimethylamino)propyl]-3-ethylcarbodiimde hydrochloride
EIL electron-injection layer
EL electroluminescent
EML light-emitting layer
ETL electron-transport layer
FIr6 bis(4',6'-difluorophenylpyridinato)tetrakis(1-pyrazolyl)borate
HIL Hole-injection layer
HOMO highest occupied molecular orbital
HTL hole-transporting layer
HTM hole-transporting material
IPN interpenetrating networks
ITO indium tin oxide
LE luminous efficiency
LED light-emitting diode
LOMO lowest occupied molecular orbital
NIS N-iodosuccinimide
NPD N,N'-diphenyl-N,N'-bis(1-naphthyl)-1,1'-biphenyl-4,4'-diamine
NPD-BVB N,N'-diphenyl-N,N'-bis(1-naphthyl)-1,1'-biphenyl-4,4'-diamine-bis(vinyl benzyl ether) (1-NPD)
OLED organic light-emitting diode
PE power efficiency
PEDOT:PSS poly(3,4-ethylenedioxythiophene):(polystyrene sulfonic acid)
PFBT5 poly[2,7-(9,9'-dihexylfluorene)-co-4,7-(2,1,3-benzothiadiazole)]
PFCB perfluorocyclobutane
PL photoluminescent
PLED polymer light-emitting diode
PPV poly(p-phenylenevinylene)
PS polystyrene
PS-TPD-TFV polystyrene-N,N'-diphenyl-N,N'-bis-(3-methylphenyl)-(1,1')-biphenyl-4,4'-diamine-trifluorovinyl ether
PS-TPD-PFCB polystyrene-N,N'-diphenyl-N,N'-bis-(3-methylphenyl)-(1,1')-biphenyl-4,4'-diamine perfluorocyclobutane
PVK poly(N-vinylcarbazole)
RMS root-mean-square
TBAF tetrabutyl ammonium fluoride
TBDMS t-butyldimethylsilyl triflate
TCTA tris(4-carbazole)triphenylamine TCTA-BVB tris(4-carbazole)triphenylamine-bis(vinyl benzyl ether)
TCTA-PFCB tris(4-carbazole)triphenylamine-perfluorocyclobutane
TCTA-TTFV tris(4-carbazole)triphenylamine-tris(trifluorovinyl ether)
TFB poly(2,7-(9,9-di-n-octylfluorene)-alt-(1,4-phenylene-((4-sec-butyl phenyl)imino)-1,4-phenylene)
TFV trifluorovinyl ether
TGA thermo gravimetric analysis
TPBI 1,3,5-tris(N-pphenylbenzimidazol-2-yl)benzene
TPD N,N'-diphenyl-N,N'-bis-(3-methylphenyl)-(1,1')-biphenyl-4,4'-diamine
TPD-BVB N,N'-diphenyl-N,N'-bis-(3-methylphenyl)-(1,1')-biphenyl-4,4'-diamine-bis(vinyl benzyl ether) (1-TPD)
TTFV tris(trifluorovinyl ether)
VB vinyl benzyl ether
WOLED white organic light-emitting diode
XPS X-ray photoelectron spectroscopy In one aspect, the present invention provides compounds that are useful as hole-transporting materials and for making hole-transporting layers in light-emitting devices.

In one embodiment, the compounds of the invention have conjugated π-electron system that includes a triaryl amine moiety and two or more crosslinkable moieties. The triaryl amine moiety imparts hole-transport properties to the compound and the crosslinkable moieties allow for the formation of a crosslinked material that is useful as a hole-transporting layer. The compounds of the invention are capable of reversible anodic oxidation to form stable cation radicals under electroluminescent device conditions.

In one embodiment, the compound has a solid state ionization potential close to the work function of the anode (e.g., ITO) of the electroluminescent device that includes a layer derived from the compound. In one embodiment, the solid state ionization potential of the compound is greater than about 4.7 eV. In one embodiment, the solid state ionization potential of the compound is greater than about 5.0 eV. In one embodiment, the solid state ionization potential of the compound is greater than about 5.2 eV. In one embodiment, the solid state ionization potential of the compound is greater than about 5.5 eV. In one embodiment, the solid state ionization potential of the compound is greater than about 5.7 eV. In one embodiment, the solid state ionization potential of the compound is greater than about 5.9 eV.

In certain embodiments, the compounds of the invention include more than one (e.g., two, three, or four) triaryl amine moieties. Representative triaryl amine moieties include tris(4-carbazole)triphenylamine (TCTA), N,N'-diphenyl-N,N'-bis-(3-methylphenyl)-(1,1')-biphenyl-4,4'-diamine (TPD), bi-N,N'-diphenyl-N,N'-bis-(3-methylphenyl)-(1,1')-biphenyl-4,4'-diamine (BTPD), N,N'-diphenyl-N,N'-bis(1-naphthyl)-1,1'-biphenyl-4,4'-diamine (NPD), and bi-N,N'-diphenyl-N,N'-bis(1-naphthyl)-1,1'-biphenyl-4,4'-diamine (BNPD).

Syntheses of representative triaryl amine moieties, such as TCTA, Bu-TCTA, TPD, NPD, BTPD, and BNPD, are described in Examples 1 and 2, and illustrated in FIGS. 6-10.

The crosslinkable moiety of the compounds of the invention can be any crosslinkable moiety suitable for crosslinking the compounds of the invention and forming useful hole-transporting materials. In one embodiment, the crosslinkable moiety is a thermally crosslinkable group. Representative thermally crosslinkable moieties include trifluorovinyl ether (TFV) moieties (e.g., trifluorovinyl phenyl ether) and vinyl benzyl ether (VB) moieties. In one embodiment, the crosslinkable group is a photochemically crosslinkable moiety. Representative photochemically crosslinkable moieties include cinnamic acid and oxetane moieties.

The crosslinkable group is covalently coupled to the triaryl amine moiety through a linker moiety. The linker moiety can be one or more atoms, or groups of atoms, that covalently couple the crosslinkable moiety to the triaryl moiety. The linker moiety can include a variety of bond types including, for example, ether and/or ester bonds.

Representative linker moieties include substituted and unsubstituted alkyl groups, substituted and unsubstituted aryl groups, and substituted and unsubstituted heteroaryl groups. Alkyl groups can include linear chain and branched C1-C12 groups. In some embodiments, the carbon atoms of the alkyl groups can be substituted for other atoms including, for example, nitrogen, oxygen, and sulfur atoms. In one embodiment, the linker is a methylene group. In one embodiment, the linker is a dimethylene ether group ($-CH_2-O-CH_2-$). In one embodiment, the linker is $-CH_2-O-C(=O)-$.

In one embodiment, the invention provides compounds having formula I:

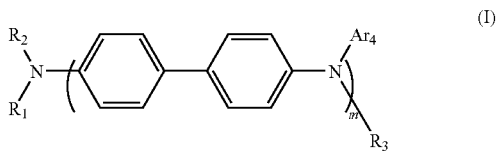

wherein $R_1$ is $Ar_1$ or $Ar_1\text{-}(L_1)_n\text{-}L$; $R_2$ is $Ar_2$ or $Ar_2\text{-}(L_2)_o\text{-}L$; and $R_3$ is $Ar_3$ or $Ar_3\text{-}(L_3)_p\text{-}L$;

$Ar_1$, $Ar_2$, $Ar_3$, and $Ar_4$ are independently selected from unsubstituted and substituted aryl groups;

$L_1$, $L_2$, and $L_3$ are linker moieties that covalently couple L to $Ar_1$, $Ar_2$, and $Ar_3$, respectively;

m, n, o, p, and q are independently selected from 0 or 1;

L is a crosslinkable moiety, and the compound includes two or more L groups.

In one embodiment, the present invention provides compounds having the formula II:

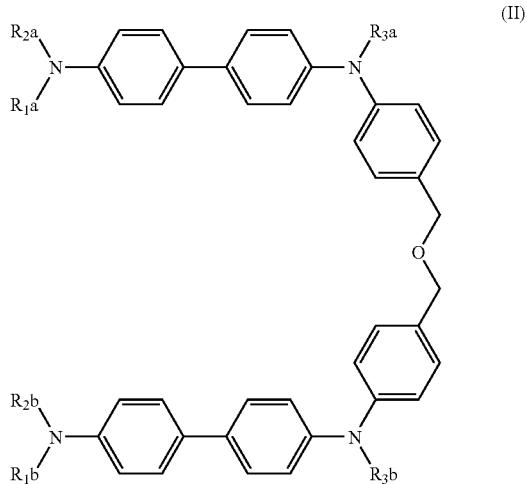

wherein
$R_{1a}$ is $Ar_{1a}$ or $Ar_{1a}\text{-}(L_{1a})_n\text{-}L$;
$R_{1b}$ is $Ar_{1b}$ or $Ar_{1b}\text{-}(L_{1b})_n\text{-}L$;
$R_{2a}$ is $Ar_{2a}$ or $Ar_{2a}\text{-}(L_{2a})_o\text{-}L$;

$R_{2b}$ is $Ar_{2b}$ or $Ar_{2b}$-$(L_{2b})_o$-L;
$R_{3a}$ is $Ar_{3a}$ or $Ar_{3a}$-$(L_{3a})_p$-L;
$R_{3b}$ is $Ar_{3b}$ or $Ar_{3b}$-$(L_{3b})_p$-L;
$Ar_{1a}$, $Ar_{1b}$, $Ar_{2a}$, $Ar_{2b}$, $Ar_{3a}$, and $Ar_{3b}$ are independently selected from unsubstituted and substituted aryl groups;
$L_{1a}$, $L_{1b}$, $L_{2a}$, $L_{2b}$, $L_{3a}$, and $L_{3b}$ are linker moieties that covalently couple L to $Ar_{1a}$, $Ar_{1b}$, $Ar_{2a}$, $Ar_{2b}$, $Ar_{3a}$, and $Ar_{3b}$, respectively;
n, o, and p are independently selected from 0 or 1;
L is a crosslinkable moiety, and wherein the compound has two or more L groups.

In one embodiment, the present invention provides compounds having formula III:

(III)

wherein
$R_1$ is $Ar_1$ or $Ar_1$-$(L_1)_n$-L;
$R_2$ is $Ar_2$ or $Ar_2$-$(L_2)_o$-L;
$R_3$ is $Ar_3$ or $Ar_3$-$(L_3)_p$-L;
$Ar_1$, $Ar_2$, and $Ar_3$ are independently selected from unsubstituted and substituted aryl groups;
$L_1$, $L_2$, and $L_3$ are linker moieties that covalently couple L to $Ar_1$, $Ar_2$, and $Ar_3$, respectively;
n, o, and p are independently selected from 0 or 1;
L is a crosslinkable moiety; and wherein the compound has two or more L groups.

For the above embodiments, suitable aryl groups for $Ar_1$, $Ar_2$, and $Ar_3$ include substituted or unsubstituted phenyl, substituted or unsubstituted naphthyl, and substituted or unsubstituted carbazole group. Representative aryl groups include 1-naphthyl, phenyl, 4-methylphenyl, and 3-n-butyl-9-carbazole.

In the above embodiments, the crosslinkable group is covalently coupled to the triaryl amine moiety through a linker moiety. Suitable linker moieties include those described above.

In certain embodiments, the crosslinkable moiety L is linked to the triaryl amine moiety through a moiety —$Ar_1$-$(L_1)_n$-, —$Ar_2$-$(L_2)_o$-, —$Ar_3$-$(L_3)_p$-, or $Ar_4$-$(L_4)_q$-, where $L_1$, $L_2$, $L_3$, and $L_4$ are optional. $L_1$, $L_2$, $L_3$, and $L_4$ can include a variety of groups including, for example, ether, ester, amide, carbamate, carbonate, sulfonamide, and sulfonate groups, as well as combinations of these groups. One or more aromatic moieties can be present in $L_1$, $L_2$, $L_3$, and $L_4$, such as substituted or unsubstituted phenyl, substituted or unsubstituted naphthyl, and substituted or unsubstituted carbazole group. In one embodiment, $L_1$, $L_2$, $L_3$ and $L_4$ include a phenyl moiety. In one embodiment, $L_1$, $L_2$, $L_3$, and $L_4$ include both a phenyl and a carbazole moiety. In one embodiment, $L_1$, $L_2$, $L_3$, and $L_4$ include both a phenyl and a 3-n-butyl-9-carbazole moiety.

Evaluation of Representative Crosslinkable Compounds of the Invention (TCTA Derivatives)

The role of hole-transporting layer in a multilayer light-emitting device is to facilitate hole injection from the anode into the organic or polymer layer, accepting holes, and transporting injected holes to the emitting layer. Hole-transport involves electron transfer from a neutral molecule to its radical cation. Hole transport molecules are electron donors by nature, and must have low ionization potentials so that they readily form the cation radical. Therefore, in order to be effective as hole-transporting material, a compound must have a solid state ionization potential close to the work function of the anode, traditionally, ITO.

To evaluate the effect of derivatization on the ionization potential, the ionization potentials of the TCTA derivatives in DCE were determined by cyclic voltammetry (CV). All the compounds exhibit reversible oxidative behavior with the onset potentials at about 0.55 V, which are similar to that of TCTA. This indicates that the derivatization of TCTA by TFV or VB groups does not affect the electronic property of the TCTA. The HOMO energy levels of the TCTA derivatives were assigned to be −5.7 eV according to the reported data for TCTA. Y. Kuwabara et al., Adv. Mater. 1994, 6, 677.

The thermal stability of hole-transporting material is important for the performance of the LEDs. In the present invention, because the compounds undergo in situ crosslinking at an elevated temperature, the thermal stability of these materials is essential to the formation of crosslinked network as hole-transporting layer.

Figure 13:
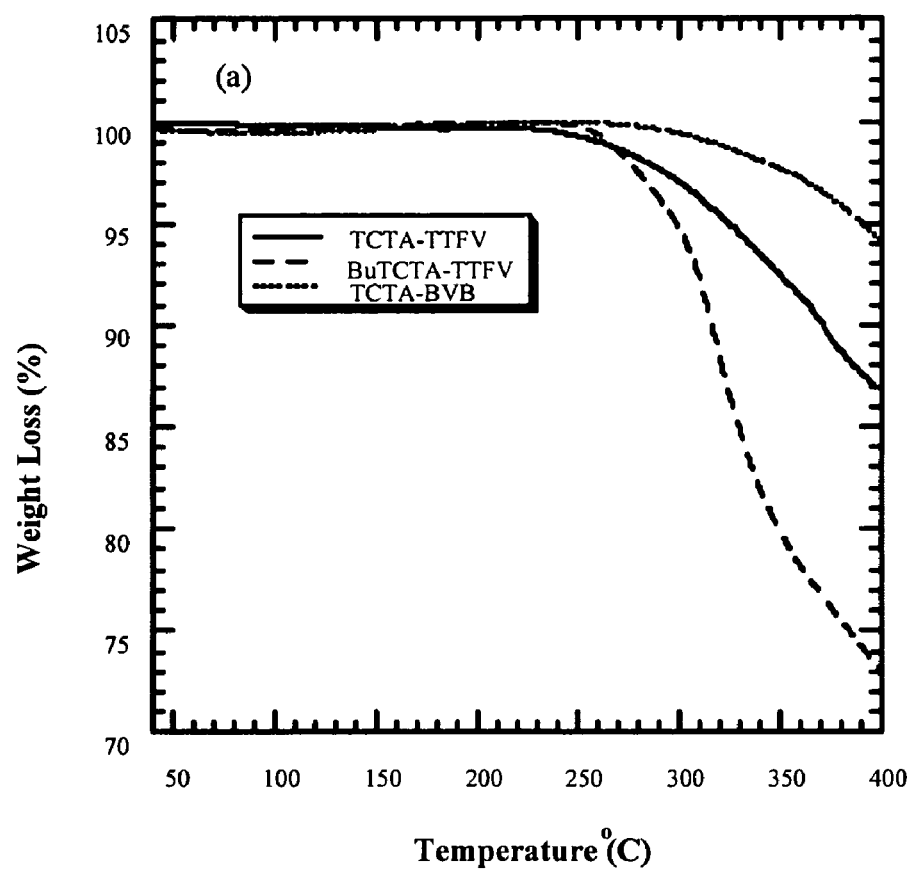
FIG. 13 is a thermogravimetric analysis (TGA) of the polymerization reactions of TCTA-derivatives having trifluorovinyl ether or vinyl benzyl ether crosslinkable groups.

To be effective as hole-transporting material, the TCTA derivatives of the present invention are crosslinkable to form thermally and morphologically stable films. The thermal stability of the TCTA derivatives was determined and results were shown in FIG. 13. All TCTA-derivatives exhibit high thermal stability, with only about 5% weight loss observed up to 300° C. by TGA, indicating their stability against thermal degradation (FIG. 13). Among three compounds, TCTA-BVB shows the highest stability.

In another aspect, the present invention provides hole-transporting layers useful in multilayer PLEDS. The hole-transporting layers of the invention are formed by crosslinking one or more of the crosslinkable compounds of the invention described herein.

In one embodiment, the hole-transporting layer of the invention comprises a hole-transporting material that is a crosslinked material derived from a crosslinkable compound having formula I, defined above.

In one embodiment, the hole-transporting layer of the invention comprises a hole-transporting material that is a crosslinked material derived from a crosslinkable compound having formula II, defined above.

In one embodiment, the hole-transporting layer of the invention comprises a hole-transporting material that is a crosslinked material derived from a crosslinkable compound having formula III, defined above.

The compounds in the invention undergo in situ crosslinking to provide a crosslinked network or a film that serves as a hole-transporting layer. The crosslinking can occur during the spin-coating process during multilayer device fabrication. For example, the compounds in the present invention can be spin coated from their 1,1-dichloroethane (DCE) solutions onto a substrate, such as ITO. After curing, the compounds form a crosslinked material having hole-transporting capability.

Representative Hole-Transporting Layers: TCTA Derivatives

Figure 15:
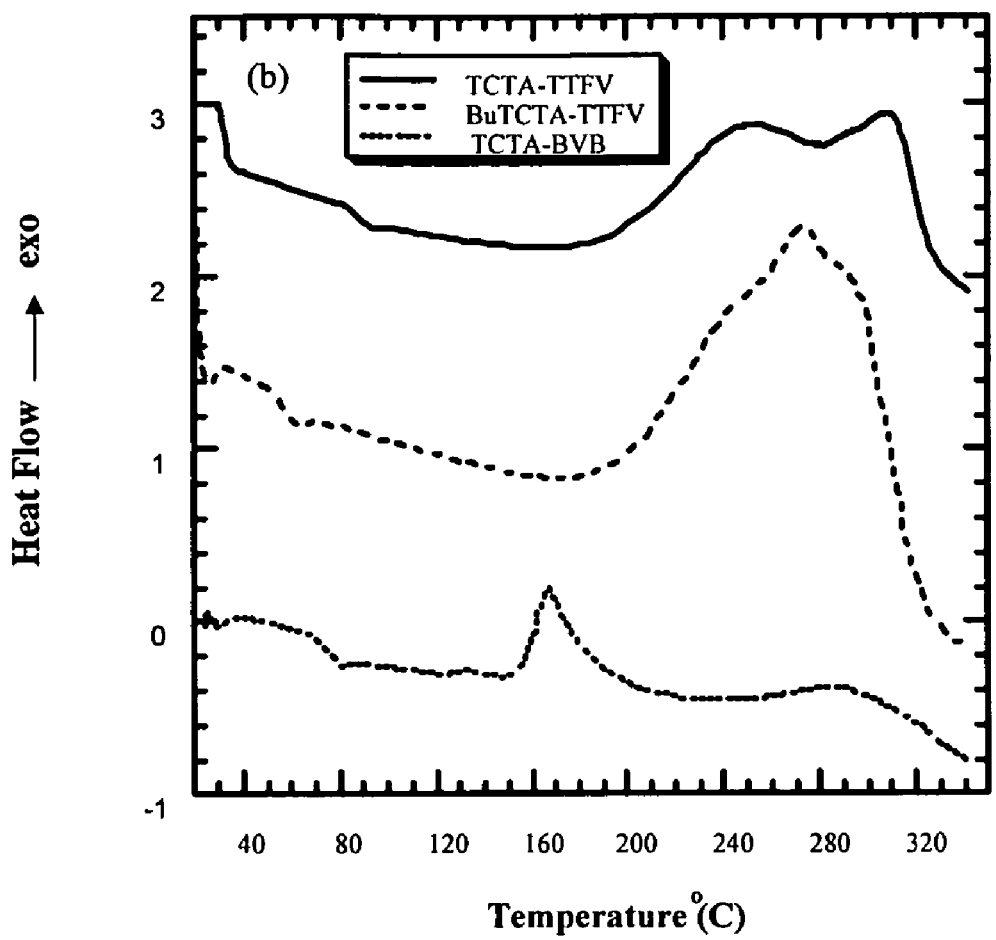
FIG. 15 compares the differential scanning calorimeter (DSC) curves of the polymerization reactions of TCTA-derivatives having trifluorovinyl ether or vinyl benzyl ether crosslinkable groups.

The optimal crosslinking conditions for TCTA derivatives were determined by heating TCTA derivatives to 350° C. at 10° C./min in differential scanning calorimetry (DSC) (FIG. 15). Upon heating, TCTA-TTFV exhibits a glass transition temperature ($T_g$) of 88° C., while Bu-TCTA-TTFV shows a lower $T_g$ of 55° C. due to the presence of flexible alkyl chains. The $T_g$ of TCTA-BVB was measured as 77° C. On further heating above $T_g$, both TFV-containing TCTAs reveal an exothermic onset of about 195° C. (which is the typical dimerization temperature for trifluorovinyl ether) and another exothermic peak at 252° C. However, at this temperature, both compounds have already started to decompose, as it is revealed in their TGA measurements. TCTA-BVB begins to polymerize at a much lower temperature (150° C.) with an exothermic peak at 170° C., which is consistent with the auto-polymerization mechanism of styrene. To ensure fast and high yield crosslinking process, the cyclopolymerization of the TFV-containing TCTA was performed under an inert atmosphere at 225° C. for 30 min, while the polymerization of TCTA-BVB was conducted at 180° C. for 30 min to form the TCTA networks. The crosslinked forms of TCTA-TTFV and Bu-TCTA-TTFV were designated as TCTA-PFCB and Bu-TCTA-PFCB.

Films of TCTA-derivatives with about 20 nm thickness were spin coated from their DCE solutions onto the glass substrates. After thermal curing, the solubility of the crosslinked films was investigated by measuring their UV-Vis spectra before and after washing with various organic solvents, such as chlorobenzene, DCE, toluene, chloroform, which are the common solvents used spin-coating light-emitting polymers. The unchanged UV-Vis spectra indicate that they possess suitable solvent resistance for multilayer coating and can be integrated into PLEDs as the HTL.

Figure 16A:
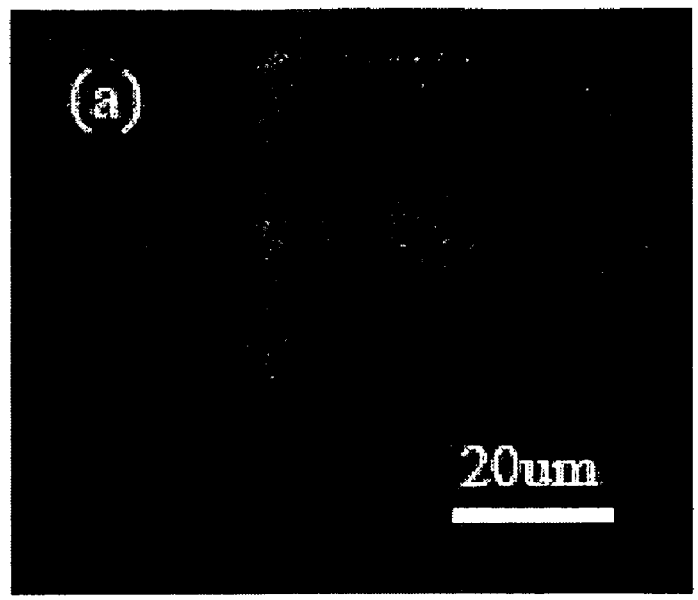
FIGS. 16A and 16B are optical micrographs of TFV-functionalized TCTA on an ITO substrate after thermal curing at 225° C. for 30 min. (16A) tris(4-carbazole)triphenylamine-perfluorocyclobutane (TCTA-PFCB); (16B) 4,4',4''-tris(N-3-n-butyl-carbazole)triphenylamine-tris(trifluorovinyl)-perfluorocyclobutane (Bu-TCTA-PFCB).
Figure 16B:
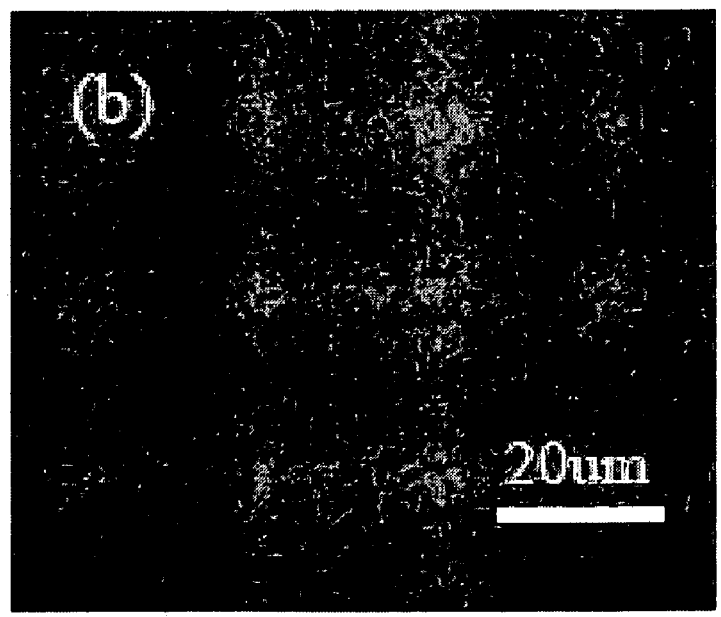

The effect of crystallization on the morphology of TFV-functionalized TCTA films on bare ITO substrates was also investigated. Before curing, smooth and featureless films were observed by AFM over a 30×30 μm scanned area, the RMS roughness is 0.63 nm and 0.55 nm, respectively for TCTA-TTFV and Bu-TCTA-TTFV films. After curing at 225° C., which is above the TCTA crystallization temperature (190° C.) for 30 min, it can be seen clearly under optical microscope that thermal annealing induces TCTA crystallization/aggregation on the ITO surface. The surface of these films became very rough and the spinodal morphologies were observed for both TCTA-PFCB and Bu-TCTA-PFCB, as illustrated in FIG. 16.

Representative Hole-Transporting Layers: TPD, NPD, BTPD, and BNPD Derivatives

Biphenyl diamine-based HTMs such as TPD (N,N'-ditolyl-N,N'-diphenyl-1,1'-biphenyl-4,4'-diamine) and α-NPD (N,N'-bis(1-naphthyl)-N,N'-diphenyl-1,1'-biphenyl-4,4'-diamine) have been frequently used for a wide range of practical applications due to their high charge carrier mobility as well as easy sublimation and preparation. However, they may suffer disadvantages associated with the long-term stability of organic film including low glass transition temperature, ease of crystallization and unsatisfactory morphological stability. Moreover, sophisticated and time-consuming vacuum deposition procedures always lead to relatively high fabrication costs. The crosslinkable compounds comprising TPD or NPS provided in this invention can be used to alleviate these problems.

The representative compounds, 1-TPD, 1-NPD, 2-TPD, and 2-NPD, are very soluble in common organic solvents, such as THF, dichloromethane and chloroform. All of them were dissolved in dichloroethane (0.5 wt %) then spin-coated (2000 rpm) on the anode ITO substrate. The lowest curing temperature for each material to achieve fully solvent-resistance film is listed on Table 1. Each resulting HTM layer from solution was cured and crosslinked at that corresponding temperature for 30 min under the protection of argon.

TABLE 1

Physical properties of hole-transporting materials (HTMs).

| HTMs | Active HTM[a] (%) | $T_c^b$ (° C.) | $T_d^c$ (° C.) | $T_g^d$ (° C.) | HOMO[e] (eV) |
|---|---|---|---|---|---|
| 1-TPD | 63.6% | 160 | 350 | 151 | −5.28 |
| 1-NPD | 66.6% | 160 | 360 | 187 | −5.39 |
| 2-TPD | 75.3% | 170 | 361 | 150 | −5.30 |
| 2-NPD | 77.6% | 170 | 371 | 190 | −5.41 |

[a]Molecular weight percentage of TPD or NPD moieties in the molecule.
[b]$T_c$ is the lowest curing temperature to obtain complete solvent resistance determined by absorption spectra.
[c]$T_d$ is decomposition temperature and determined by TGA at 5% weight loss.
[d]The first scan of DSC was heated to 300° C. and $T_g$ was determined by the second heating.
[e]HOMO energy level was calculated by CV using ferrocene value of −4.8 eV below the vacuum level.

Increasing the active hole-transporting content and decreasing the insulating moiety by tuning the ratio of hole-conductor/crosslinker are important to optimize the hole-transporting ability. As shown in Table 1, 2-TPD and 2-NPD consisting of two connecting diamine molecules with two VB crosslinkers were designed to improve the content of active hole-transporter (75.3 wt % and 77.6 wt %) in comparison with 1-TPD and 1-NPD (63.6 wt % and 66.6 wt %) containing two crosslinkers but with one diamine molecule.

Figure 17:
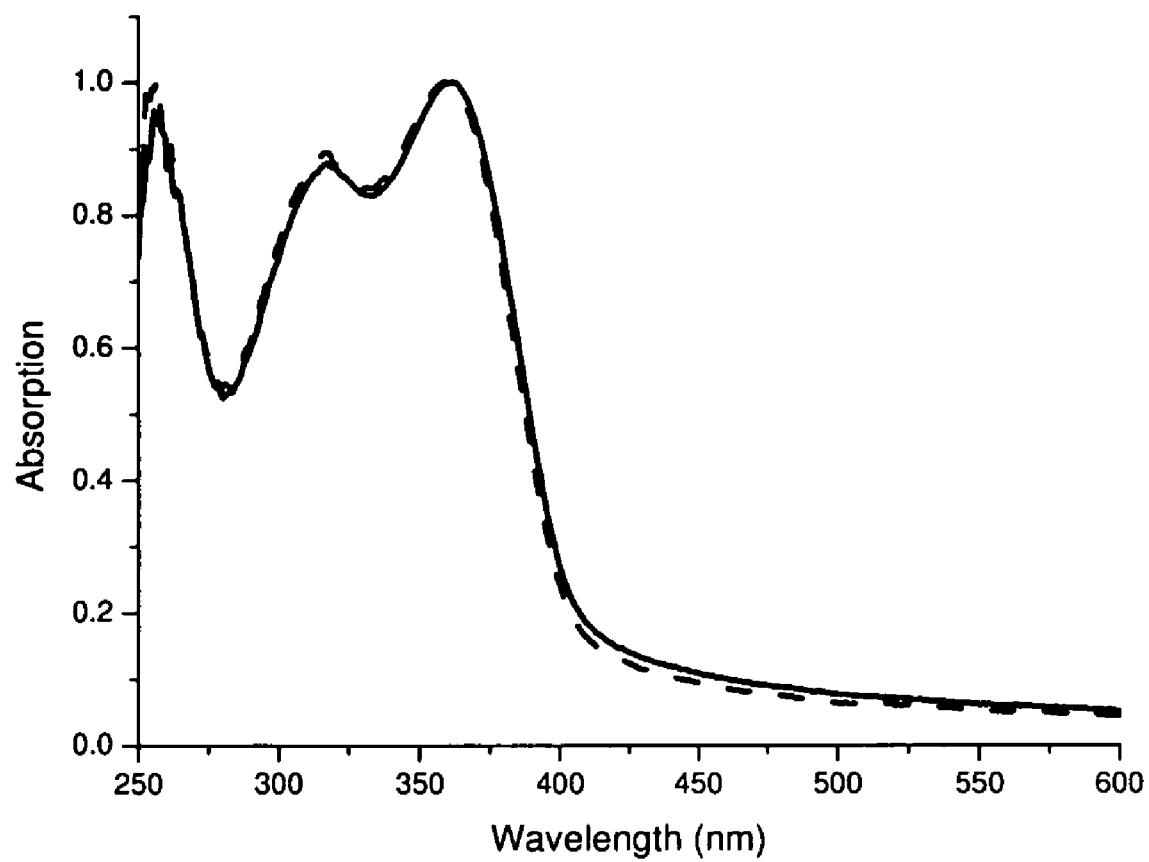
FIG. 17 compares the absorption spectra of 1-TPD cured at 160° C. for 30 min. before washing (solid line) and after washing (dash line) with chlorobenzene.

The solubility of crosslinked films was investigated by monitoring UV-Vis spectra before and after washing with chlorobenzene, which is a good solvent for both the monomer precursors and the emissive polymer. The completely insoluble crosslinked film of 1-TPD was formed as evidenced by unchanged absorption spectra. (FIG. 17). It is noteworthy that each crosslinked film is almost transparent and only has slight absorption in visible region, allowing for reducing the loss of light coming from the emissive layer in the device. Because two VB moieties in each monomer precursor undergo thermal polymerization via radical mechanism, it is envisaged that instead of linear polymer, the resulting film will be a covalently crosslinking network so that curing temperature can be as low as 160° C. to obtain sufficient solvent resistance, which is much lower than 225° C. used for PFCB polymer.

Figure 18:
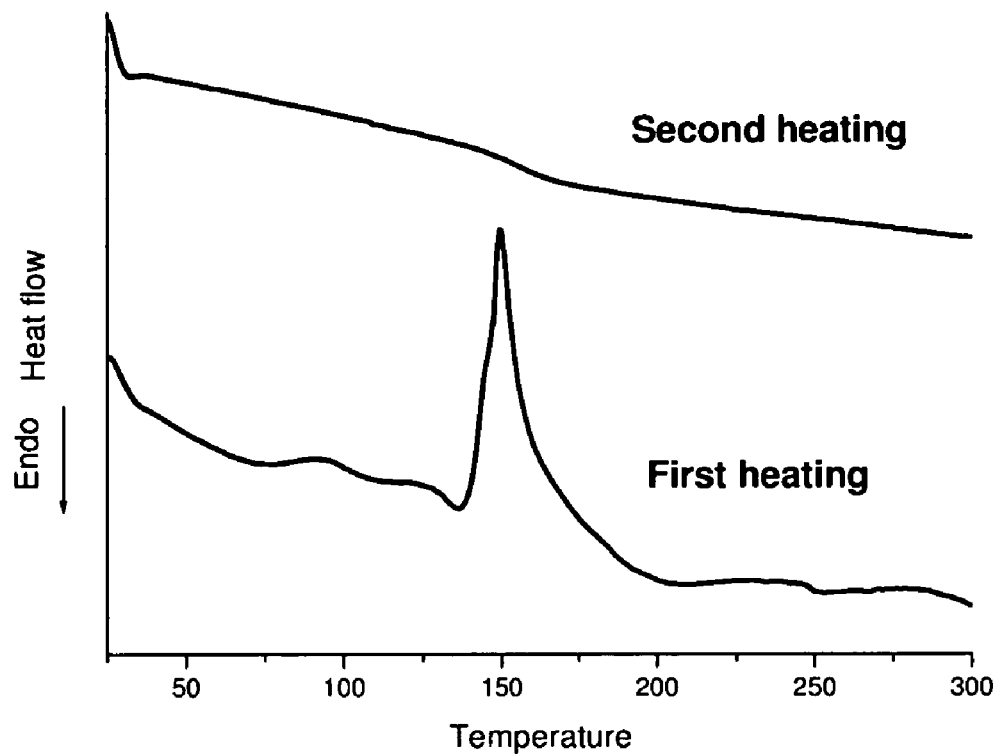
FIG. 18 is a temperature versus heat flow graph showing the first and second heating of 1-TPD.

In the first scan of DSC for monomer 1-TPD, a maximum exothermic peak around 150° C. apparently resulting from the thermal crosslinking of styrene is in good agreement with the lowest curing temperature of 160° C. to yield the complete solvent-resistance network. A glass transition temperature at 151° C. was observed during the second DSC heating (FIG. 18).

The decomposition temperature ($T_d$) of HTMs was determined by thermo gravimetric analysis (TGA). The resulting crosslinked network of HTMs possessed high $T_d$, ranging from 350-371° C. NPD derivatives are more stable than its TPD analogues by 10° C. 2-TPD and 2-NPD are also 11° C. more stable than their corresponding monomers 1-TPD and 1-NPD, respectively (Table 1).

Figure 19:
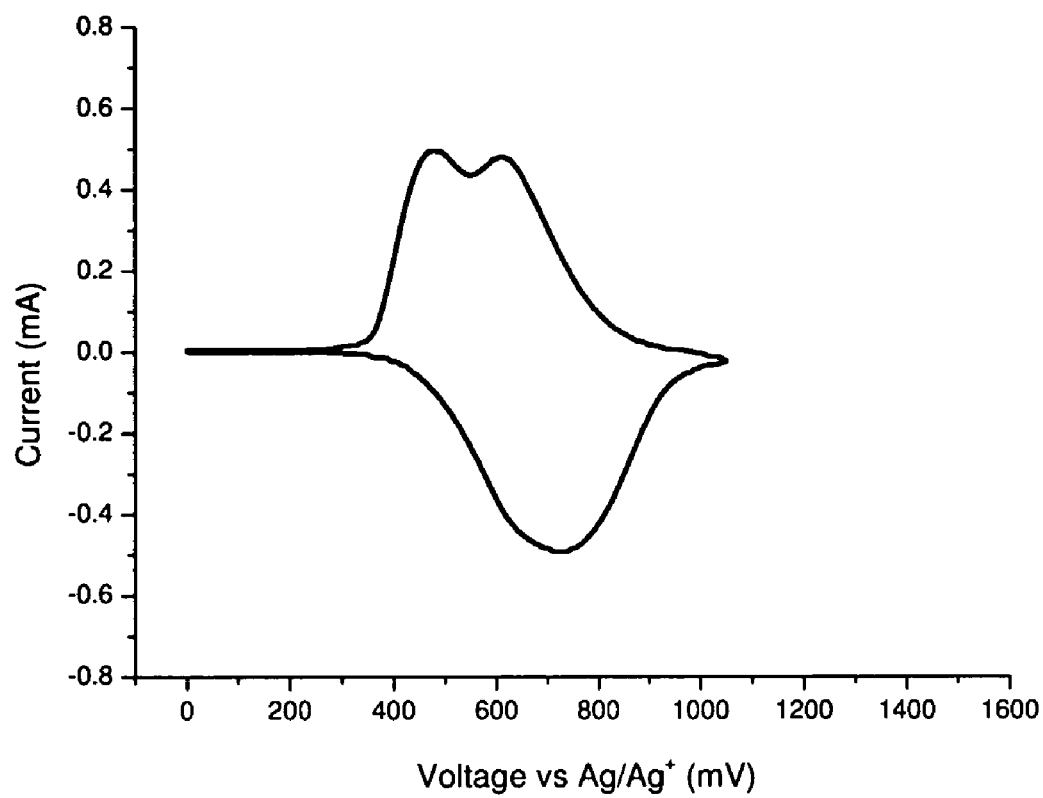
FIG. 19 shows the cyclic voltammograms of a crosslinked film of 1-TPD on an ITO substrate in a solution of $Bu_4NPF_6$ in acetonitrile (0.1 M) at a scan rate of 40 $mVs^{-1}$.

Electrochemical properties of the crosslinked materials on ITO were determined by cyclic voltammetry (CV). A typical example is shown for 1-TPD in FIG. 19. Notably, the first and second oxidation peaks in the anodic sweep are overlapped. In analogy to the other three materials, the CV curve of crosslinked 1-TPD was neither changed nor degraded after 10 continuous cycles, demonstrating a robust and adherent crosslinked layer on ITO with a fully reversible and stable electrochemical characteristic which is an important prerequisite for HTMs. The highest occupied molecular orbital (HOMO) values of these crosslinked HTMs were estimated by CV and shown in Table 1. Because the naphthyl group lowers the electron density at the nitrogen compared with phenyl group, the HOMO of 1-NPD and 2-NPD is generally higher than that of 1-TPD and 2-TPD. These values are very close to the work function of ITO (−5.1 eV after oxygen plasma treatment).

Figure 20:
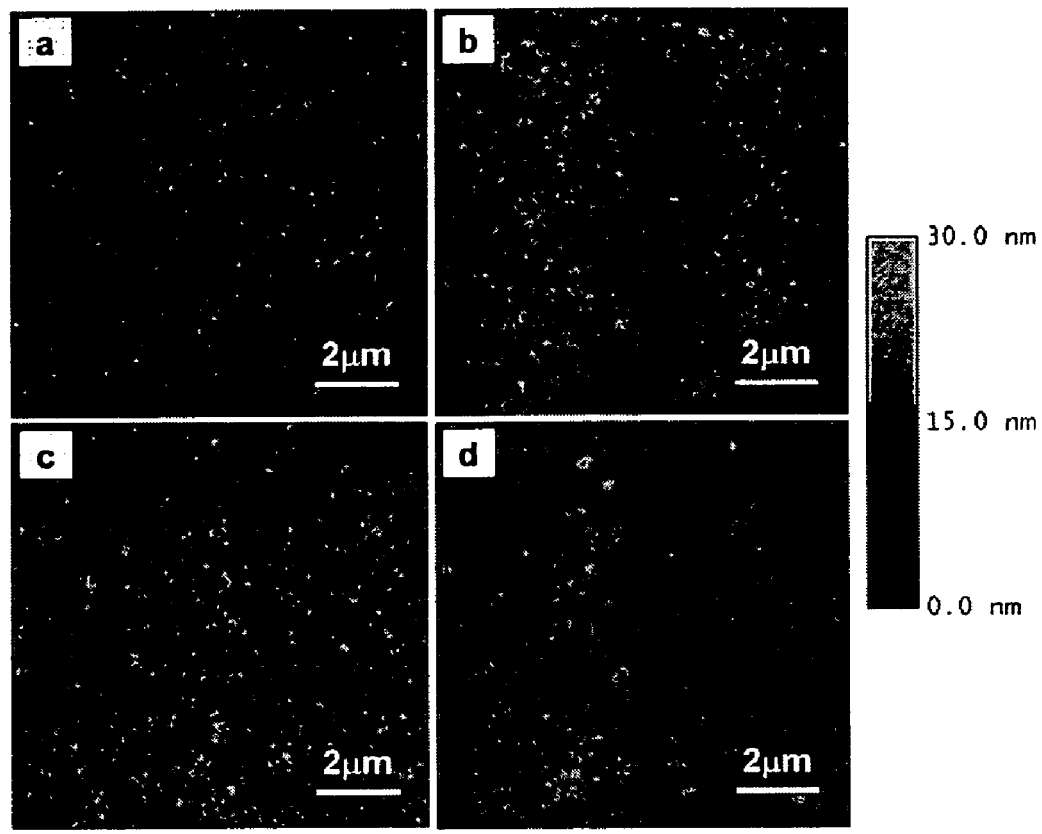
FIGS. 20A-20D are atomic force microscopy (AMF) images of HTMs spin-coated and cured on ITO (20A) 1-TPD, RMS roughness=0.91 nm; (20B) 2-TPD, RMS roughness=0.99 nm; (20C) 1-NPD, RMS roughness=0.90 nm; and (20D) 2-NPD, RMS roughness=0.81 nm.

The surface roughness of HTMs spin-coated and crosslinked on ITO was examined by AFM (FIG. 20). Polymerization in bulk is sometimes accompanied by shrinkage of the materials resulting in microcracks in the film. Uniform films with no evidence of cracks or pinholes were observed for each sample over a 10×10 μm scan area and the root-mean-square (RMS) surface roughness for 1-TPD, 2-TPD, 1-NPD and 2-NPD is 0.91, 0.99, 0.90 and 0.81 nm, respectively, indicating that all of the materials formed comparably smooth films on ITO after thermal treatment of crosslinking as compared to bare ITO substrates with a RMS roughness of about 3 nm. The thickness of crosslinked film for each material is in the range of 25 about 30 nm.

Figure 21:
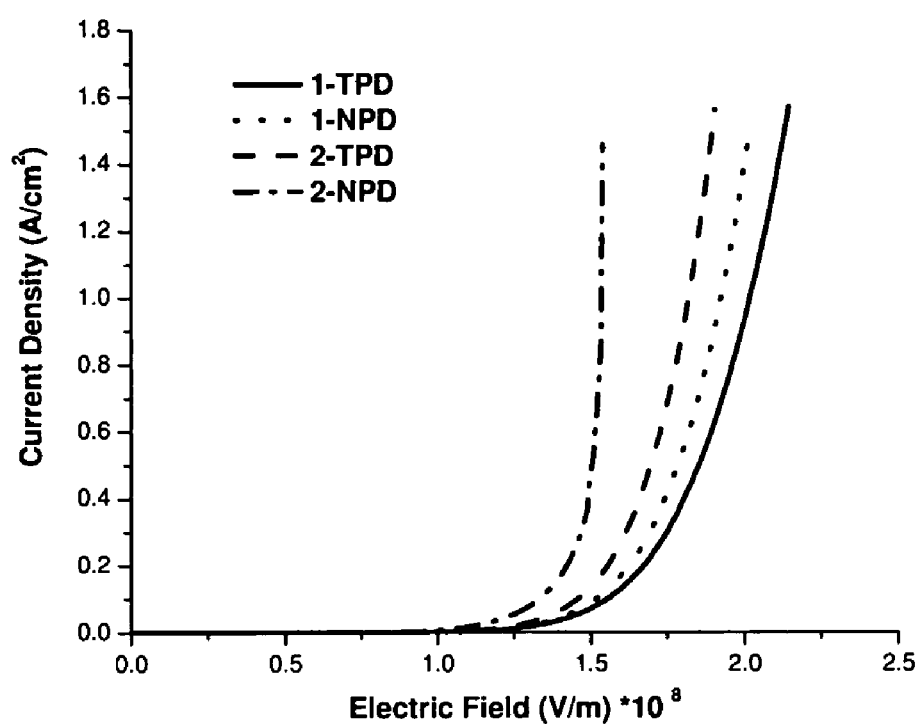
FIG. 21 compares the current density-voltage curves showing the field dependence of the current in hole-only devices ITO/HTL/Au; 1-TPD (solid line), 1-NPD (dot line), 2-TPD (dash line), and 2-NPD (dash dot line).

Hole-only devices (ITO/HTL/Au) with ITO as the anode and gold as the cathode were prepared to characterize the transporting properties of HTMs. The current-voltage diagrams are shown in FIG. 21. Both of 2-TPD and 2-NPD exhibited lower onset voltage than their corresponding analogue 1-TPD and 1-NPD, implying that higher content of active hole-transporting conductor may lead to higher hole-mobility. Another possible elucidation could be the closer packing between two diamine compounds bridged by a short ether linkage (—CH$_2$—O—CH$_2$—) in 2-TPD and 2-NPD, resulting in more favorable orientation of triarylamine units to facilitate the hole-transporting in crosslinked networks. The trend of hole-mobility follows the order 2-NPD>2-TPD>1-NPD>1-TPD, also suggesting that NPD-based HTMs may have higher mobility than their corresponding TPD-based ones.

In another aspect, the present invention provides light-emitting devices that include a hole-transporting layer made from one or more of the crosslinkable compounds of the invention.

Figure 42:
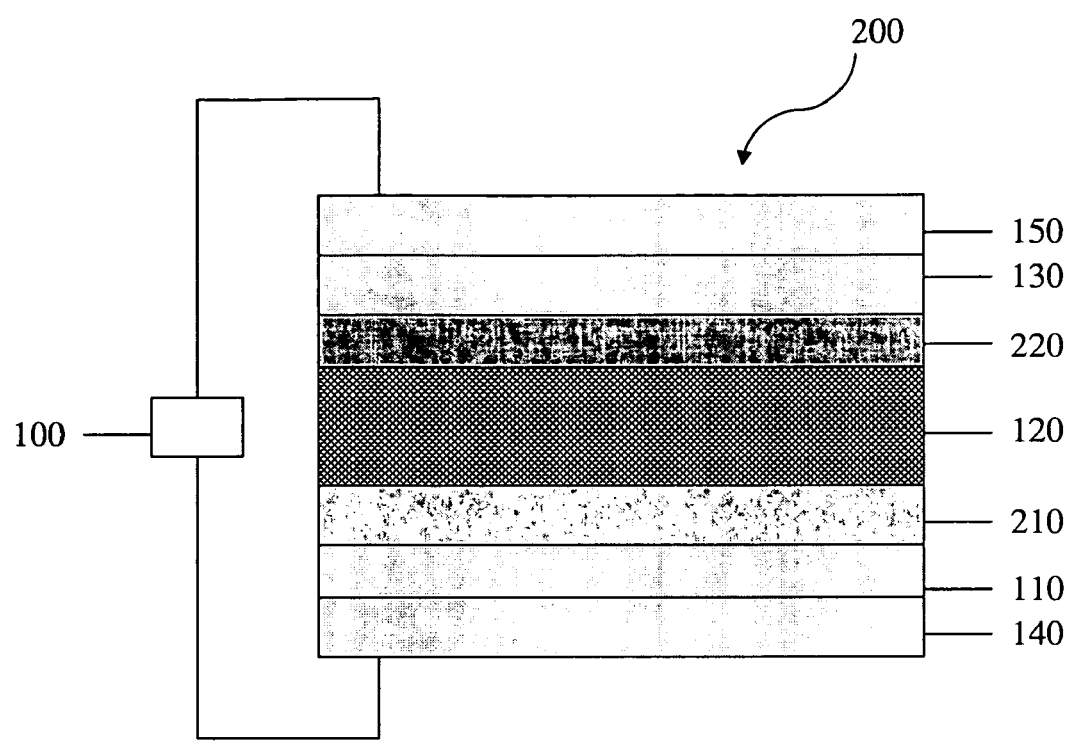
FIG. 42 is an illustration of a representative multilayer light-emitting device of the invention

FIG. 42 is an illustration of a representative multilayer light-emitting device of the invention. As shown in FIG. 42, multilayer light-emitting device 200 includes electric power supply 100, anode 140, cathode 150, hole-transporting layer 210, emissive layer 120, electron-transporting layer 220. The device further includes hole-injection layer 110 and an electron-injection layer 130.

Hole and electron-injection layers 110 and 130 facilitate efficient injection of holes and electrons, respectively. The holes are injected into emissive layer 120 through the hole-injection layer 110 and hole-transporting layer 210 from anode 120. The electrons are injected into emissive-layer 120 through electron-injection layer 130 and electron-transporting layer 220 from cathode 150. Together, a hole and an electron generate an exciton in emissive layer 120, where light corresponding to the energy between the hole and the electron is emitted from the exciton.

Anode 140 is traditionally formed of a transparent conductive material having a relatively high work function, such as indium-tin-oxide or indium-zinc-oxide. Cathode 150 is traditionally formed of an opaque conductive material having a relatively low work function, such as aluminum, calcium, or aluminum alloy.

It will be appreciated that the hole-transport layer in the representative device described above can be any one of the hole-transport layers described herein including the hole-transporting bilayer and the integrated hole-injection and hole-transporting layer described herein.

In one embodiment, the device comprises,
(a) an anode;
(b) a cathode;
(c) an emissive layer intermediate the anode and the cathode; and
(d) a hole-transporting layer intermediate the anode and the emissive layer, wherein the hole-transporting layer comprises a crosslinked hole-transporting material derived from a crosslinkable compound having the formula I, II, or III, as defined above.

In certain embodiments, the above devices further include a hole-injection layer. In one embodiment, the hole injection layer intermediates the anode and the hole-transporting layer is formed by crosslinking on the surface of the hole-injection layer.

Representative PLED Devices Having Single HTL

In one embodiment, the device of the present invention includes a hole-transporting layer comprising TPD moieties.

In one embodiment, the device of the invention include a hole-transporting layer including one or more of TPD, BTPD, NPD, or BNPD moieties.

Figure 22:
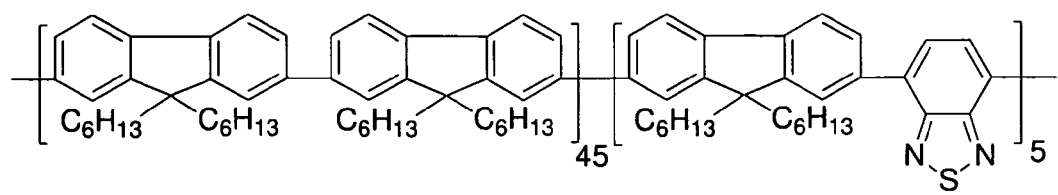
FIG. 22 shows the chemical structure of poly[2,7-(9,9'-dihexylfluorene)-alt-4,7-(2,1,3-benzothiadiazole)] (PFBT5), an emissive polymer.

Double-layer LED devices with a hole-transporting layer containing 1-TPD, 2-TPD, 1-NPD or 2-NPD moieties were fabricated based on the configuration of ITO/HTL/PFBT5/CsF/Al. An emitting polymer poly[2,7-(9,9'-dihexylfluorene)-alt-4,7-(2,1,3-benzothiadiazole)] denoted by PFBT5 was chosen as a green emissive layer. The feeding ratio of polyfluorene to benzothiadiazole in this random copolymer is 95:5 (FIG. 22).

The PLEDs were fabricated on pre-cleaned and oxygen plasma-treated ITO covered glass substrates. After the plasma treatment, the substrates were moved into a glove box and all the subsequent film-forming processes were performed in it under argon-protection. The HTL was formed by spin-coating the corresponding HTM solution onto ITO and then thermally crosslinking it on a hotplate at its crosslinked temperature for 30 min. EML was then spin-coated on top of the HTL(s). Cesium fluoride (CsF) with thickness of 1 nm and Al of 200 nm were evaporated subsequently as cathode. Thickness of each layer in two device configurations is shown as followed: ITO/PEDOT:PSS (about 60 nm)/HTL (about 25 to about 30 nm)/PFBT5 (about 80 nm)/CsF (1 nm)/Al (200 nm). The performance test was carried out at room temperature in air without encapsulation. Current density-voltage (J-V) characteristics were measured on a Hewlett-Packard 4155B semiconductor parameter analyzer. The PL and EL spectra were recorded by a spectrometer (Instaspec IV, Oriel Co.). The light power of the EL emission was measured using a calibrated Si-photodiode and a Newport 2835-C multifunctional optical meter. Photometric units (cd/m$^2$) were calculated using the forward output power together with the EL spectra of the devices under assumption of the emission's Lambertian space distribution.

Figure 23:
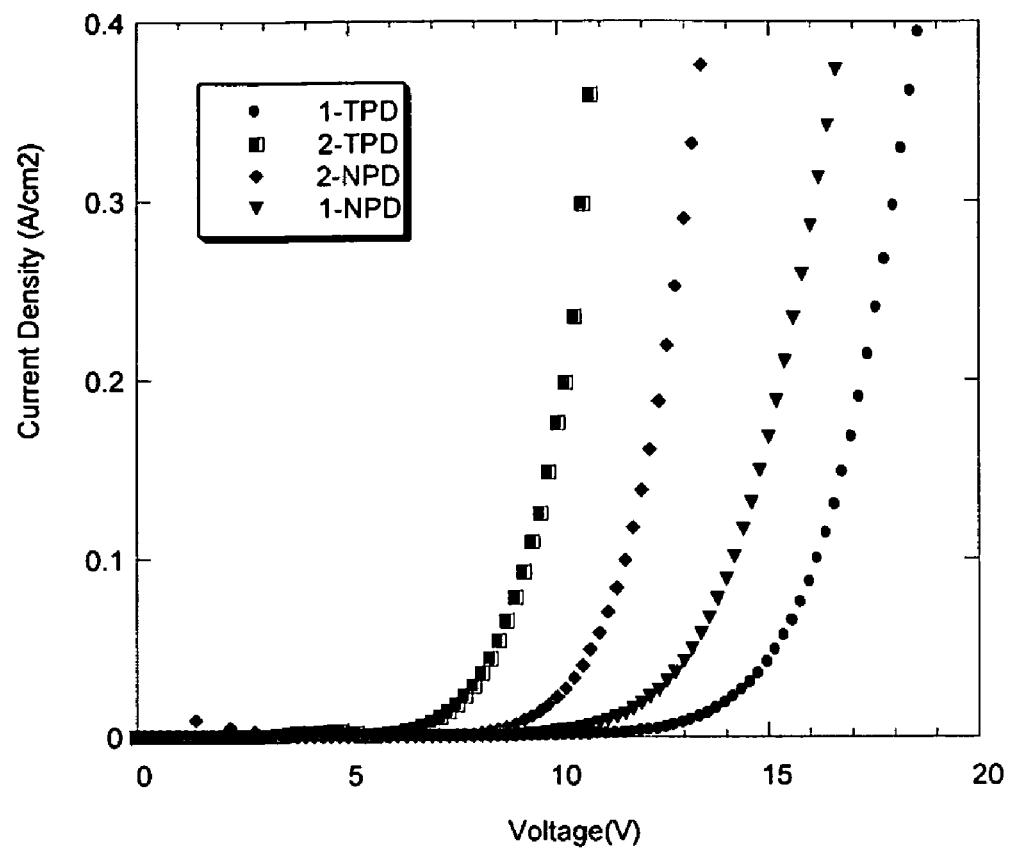
FIG. 23 is a graph comparing current density as a function of voltage for a few representative devices of the invention (ITO/HTL/PFBT5/CsF/Al) with hole-transporting layers derived from crosslinked hole-transporting material: 1-TPD, 2-TPD, 2-NPD, and 1-NPD.
Figure 24:
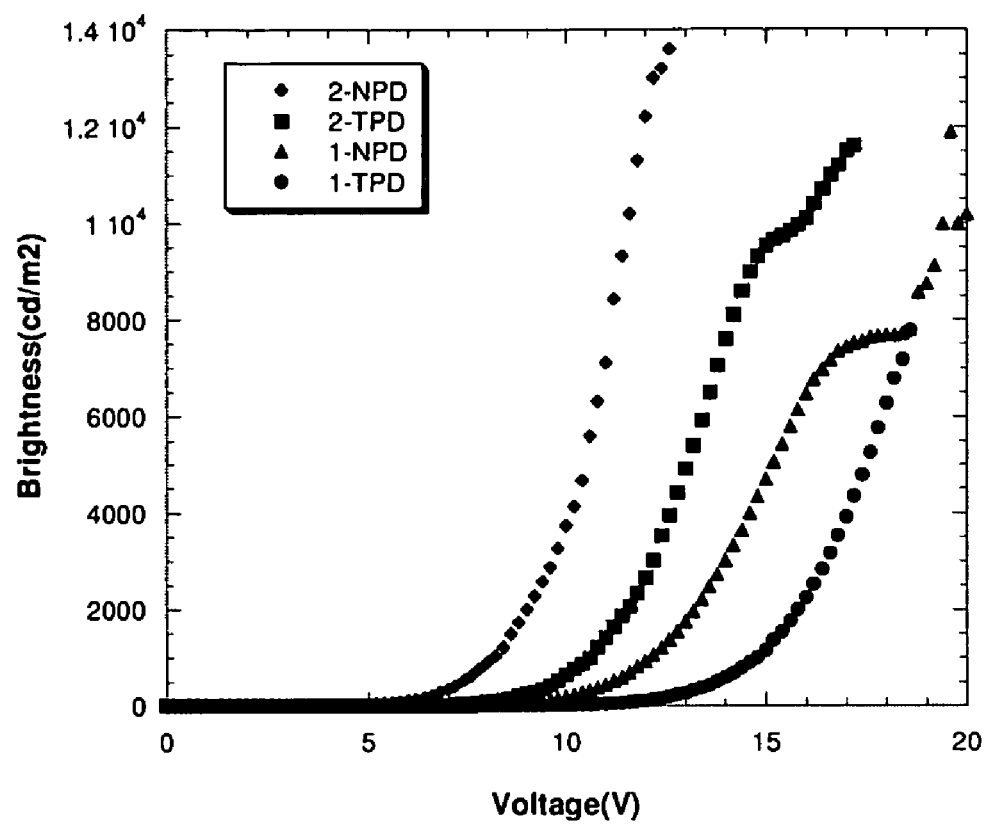
FIG. 24 is a graph comparing brightness as a function of voltage for four representative devices of the invention (ITO/HTL/PFBT5/CsF/Al) with hole-transporting layers derived from crosslinked hole-transporting material: 2NPD, 2-TPD, 1-NPD, and 1-TPD.

All the devices produced uniform and stable emission at around 540 nm exclusively from PFBT5 emissive layer. Indeed, the content of triarylamine units in the materials plays a pivotal role in determining the hole-transporting ability which reflects explicitly on the overall device performance. As can be seen in Table 2, the device using 2-TPD as a hole-transporting layer (HTL) yielded the dramatic improvement in every parameter of device performance compared to its corresponding counterpart 1-TPD. The same trend is also observed in the pair of 1-NPD and 2-NPD in every device parameter. It should be noted that the device based on 2-NPD as the HTL exhibited exceptional performance in terms of the lowest turn-on voltage of 4.6 V, highest external quantum efficiency of 1.89%, best luminous efficiency of 6.21 cd/A and maximum brightness of 13600 cd/m² at 12.6 V driving voltage. It is worthy to mention that NPD-based materials gave better device performances than TPD-based analogues, which is consistent with the results of hole-only devices. The curves of current density and brightness as the function of voltage were shown in FIGS. 23 and 24 respectively.

TABLE 2

Electroluminescence data of representative devices of the invention based on the structure: ITO/HTL/PFBT5/CsF/Al.

| HTL[a] | $V_{on}^b$ (V) | $Q_{max}^c$ (%) | $LE_{max}^d$ (cd/A) | $\eta_E^e$ (lm/W) | $B_{max}^f$ (cd/m²) | $V_{B\,max}^g$ (V) |
|---|---|---|---|---|---|---|
| 1-TPD | 8.2 | 1.08 | 3.68 | 1.12 | 7780 | 18.6 |
| 1-NPD | 7.8 | 1.64 | 5.60 | 1.85 | 11900 | 19.2 |
| 2-TPD | 6.2 | 1.62 | 5.37 | 2.47 | 11600 | 17.2 |
| 2-NPD | 4.6 | 1.89 | 6.21 | 3.87 | 13600 | 12.6 |

[a]crosslinked at corresponding curing temperatures.
[b]Turn-on voltage.
[c]Maximum external quantum efficiency.
[d]Maximum luminous efficiency.
[e]Power efficiency.
[f]Maximum brightness.
[g]Driving voltage corresponding to maximum brightness.

The devices were made by using hole-transporting materials disclosed in this invention which include TPD or α-NPD molecules bearing VB as a thermally self-initiated crosslinker. In-situ polymerization of two VB groups in each material was carried out solely by heat in the absence of added initiator without generating byproducts. Curing temperature can be as low as 160° C. to achieve solvent-resistance polymeric networks of hole-transporting layer which is suitable for the next spin-coating step of the emissive layer. Based on the device structure ITO/HTL/PFBT5/CsF/Al, NPD-based materials gave better device performances compared to TPD-based ones. BNPD with the highest density of hole-conductor (77 wt %) showed the best hole-transporting ability.

In another aspect, the present invention provides a bilayer hole-transporting structure useful in multilayer PLEDs.

In one embodiment, the bilayer includes layers that may be made from one or more of the crosslinkable hole-transporting compounds of the invention (e.g. formulas I, II, or III) described above.

In one embodiment, the hole-transporting bilayer comprises:

(a) a first layer comprising a crosslinked hole-transporting material and having a first solid state ionization potential;

(b) a second layer comprising a crosslinked hole-transporting material and having a second solid state ionization potential, wherein the first solid state ionization potential is less than the second solid state ionization potential.

In one embodiment, the hole-transporting materials of the first and second layers are thermally crosslinked.

The difference between the first solid state ionization potential and the second solid state ionization potential can be from about 0.2 eV to about 0.4 eV. In one embodiment, the first layer can have a solid state ionization potential of about 5.3 eV. In one embodiment, the second layer can have a solid state ionization potential of about 5.7 eV.

In one embodiment, the thickness of the first layer is about twice of the thickness of the second layer. For example, the thickness of the first layer can be more than about 20 nm, and the thickness of the second layer can be more than about 10 nm.

Representative Hole-Transporting Bilayer: TPD or NPD Moieties in the First Layer and TCTA Derivatives in the Second Layer An ideal hole-transporting layer functions not only to maximize hole-injection and block the electron from escaping from the emitting layer to the anode, but also to confine excitons in the EML. For fluorescent conjugated polymers and red-emitting phosphorescent emitters, the three-fold functions can be achieved relatively easy through the use of N,N'-di-tolyl-N,N'-diphenyl-1,1'-biphenyl-4,4'-diamine (TPD)-based HTLs. However, for blue phosphorescent emitters, such as bis(4',6'-difluorophenylpyridinato)tetrakis(1-pyrazolyl)borate (FIr6) which has high exciton energy and hence needs a host with even larger band-gap, usually with the HOMO level higher than −5.7 eV, a single layer HTL would have difficulty in fulfilling this requirement.

Due to its suitable energy level (the HOMO level at −5.7 eV and the lowest unoccupied molecular orbit (LUMO) level at −2.3 eV), tris(4-carbazole)triphenylamine (TCTA) has been reported to form a cascade hole-injection configuration when evaporated on top of a TPD or 1,4-[(1-naphthylphenyl)-amino]biphenyl (NPD) layer with their HOMO levels lie at −5.3 about-5.5 eV. R. J. Holmes et al. *Appl. Phys. Lett.* 83, 3818 (2003); X. Ren et al. *Chem. Mater.* 16, 4743 (2004); G. He et al. *Appl. Phys. Lett.* 85, 3911 (2004); C. C. Wu et al. *Adv. Mater.* 16, 61 (2004); and B. W. D'Andrade et al. *Adv. Mater.* 16, 624 (2004). However, its use for cascade HTL in polymer-based blue-emitting and white-emitting electrophosphorescent LEDs has never been achieved because of the solvent-erosion problem.

The present invention solves this problem by providing a bilayer hole-transporting structure wherein the first layer comprises a plurality of TPD or NPD moieties, and the second layer comprises a plurality of TCTA moieties. In one embodiment, the first layer comprises crosslinked PS-TPD-TFV and the second layer comprises crosslinked TCTA-TTFV. In one embodiment, the first layer comprises crosslinked PS-TPD-TFV and the second layer comprises crosslinked TCTA-BVB. The TCTA/TPD bilayer was made by spin-coating 20 nm-thick of TCTA derivatives onto 20 nm-thick crosslinked PS-TPD-PFCB.

Figure 25A:
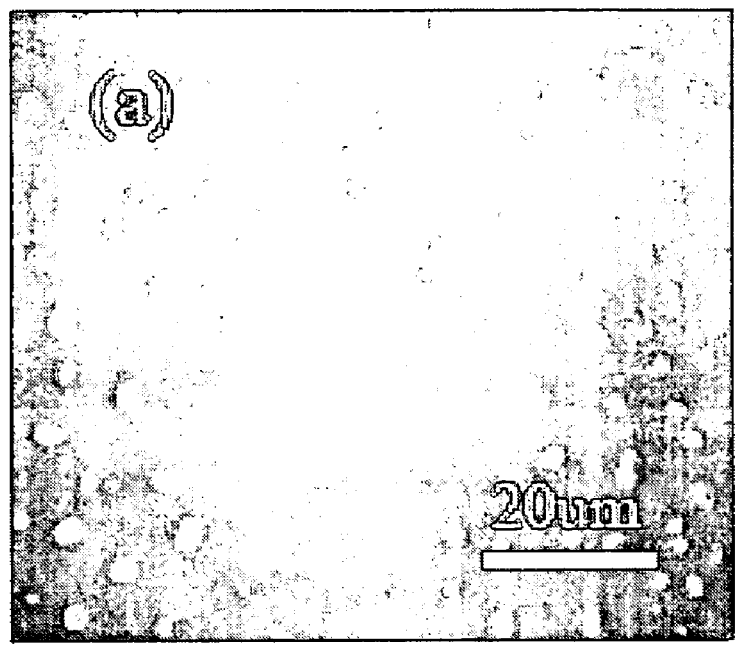
FIGS. 25A and 25B are optical micrographs of TFV-functionalized TCTA on PS-TPD-PFCB layer after thermal curing at 225° C. for 30 min. (A) TCTA-PFCB (B) Bu-TCTA-PFCB.
Figure 25B:
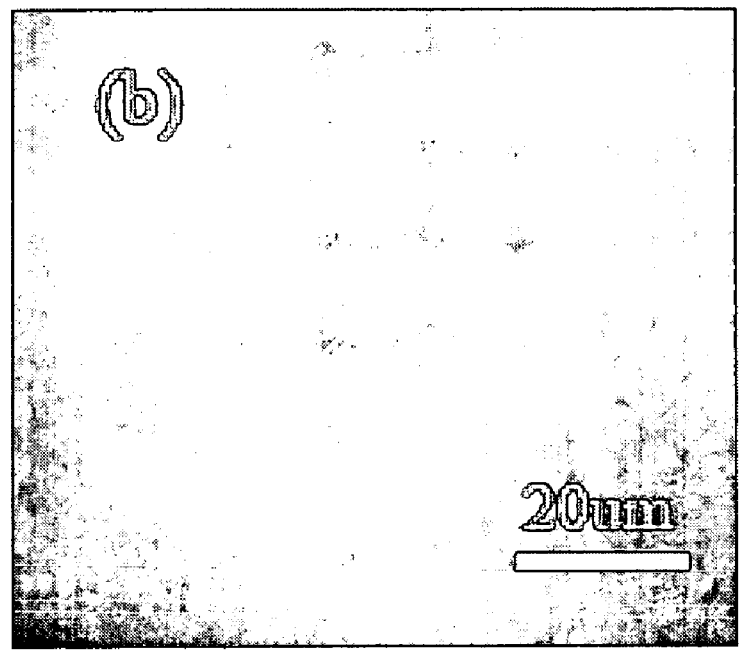
Figure 26:
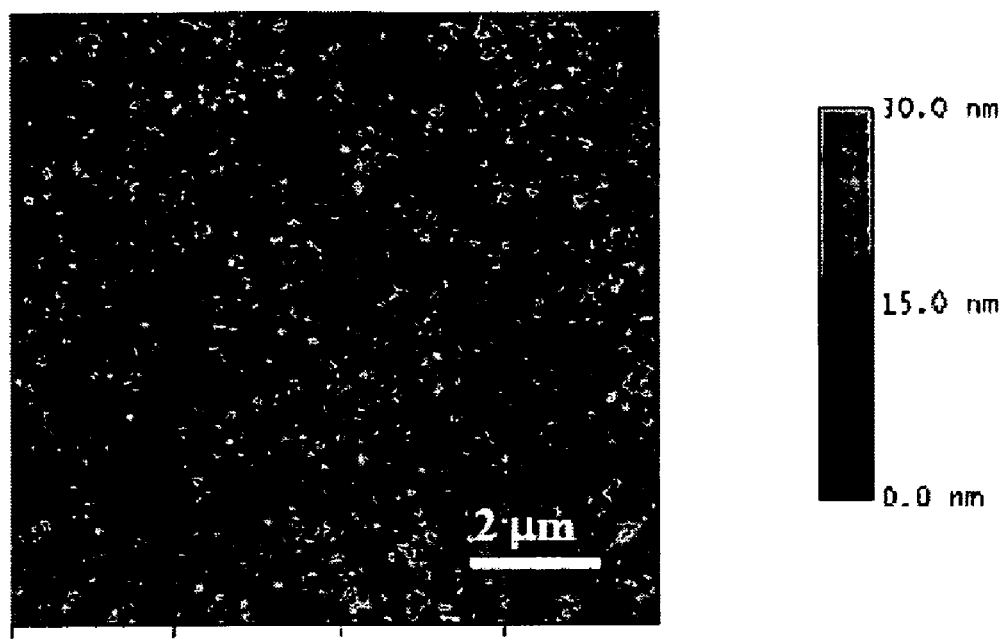
FIG. 26 is a tapping mode atomic force microscopy (AFM) image of TCTA-BVB on a PS-TPD-PFCB layer after thermal curing at 180° C. for 30 min.

For PLED applications, it is important to obtain high quality thin films with no defects such as aggregates or pinholes, which often reduces both the lifetime and performance of devices. The surface morphology of double HTLs, with 20 nm-thick of TCTA derivatives spin-coated onto 20 nm-thick crosslinked PS-TPD-PFCB before- and after-thermal curing were investigated using tapping mode atomic force microscopy (AFM) and optical microscopy. The first HTL from PS-TPD-PFCB is very smooth with RMS roughness 0.63 nm, indicating the effective planarization of the ITO surface by the PS-TPD-PFCB film. The as-spun films of three TCTA derivatives on PS-TPD-PFCB are also quite smooth with RMS roughness of less than 1 nm. However, the surface roughness increases dramatically after thermal curing at 225° C. for 30 min for TFV-containing TCTAs. As shown in FIGS. 25A and B, there are many islands formed after crosslinking. The heights of these islands in TCTA-PFCB are greater than 300 nm, which is more than a hundred nanometer higher compared to those in Bu-TCTA-PFCB (measured by AFM). In sharp contrast, the roughness of the crosslinked TCTA-BVB films obtained at a much lower temperature (180° C. for 30 min) only increased slightly compared to its pre-crosslinked films (0.49 nm). The RMS roughness of this double-layer film is 1.62 nm, indicating good cohesion between crosslinked TCTA-BVB and PS-TPD-PFCB (FIG.

26). Not wanting to be limited by the theory, there are two possible reasons that could contribute to the island formation in TFV-containing TCTAs. One may be due to the de-wetting between the top TCTA-PFCB layer and the bottom PS-TPD-PFCB layer. Because the higher fluoro-content in the TFV-functionalized TCTAs, the surface energy of these TCTA layers are lower than that of PS-TPD-PFCB. As a result, the cohesion between TCTA-PFCB/Bu-TCTA-PFCB and PS-TPD-PFCB interface is quite weak and causes the de-wetting between these two layers during heating. The other possible reason may be due to the thermal-induced crystallization of TCTA moieties during the high temperature polymerization process.

In another aspect, the present invention provides light-emitting devices that include a hole-transporting bilayer made from one or more crosslinkable compounds of the invention.

In one embodiment, the device comprises,
(a) an anode;
(b) a cathode;
(c) an emissive layer intermediate the anode and the cathode; and
(d) a hole-transporting layer intermediate the anode and the emissive layer, wherein the hole-transporting layer comprises a hole-transporting bilayer comprising:
  (i) a first layer comprising a crosslinked hole-transporting material and having a first solid state ionization potential;
  (ii) a second layer comprising a crosslinked hole-transporting material and having a second solid state ionization potential,
wherein the first solid state ionization potential is less than the second solid state ionization potential.

In one embodiment, the crosslinked hole-transporting materials of the bilayer can be made from the crosslinkable compounds of the invention described above (i.e., the crosslinked hole-transporting material is derived from a crosslinkable compound having the formula I, II, or III, as defined above).

In one embodiment, the difference between the second solid state ionization potential and the first solid state ionization potential is from about 0.2 eV to about 0.4 eV.

Representative Blue Phosphorescent PLED Device with TPD/TCTA Hole-Transporting Bilayers For blue phosphorescent LEDs, because most of the blue phosphorescent emitters possess high energy level at their highest occupied molecular orbital (HOMO) (for example, the HOMO for bis(4',6'-difluorophenylpyridinato)tetrakis(1-pyrazolyl)borate (FIr6) is −6.1 eV), it is difficult to have efficient hole injection in the device. In order to alleviate this problem, the present invention provides a polymer-based phosphorescent blue LED using two crosslinkable HTLs with gradient energy levels, i.e. the crosslinkable tetraphenylbiphenyldiamine (TPD, HOMO level at −5.3 eV) and tris(4-carbazole) triphenylamine (TCTA, HOMO level at −5.7 eV), for facilitating cascade hole-injection/transport and effective electron-blocking/exciton confinement.

The precursor polymer of the TPD-based hole-transport material (HTM), PS-TPD-TFV, has a very high loading of dibutyl-substituted TPD (93 mol. %) and thermally crosslinkable trifluorovinyl ether (TFV) side-chains (7 mole. %) attached onto the polystyrene (PS) backbone. The precursor of the TCTA-based HTM, TCTA-TTFV, was obtained by reacting hydroxy-functionalized TCTA with 4-trifluorovinyloxy-benzoic acid according to the synthetic scheme in FIG.

6. The electron-injection material, 1,3,5-tris(N-phenylbenzimidazol-2-yl)benzene (TPBI), and the blue triplet-emitter, FIr6, were synthesized according to the methods reported in the literature. Y. Kuwabara, et al. *Adv. Mater.* 6, 677 (1994); J. Li, et al. *Polyhedron* 23, 419 (2004). The host polymer, poly (N-vinylcarbazole) (PVK), was purchased from Aldrich-Sigma. A solution blend of 10 wt % FIr6 in PVK was used to form EML via spin-coating.

The LEDs were fabricated on pre-cleaned and $O_2$ plasma-treated ITO covered glass substrates. After the plasma treatment, the substrates were moved into a glovebox and all the subsequent film-forming processes were performed in the argon-protected environment. For the LED with bilayer HTLs, the first layer with a nominal thickness of 20 nm was formed by spin-coating the PS-TPD-TFV solution onto ITO and then thermally crosslinked on a hotplate at 235° C. for 40 min. A robust and uniform film with good solvent-resistance can be formed and hence referred as PS-TPD-PFCB. On top of this layer, the second HTL with a nominal thickness of 10 nm was formed by spin-coating the TCTA-TTFV solution and then thermally crosslinked at 225° C. for 40 min. This crosslinked layer is referred to as TCTA-PFCB. As a control, a single layer of PS-TPD-PFCB with a nominal thickness of 30 nm was formed with the same procedure as the HTL in the bilayer device. For these two devices, an EML with a nominal thickness of 40 nm was then spin-coated on top of the HTL(s). A layer of TPBI (25 nm) was then sublimed under a vacuum about $1 \times 10^{-6}$ torr. Finally, cesium fluoride (CsF) (1 nm) and aluminum (20 nm) were evaporated as cathode.

After being encapsulated by cover glasses via ultraviolet light cured epoxy, the LEDs were moved out of the glovebox and the performance test was carried out at room temperature. Current density-voltage (J-V) characteristics were measured on a Hewlett-Packard 4155B semiconductor parameter analyzer. The photoluminescent (PL) and electroluminescent (EL) spectra were recorded by a spectrometer (Instaspec IV, Oriel Co.) based on Peltier-cooled charge-coupled device (CCD). The light power of the EL emission was measured using a calibrated Si-photodiode and a Newport 2835-C multifunctional optical meter. Photometric units ($cd/m^2$) were calculated using the forward output power together with the EL spectra of the devices under assumption of the emission's Lambertian space distribution.

Figure 28A:
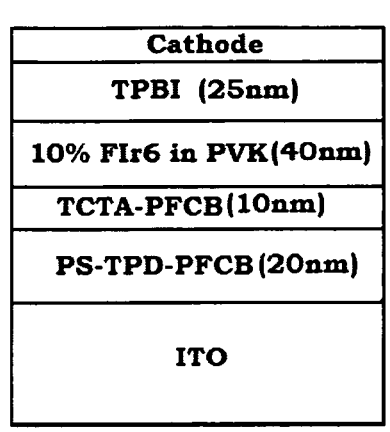
FIG. 28A is a schematic illustration of a representative device of the invention with a hole-transporting bilayer (TCTA-PFCB and PS-TPD-PFCB) with 1,3,5,-tris(N-phenylbenzimidazol-2-yl)benzene (TPBI) as the electron-injection material, and FIr6 as the blue triplet-emitter.
Figure 28B:
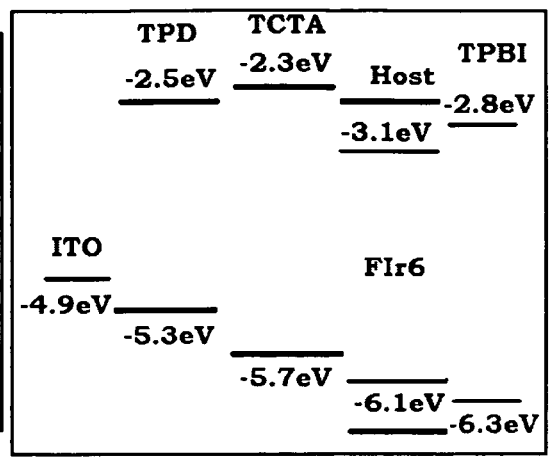
FIG. 28B is an energy level diagram of the device of FIG. 28A.

From the energy level diagram in FIG. 28, it is clear that cascade hole-injection/transport can be formed by this bilayer HTL configuration. Holes first inject from ITO into the PS-TPD-PFCB layer across a medium energy barrier of 0.4 eV, transport through this HTL to reach the second interface, then inject into the TCTA-PFCB layer across the second medium energy barrier of 0.4 eV. Finally most of the holes will be injected directly into the HOMO of the FIr6 guests (−6.1 eV) dispersed in the EML by passing over another energy barrier of 0.4 eV. On the contrary, if a single HTL is adopted, no matter where its HOMO level lies, the holes must get over at least an energy barrier higher than 0.6 eV (or two 0.6 eV barriers if the HOMO level of this single HTL lies exactly in the middle; for the single TPD-based HTL, the second barrier would be 0.8 eV). Because of the injection efficiency is basically inverse proportional to the exponential of 3/2 order of the energy barrier, the huge barrier will hinder the hole-injection dramatically. Meanwhile, considering the large triplet exciton energy of 2.72 eV in FIr6, more efficient exciton-confinement can be realized at the anode side by adding this TCTA-based HTL with a band-gap of about 3.4 eV, in contrast to the insufficient exciton-confinement by the TPD-based single layer HTL with a band-gap of about 2.8 eV.

Figures 29A, 29B:
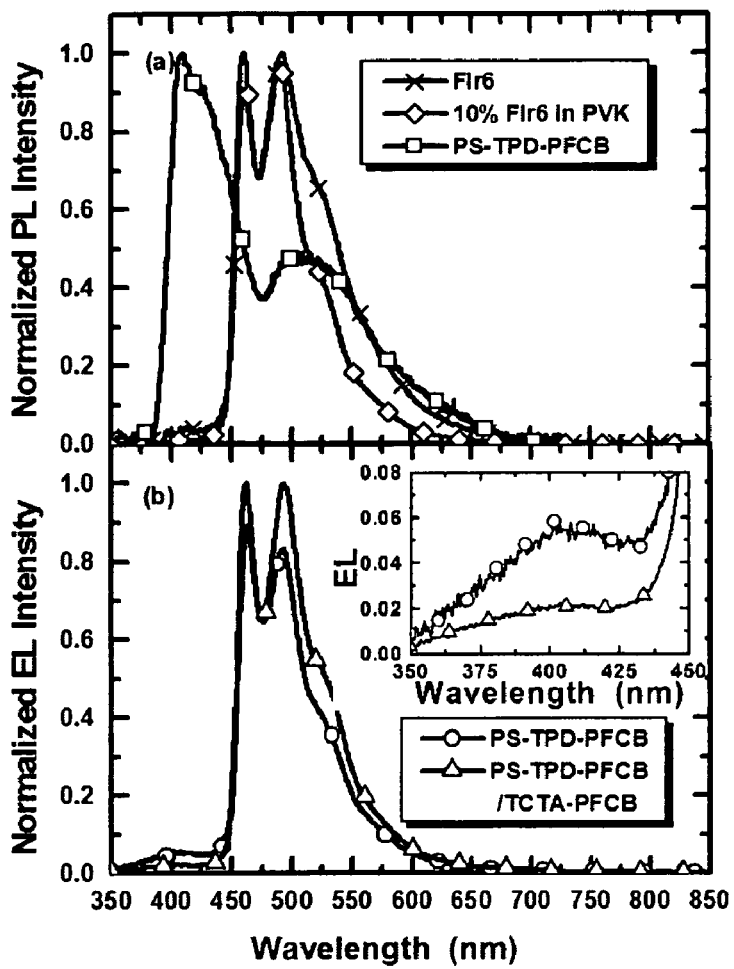
FIG. 29A compares the photoluminescent (PL) spectra of the films of FIr6 (x), its 10 wt % blend in PVK host (◇), and PS-TPD-PFCB (□) when excited at 316 nm.
FIG. 29B is the electroluminescent (EL) spectra from LEDs with two different HTL configurations: (1) ITO/HTL/10% FIr6 in PVK (40 nm)/TPBI (25 nm)/CsF (1 nm)/Al, where HTL is a single layer PS-TPD-PFCB (30 nm) (O), and (2) ITO/HTL/10% FIr6 in PVK (40 nm)/TPBI (25 nm)/CsF (1 nm)/Al, where HTL is a bilayer PS-TPD-PFCB (20 nm)/TCTA-PFCB (10 nm) (Δ); inset of FIG. 29B is the enlarged EL spectra between 350 nm and 450 nm.

FIG. 29A shows the PL spectra from the films of FIr6 and its 10 wt % blend in PVK host when excited at 316 nm. Together with them is the weak PL emission of TPD at 406 nm from PS-TPD-PFCB. FIG. 29B shows the EL spectra from the LEDs with two different HTL(s) configurations. The similarity of the spectra shows that the emission comes dominantly from the FIr6 guest in the blend both in the PL and in the EL processes. However, from the inset of FIG. 29B, it can be noticed that the TPD emission around 406 nm, an indication of the leaked electron into the TPD-based HTL, was greatly suppressed by adding the TCTA-based HTL.

Figure 30:
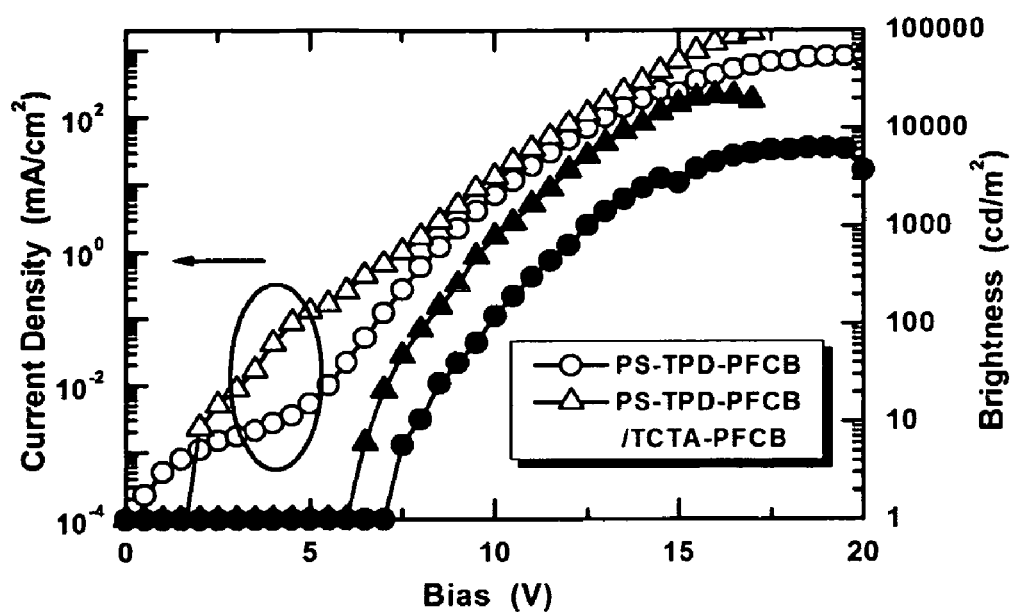
FIG. 30 compares the current density versus voltage curves (open) and brightness versus voltage curves (solid) for representative devices of the invention based on 10% FIr6 in PVK with the two different hole-transport configurations: (1) single hole-transporting layer PS-TPD-PFCB (○), and (2) hole-transporting bilayer PS-TPD-PFCB/TCTA-PFCB (Δ).
Figure 31:
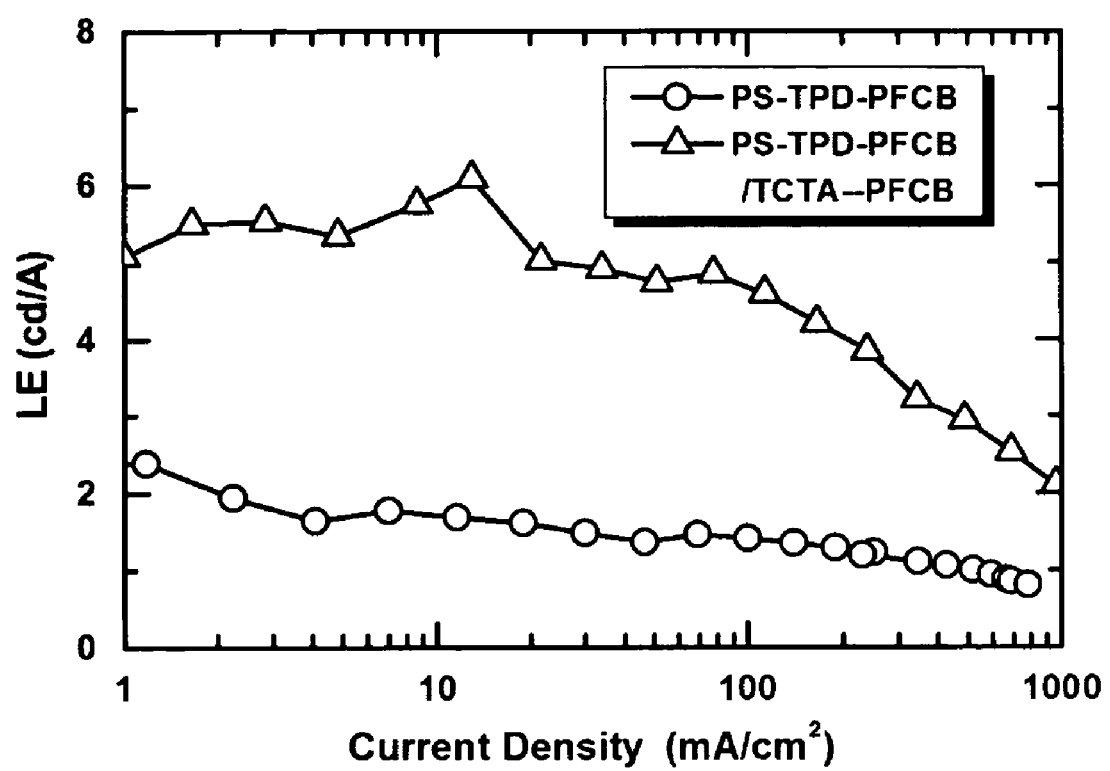
FIG. 31 compares the luminous efficiency (LE)-current density characteristics of the LEDs based on 10% FIr6 in PVK with the two different hole-transport configurations: (1) single hole-transporting layer PS-TPD-PFCB (○), and (2) hole-transporting bilayer PS-TPD-PFCB/TCTA-PFCB (Δ).

The J-V and the brightness-voltage (B-V) characteristics of the LEDs are shown in FIG. 30 while the luminous efficiency (LE)-current density characteristics are shown in FIG. 31. Apparent performance improvement was achieved by using the bilayer HTLs. For the LED with single PS-TPD-PFCB HTL, a maximum external quantum efficiency ($\eta_{ext}$) of 1.24 ph/el % and maximum LE of 2.39 cd/A was achieved. However, by adding the TCTA-PFCB layer, the next and LE reached 3.00 ph/el % and 6.09 cd/A, respectively.

The morphological stability of the TCTA derivatives (TCTA-TTFV, Bu-TCTA-TTFV, TCTA-BVB) on the performance and long term stability of the PLEDs was also investigated by the same device structure as above (ITO/PS-TPD-PFCB/TCTA-derivative/PVK:FIr6 (10 wt %)/TPBI/CsF/Al) were also fabricated to study the function of TCTA-derivatives in cascade hole injection. The device performance was summarized in Table 3.

TABLE 3

PLED Device Performance with Double HTLs Having the Structure of ITO/PS-TPD-PFCB/HTL2/PVK:FIr6 (10 wt %)/CsF/Al.

| HTL2 | Turn-on voltage (V) | Maximum Brightness (cd/m$^2$) | Maximum external quantum efficiency (%) | Maximum luminance efficiency (cd/A) |
|---|---|---|---|---|
| TCTA-PFCB | 6.4 | 12500 | 3.67 | 8.34 |
| Bu-TCTA-PFCB | 8.0 | 10600 | 3.47 | 7.56 |
| TCTA-BVB | 6.0 | 17400 | 3.17 | 6.60 |

Figure 32A:
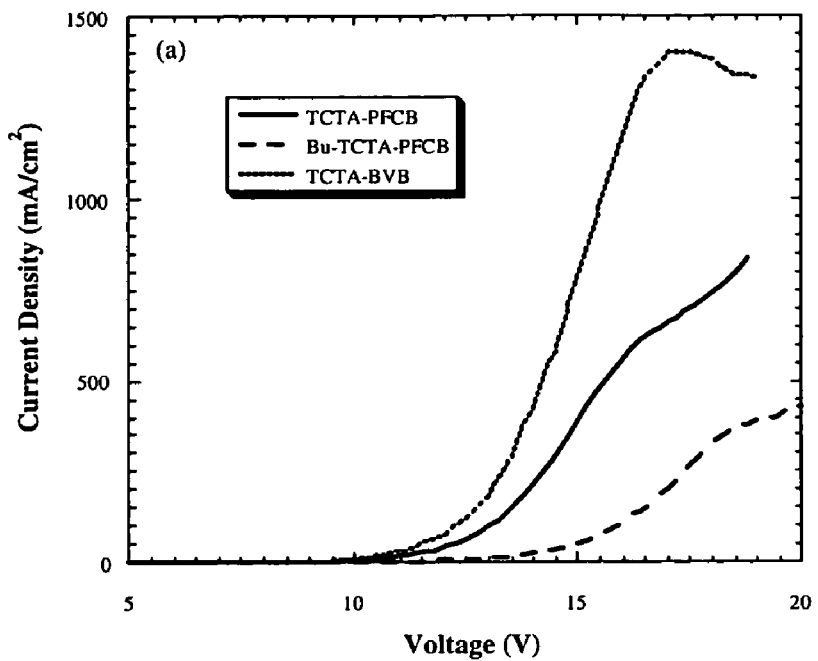
FIG. 32A compares the current density versus voltage curves for three representative devices of the invention having double HTLs (ITO/PS-TPD-PFCB/TCTA-derivative/PVK: FIr6 (10 wt %) TPBI/CsF/Al) using PS-TPD-PFCB as the first hole-transporting material and TCTA-PFCB, Bu-TCTA-PFCB, or TCTA-BVB as the second hole-transporting material.
Figure 32B:
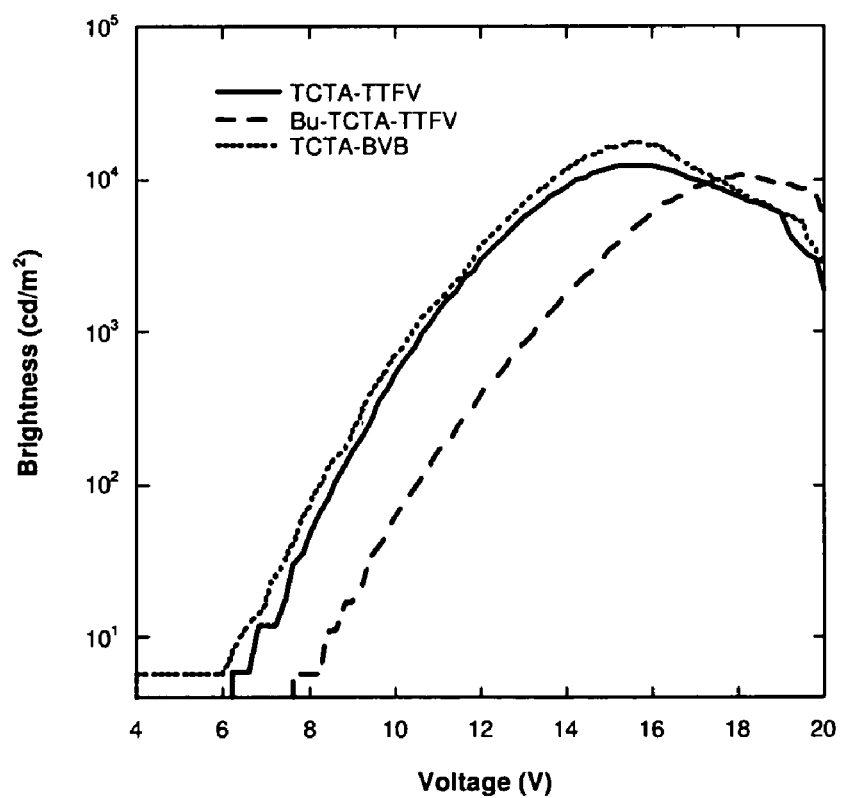
FIG. 32B compares the brightness versus voltage curves for the three representative devices of FIG. 32A.

When crosslinked TCTA-BVB was used as the second HTL, the efficiency reaches 3.17% at the brightness of 441 cd/m$^2$. The maximum brightness also increased to 17 400 cd/m$^2$ at 9.5 V. The improvement of both light output and quantum efficiency demonstrates that the utilization of double HTLs with better-matched HOMO levels improves the efficient hole-injection from ITO to EML and facilitates balanced charge transport. Although Bu-TCTA-PFCB forms slightly smoother films than TCTA-PFCB, the device based on using Bu-TCTA-PFCB as HTL shows much higher turn-on and driving voltages comparing to those obtained from either TCTA-PFCB or crosslinked TCTA-BVB. These results may be derived from the insulating butyl groups that inhibits hole transport in the devices (FIG. 32).

The compatibility between two HTLs also affects the device characteristics and reproducibility greatly. Due to significant de-wetting of the TCTA-PFCB layer when it was coated on PS-TPD-PFCB, the devices made from these HTLs are easily to break down and have very poor reproducibility. In contrast, the devices made from crosslinked TCTA-BVB HTL can be repeatedly ramped up to their maximum luminance because of their morphological stability.

In one aspect, the present invention provides an integrated hole-injection and hole-transporting layer useful in multi-layer light-emitting devices. These layers are made from one or more of the crosslinkable hole-transporting compounds of the invention, described above.

In one embodiment, the integrated hole-injection and hole-transporting layer comprises:
(a) a hole-injection layer, and
(b) a hole-transporting layer, comprising a crosslinked hole-transporting material, wherein the hole-transporting material is formed by crosslinking on the surface of the hole-injection layer.

The hole-transporting layer of the integrated hole-injection and hole-transporting layer can made from the compounds of the present invention noted above. In one embodiment, the hole-injection layer can be a plurality conductive materials, including PEDOT:PSS, polyaniline:camphorsulfonic acid (PANI:CSA), polypyrrole:dodecylbenzene sulfonic acid (Ppy:BDSA) and p-doped HTMs. In one embodiment, the hole-transporting layer can include a plurality of TCTA moieties. In one embodiment, the hole-transporting layer can include a plurality of TPD moieties. In one embodiment, the hole-transporting material is derived from a crosslinkable compound having formula I, as defined above. In one embodiment, the hole-transporting material is derived from a crosslinkable compound having formula II, as defined above.

In one embodiment, the hole-transporting material is derived from a crosslinkable compound having formula III, as defined above.

Figure 12:
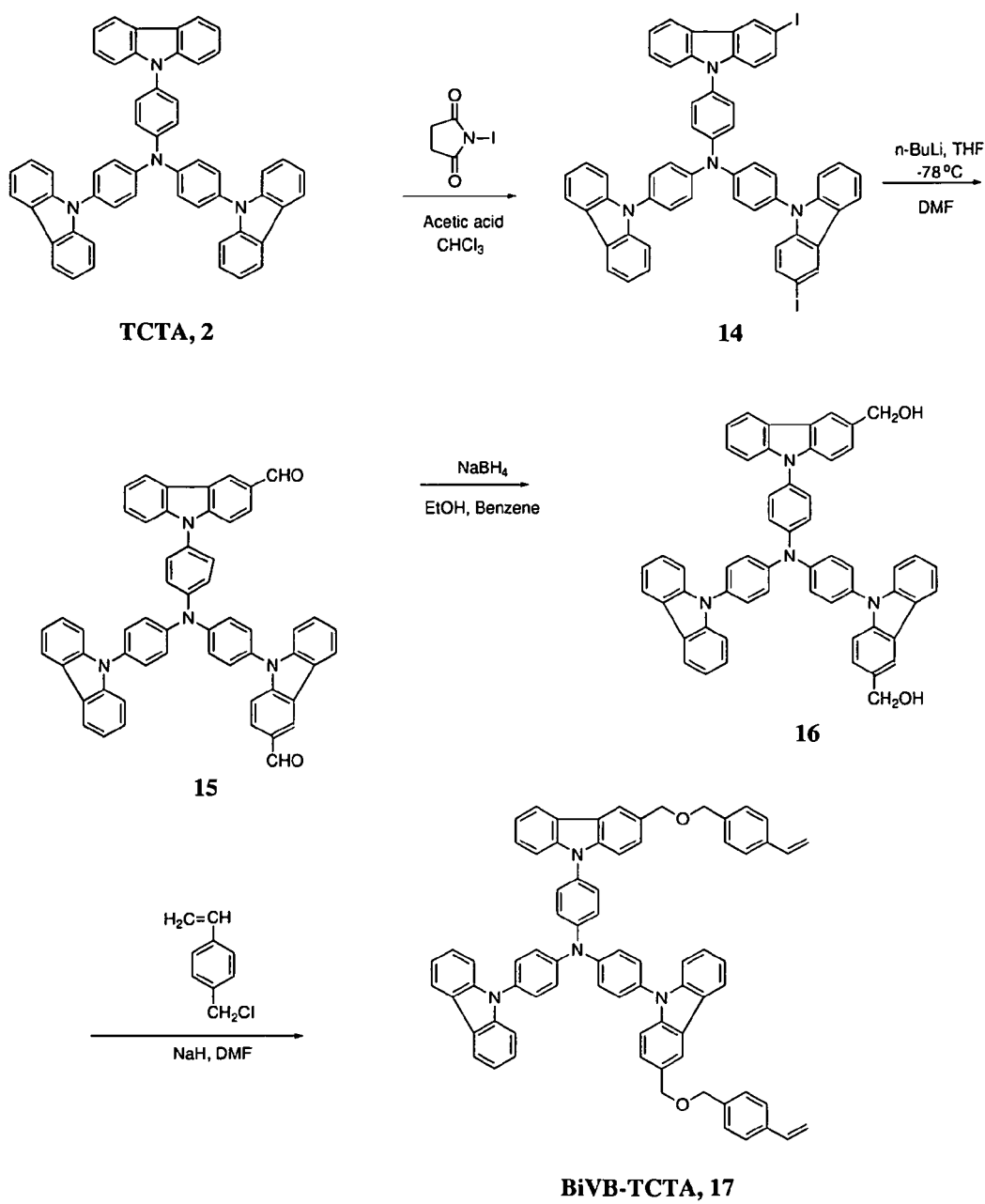
FIG. 12 is a schematic illustration of the preparation of tris(4-carbazole)triphenylamine-bis(vinyl benzyl ether) (TCTA-BVB), a representative compound of the invention.
Figure 27:
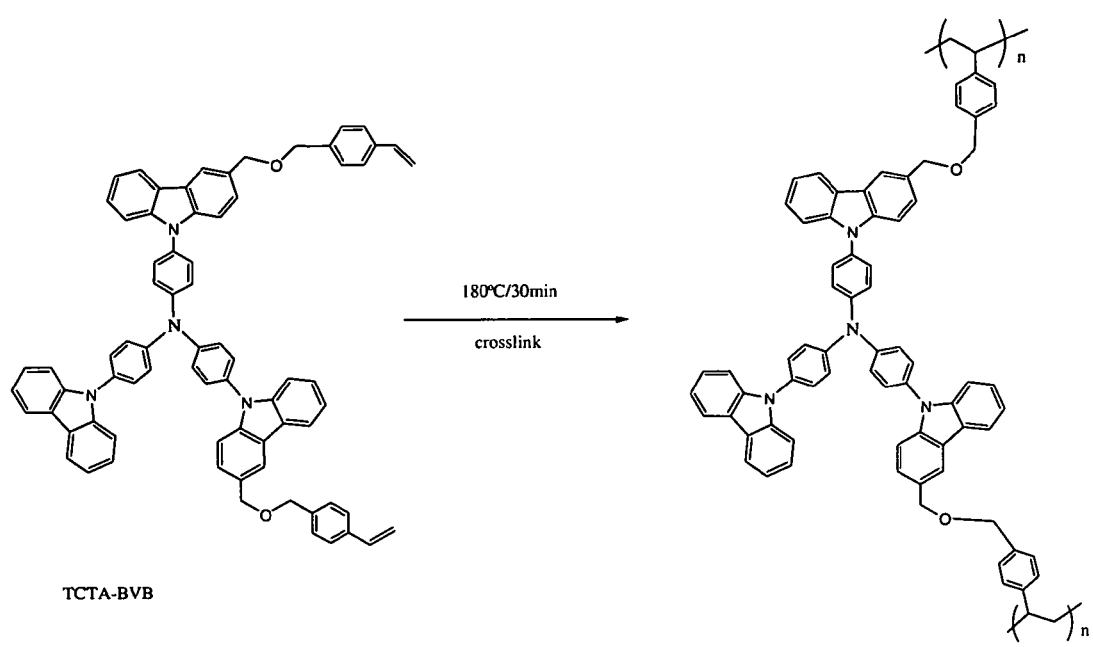
FIG. 27 is a schematic illustration of the crosslinking of a representative crosslinkable compound of the invention, TCTA-BVB, to provide a representative crosslinked hole-transporting material of the invention.

Representative Integrated Hole Injection/Transporting Layer: TCTA/PEDOT:PSS and TPD/PEDOT:PSS As shown in FIG. 12, the TCTA derivative with two crosslinkable vinyl benzyl ether groups was synthesized. The chemical structural change of TCTA-BVB after crosslinking is shown in FIG. 27.

Figures 34A, 34B:
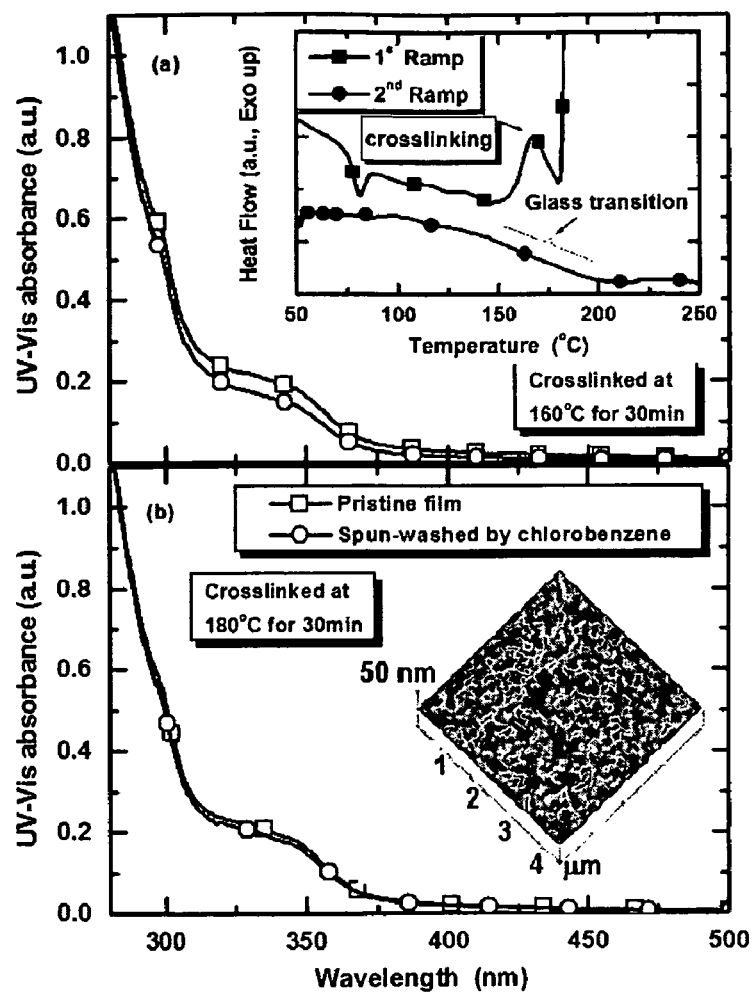
FIGS. 34A and 34B are the temperature versus UV-Vis absorbance and the wavelength versus UV-Vis absorbance graphs comparing the pristine crosslinked TCTA-BVB films (□) to those washed by chlorobenzene (○)

It has been reported that the double bond on the vinyl benzyl ether groups could be polymerized in neat film at a temperature above 150° C. F.R. Mayo, *J. Am. Chem. Soc.* 1968, 90, 1289; and N. Teramoto et al., *J. Appl. Polym. Sci.* 2004, 91, 46. As it was shown in the differential scanning calorimetric (DSC) measurement of TCTA-BVB (inset of FIG. 34A), pristine TCTA-BVB exhibits a $T_g$ around 80° C., which is much lower than that of the pure TCTA. It also showed an exothermic peak summits at 170° C., which is corresponding to the crosslinking process. After isothermal heating at 180° C. for 30 min, the sample was slowly cooled to room temperature and re-scanned. A broad transition with $T_g$ centered at about 175° C. was detected from the second ramp, indicating that the crosslinked segments might be at varied length scales. Meanwhile, no apparent exothermal peak appeared till 250° C., indicating that the TCTA-BVB was completely crosslinked. Consistent to this observation, solvent resistance was achieved for the films cured at 180° C. for 30 min (FIG. 34B). The UV-visible absorbance of the freshly cured film remains the same after being washed with chlorobenzene, a solvent that is used for spin-coating the EML. On the contrary, if a film is only cured at 160° C. for 30 min, it could not reach the needed solvent resistance, as shown in FIG. 34A. Therefore, the typical crosslinking condition used for device fabrication is kept at 180° C. for 30 min.

By spin coating from the solution of TCTA-BVB in DCE, uniform films could be formed on top of the pre-dried (125° C. for 10 min) PEDOT:PSS layer. After thermally cured at 180° C. for 30 min, the films remain to be mirror-like smoothness. The morphology of a cured film of TCTA-BVB with nominal thickness of 15 nm is shown in the inset of FIG. 34B. The root-mean-square (RMS) surface roughness of the film is 1.24 nm which is smaller than that of the two controls on ITO (1.41 nm for the PEDOT:PSS film thermally treated at 125° C. for 10 min and 1.49 nm for the other one treated at 180° C. for 30 min).

To understand the surface element distribution of the resultant films, measurements from X-ray photoelectron spectroscopy (XPS) were conducted on both PEDOT:PSS and PEDOT:PSS/crosslinked TCTA-BVB bilayer films with different TCTA-BVB coverage thickness. As shown in FIG. 35A, the relative surface atomic concentrations of C, O, S and Na were quantitatively calculated from their C (1s), O (1s), S (2p), and Na (1s) peaks. Their variations with different TCTA-BVB thickness are shown in FIGS. 35B and 35C, where the values are averaged from 3-spots high definition scans of these peaks. Interestingly, the signals from the S and Na elements which only exist in the PEDOT:PSS layer decrease dramatically as the thickness of TCTA-BVB increases. The signal of Na disappeared completely from the surface if the TCTA-BVB thickness is >15 nm, however, the signal of S remained there and it only decreased to about half of the S intensity of the PEDOT:PSS film. This indicates that the PSS chains might penetrate into the TCTA-BVB layer during its spin-coating and/or crosslinking processes or some of the TCTA-BVB molecules might penetrate into the voids of the PSS abundant surface and then crosslinked in-situ there. Nevertheless, the signal of S disappeared completely when the thickness of TCTA-BVB was further increased to 25 nm. The crosslinked TCTA-BVB above this interfacial region can function as a spacer to prevent the PEDOT:PSS chain and other mobile constitutes from penetrating into the EML to quench the emission.

1-TPD was also used to make an integrated hole injection/transporting structure with PEDOT:PSS. DSC measurements indicates that after curing isothermally at 180° C. for 30 min, 1-TPD could almost be completely crosslinked with glass-transition temperature ($T_g$) reaching approximately 150° C.

From the solutions of 1-TPD in DCE, uniform films could be formed on top of the pre-cleaned and -dried (125° C. for 10 min) PEDOT:PSS layer. After thermally cured at 180° C. for 30 min, the films still remained mirror-like smooth, with root-mean-square (RMS) surface roughness smaller than the PEDOT:PSS-covered indium-tin oxide (ITO). Spin-washing the films with chlorobenzene, a solvent for making the light-emitting solutions, would not affect the ultraviolet-visible (UV-vis) absorbance, showing good solvent-resistance was achieved.

In another aspect, the present invention provides light-emitting devices that include an integrated hole-injection and hole-transporting layer made from one or more crosslinkable compounds of the invention.

In one embodiment, the device comprises:
(a) an anode;
(b) a cathode;
(c) an emissive layer intermediate the anode and the cathode; and
(d) an integrated hole-injection and hole-transporting layer intermediate the anode and the emissive layer, wherein the integrated hole-injection and hole-transporting layer comprises a hole-injection layer, and a hole-transporting layer.

In one embodiment, the crosslinked hole-transporting materials of the bilayer can be made from the crosslinkable compounds of the invention described above (i.e., the crosslinked hole-transporting material is derived from a crosslinkable compound having the formula I, II, or III, as defined above).

Representative White OLED Device With Integrated Hole-Injection and Hole-Transporting Layer TCTA-BVB/PEDOT:PSS For white organic light-emitting diodes (WOLEDs), high power efficiency (PE) is the most important criteria for achieving low power consumption. In the case of small-molecule-based devices, it has been reported that p-type doping at the anode side to form HIL and n-type doping at the cathode side to form EIL can significantly decrease driving voltage and increase PE. To avoid quenching of luminescence by these doped layers, a neutral hole-transporting layer (about 10 nm) is often deposited as spacer between the p-doped HTL and the EML while an electron-transporting spacer (about 10 nm) is deposited between the ETL and the EML.

In one embodiment, the present invention provides a device with a hole-transporting layer comprising TCTA integrated with a hole-injection layer.

A high efficiency polymer WOLEDs have been made by using a hole-injection/transport bilayer that was formed by thermally crosslinking a TCTA-based HTL on top of the PEDOT:PSS layer. Conducting polymer poly(3,4-ethylene-dioxythiophene): poly(4-styrenesulfonate) (PEDOT:PSS) is widely used as the hole-injection layer. The excellent solvent resistance of the fully crosslinked HTL ensures the subsequent solution processing of the EML. A possible surface mixing structure formed at the interface between HIL and HTL facilitates cascade hole-injection and lowers the driving voltage, while the upper crosslinked pure TCTA-BVB part functions as an electron-blocking/exciton-confinement layer to help prevent quenching of the EML. High power efficiency (about 5.6 μm/W for the forward emission or >11 lm/W when count all the light emitted from of the device) can be achieved at a forward brightness of 800 cd/m². The device also emits quite stable white light with the Commission Internationale de l'Eclairage (CIE) coordinates varying from (0.379, 0.367) to (0.328, 0.351) which are very close to those of the white standards, (0.333, 0.333).

Figure 33:
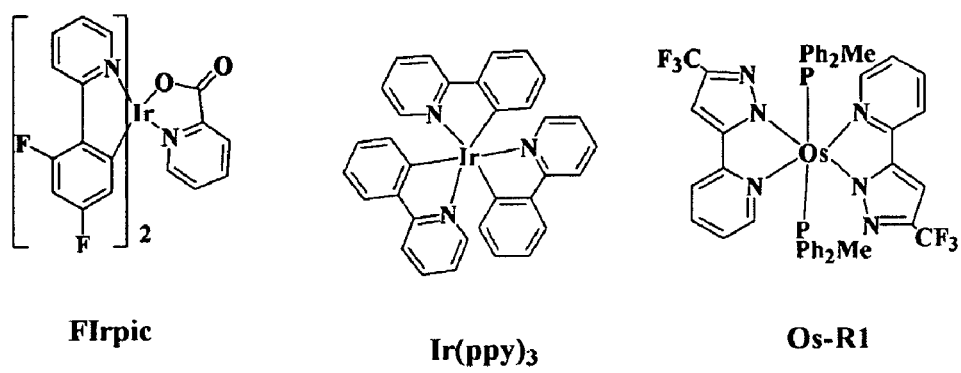
FIG. 33 illustrates the chemical structures of the blue emitter FIrpic, the green emitter Ir(ppy)$_3$, and the red emitter Os-R1, useful in making light-emitting layers in representative LED devices of the invention.
Figure 36A:
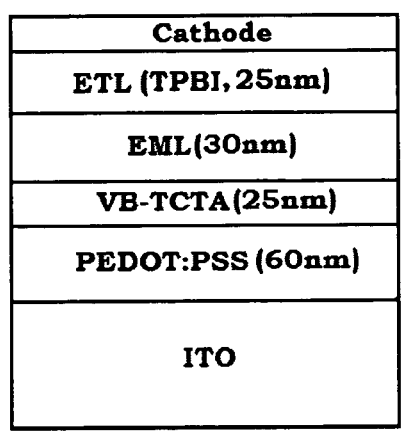
FIG. 36A is a schematic illustration of a representative device of the invention with an integrated hole-injection/transporting bilayer; the EML was formed by spin-coating a blended solution of 79 wt % PVK host, 20 wt % FIrpic as blue-emitter, 0.5 wt % Ir(ppy)$_3$ as green-emitter, and 0.5 wt % Os-R1 as red emitter in chlorobenzene on top of the ITO/PEDOT:PSS/TCTA-BVB.
Figure 36B:
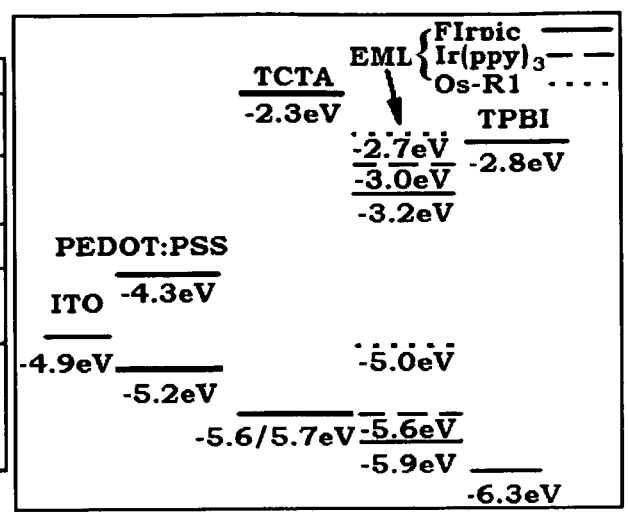
FIG. 36B is an energy level diagram of the device of FIG. 36A.

The EML of the device of the invention was formed by spin-coating a blended solution of 79 wt % PVK as host, 20 wt % FIrpic as blue-emitter, 0.5 wt % Tr(ppy)$_3$ as green-emitter, and 0.5 wt % Os-R1 as red-emitter in chlorobenzene on top of the ITO/PEDOT:PSS/crosslinked TCTA-BVB substrates with varied TCTA-BVB nominal thickness of 15 nm, 25 nm, and 34 nm, respectively. The LEDs fabricated are thereafter named as device 2, 3, 4. The PEDOT:PPS-only device was named as device 1. The chemical structures of each component are shown in FIG. 33, and their energy levels are shown in FIG. 36.

It is well documented that the dominant mechanism of forming excitons in doped system is via the direct charge carrier trapping and recombination. X. Gong et al., *Adv. Funct. Mater.* 2003, 14, 439. For this multi-component doped system, energy transfer from the blue-emitter to the green and the red is also quite possible. B. W. D'Andrade et al., *Adv. Mater.*, 2004, 16, 624.

Figures 37A, 37B:
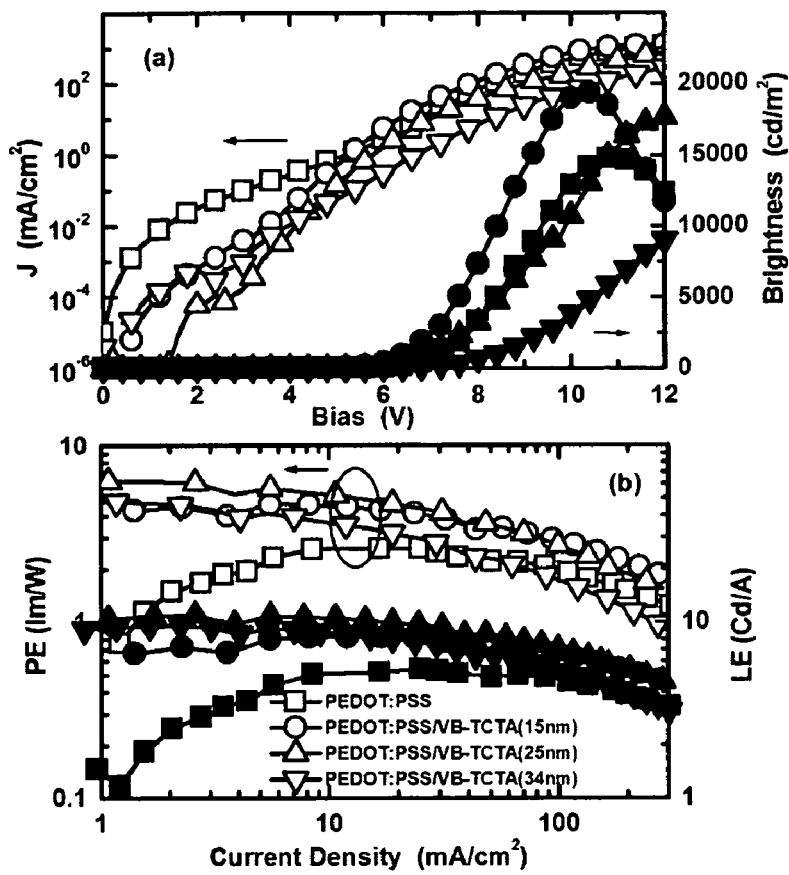
FIG. 37A compares the current density versus voltage (J-V, open symbols) and brightness versus voltage (B-V, solid symbols) of a PEDOT:PSS only control device and three representative devices of the invention that include integrated hole-injection/transporting bilayers; the integrated hole-injection/transporting bilayers are PEDOT:PSS/crosslinked TCTA-BVB with varied TCTA-BVB having nominal thicknesses of 15 nm, 25 nm, and 34 nm, respectively, and the EML were formed from a blended solution of 79 wt % PVK host, 20 wt % FIrpic as blue-emitter, 0.5 wt % Ir(ppy)3 as green-emitter, and 0.5 wt % Os-R1 as red emitter.
FIG. 37B illustrates the power efficiencies (open symbols) and luminous efficiencies (solid symbols) variations versus current density of the representative devices in FIG. 37A.

As shown in FIG. 37A and Table 4, the turn-on voltage of the control device 1, was 5.2 V, the maximum external quantum efficiency ($\eta_{ext}$) was 2.07%, and the PE was 2.08 lm/W at a forward brightness of 800 cd/m². These values are quite similar to a previously reported blend system. Y. Kawamura et al., *J. Appl. Phys.* 2002, 92, 87. For device 2 and 3, the turn-on voltage decreased to 4.8 V, showing the effect of the lowered hole-injection barriers via the cascade injection.

As shown in FIG. 37B and Table 4, all the devices with TCTA-BVB layer showed about twice or higher efficiencies than the PEDOT:PSS-only control device, indicating a more balanced carrier-injection and recombination. This should be attributed to enhanced hole-injection via cascade hopping and the effective electron-blocking at the EML/TCTA-BVB interface since the lowest unoccupied molecular orbit (LUMO) level of TCTA lies at −2.3 eV. Meanwhile, better exciton-confinement can also be achieved because the bandgap of TCTA (3.3-3.4 eV) is much larger than the exciton energies of the emitters in EML. The best performance achieved from device 3 exhibited a maximum $\eta_{ext}$ of 5.85%, a PE of 6.15 μm/W, and a luminous efficiency (LE) of 10.9 cd/A. The PE remained quite high (5.59 lm/W) at a forward brightness of 800 cd/m². For device 4 with thicker TCTA-BVB, the turn-on voltage increased to 5.6 V and the device performance also decreased, possibly due to mismatched low hole mobility in TCTA-BVB compared to that in PEDOT:PSS.

TABLE 4

Device performance recorded from the normal direction of the anode side.

| | HTL | | | |
|---|---|---|---|---|
| | | TCTA-BVB thickness | | |
| Device No. | None 1 | 15 nm 2 | 25 nm 3 | 34 nm 4 |
| Turn-on voltage (V) | 5.2 | 4.8 | 4.8 | 5.6 |
| Maximum $\eta_{ext}$ (ph/el %) | 2.07 | 4.01 | 5.85 | 5.20 |
| With PE[a]/LE[b] | 2.09/4.30 | 4.64/8.23 | 6.15/10.9 | 4.63/9.54 |
| Maximum Brightness (cd/m²) | 11,900 | 19,380 | 17,630 | 10,860 |
| at driving voltage (V) | 11.0 | 10.2 | 12.0 | 13.6 |
| PE[a] at 800 cd/m² | 2.08 | 4.56 | 5.59 | 3.74 |

Figure 38:
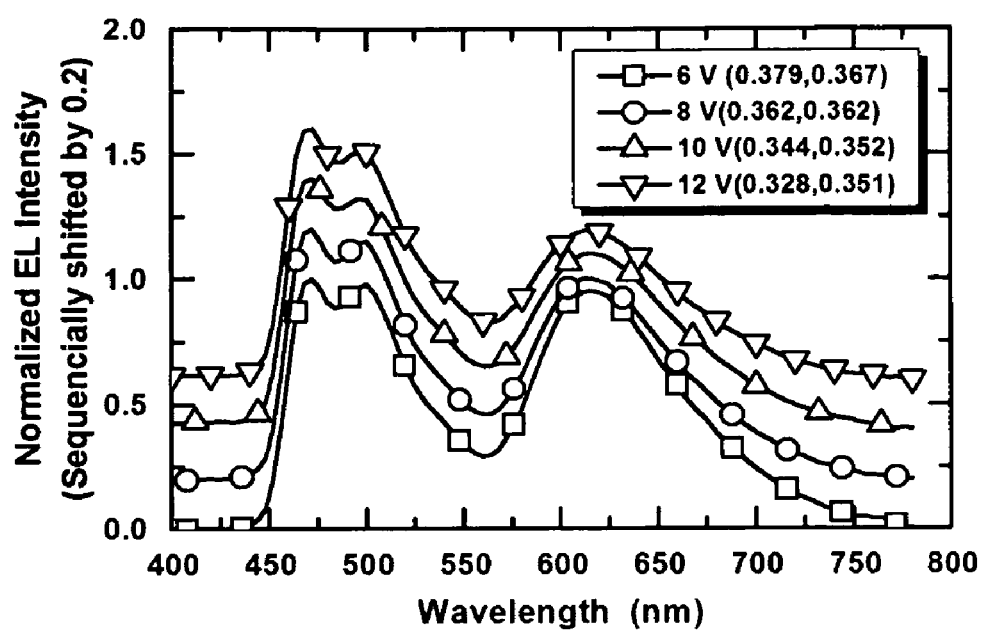
FIG. 38 compares the electroluminescent (EL) spectra measured from a representative LED device with an integrated hole-injection/transporting layer, PEDOT:PSS/TCTA-BVB (25 nm), at different driving voltages; the spectra are vertically shifted for clarity.

Device structure: ITO/PEDOT:PSS(60 nm)/HTL/blend of FIrpic, Ir(ppy)₃ and Os-R1 in PVK (30 nm)/TPBI(25 nm)/CsF(1 nm)/Al(200 nm)
[a]Power efficiency in lm/W.
[b]Luminous in cd/A FIG. 38 shows the electroluminescent (EL) spectra measured from device 3 at different driving voltages. Good color stability versus driving voltage could be achieved with the CIE coordinates varied from (0.379, 0.367) at 6 V to (0.328, 0.351) at 12 V, all very close to the standards for pure white. The slight increase of blue emission at elevated voltages reflects certain preferential saturation of the limited amount of low energy emitters in the blend.

For general lighting application, it should count all the light emitted from the device that contributes to the lighting. According to the estimation from Gong and Forrest, X. Gong et al., *Adv. Mater.* 2005, 17, 2053; B. W. D'Andrade et al., *Adv. Mater.* 1994, 6, 677, a factor of about 2 should be applied to the value of the corresponding forward-viewing external efficiency in order to get the total LE and PE. Taking this into account, a PE value of more than 11 lm/W could be realized for device 3 at a forward brightness of 800 cd/m².

Representative LED Devices With Integrated
Hole-Injection and Hole-Transporting Layer:
TCTA-BVB/PEDOT:PSS and
TPD-BVB/PEDOT:PSS Two different types of EMLs, one polyfluorene-based conjugated polymer blend with 5% benzothiadiazole content (PFBT5), the other based on blue-emitting Ir(III)-complex with phosphorescent-emission characteristic, bis(4′,6′-difluorophenylpyridinato)tetrakis(1-pyrazolyl)borate (FIr6), were chosen to manufacture LED devices with integrated hole injection/transporting layer 1-TPD/PEDOT:PSS and TCTA/PEDOT:PSS, respectively.

Figure 39:
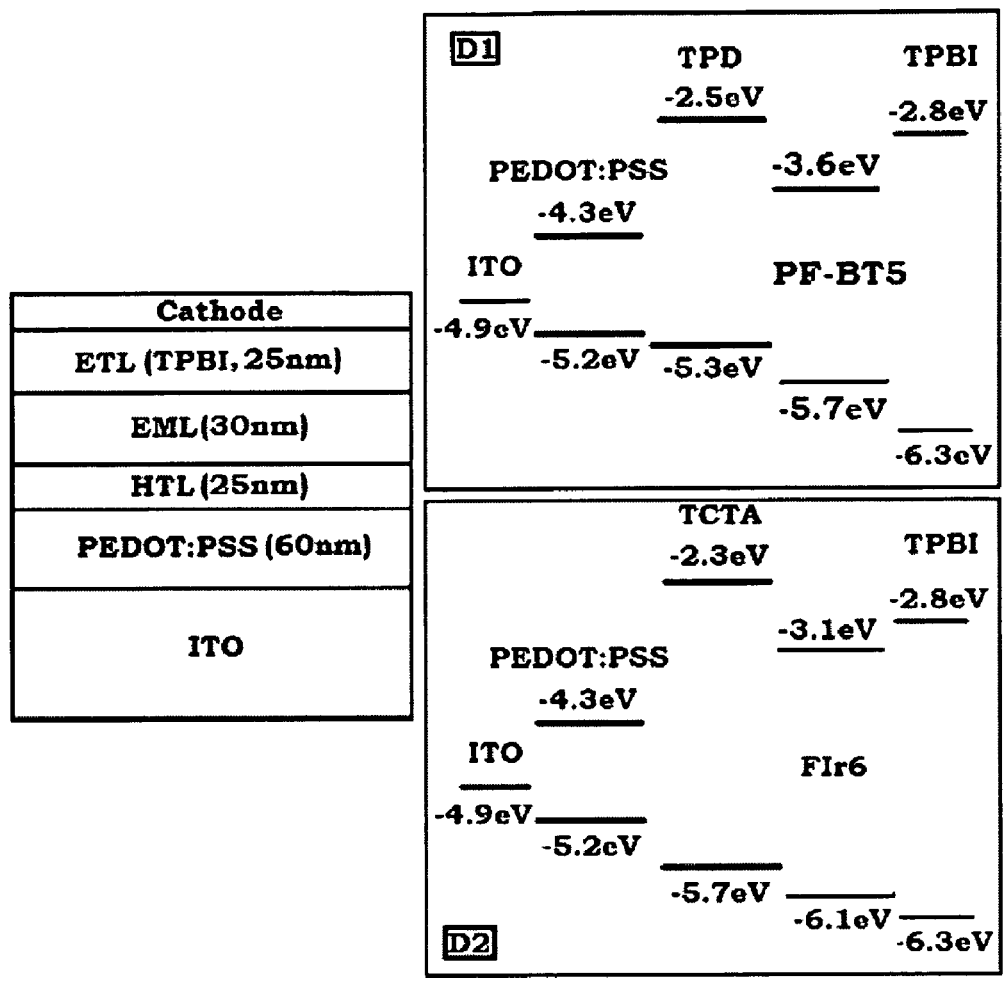
FIG. 39 shows energy level diagrams of two representative LEDs of the invention having an integrated hole injection/transporting layer; (1) ITO/PEDOT:PSS/1-TPD (25 nm)/PF-BT5 (30 nm)/TPBI (25 nm)/CsF/Al and (2) ITO/PEDOT:PSS/TCTA-BVB (25 nm)/10 wt % FIr6 in PVK (30 nm)/TPBI (25 nm)/CsF/Al.

As shown in FIG. 39, the HOMO level of PFBT5, dominated by polyfluorene, lies at −5.7 eV so 1-TPD could provide sufficient hole-injection because the HOMO level of TPD lies around −5.3 eV. In this case, the main benefits of adding this layer would be effective exciton-confinement as well as avoidance of quenching from PEDOT:PSS to EML. While for EML based on FIr6 that has HOMO level at −6.1 eV, TCTA-BVB with HOMO level lies around −5.7 eV is needed to provide the necessary cascade highways for efficient hole-injection/transporting.

The hole-transporting layer and light emitting layer (EML) were formed in argon-filled glovebox all by spin-coating. For both devices, the thickness of the EMLs was controlled at 30 nm, and the nominal thickness of crosslinked hole-transporting layer derived from either 1-TPD or TCTA-BVB is around 25 nm.

For simplicity, the LED with structure ITO/PEDOT:PSS/1-TPD (25 nm)/PF-BT5 (30 nm)/TPBI (25 nm)/CsF/Al is referred to as D1 and the corresponding control device with no the 1-TPD interlayer is referred to as C1. Similarly, the one with structure ITO/PEDOT:PSS/TCTA-BVB (25 nm)/10 wt % FIr6 in PVK (30 nm)/TPBI (25 nm)/CsF/Al is referred to as D2 and control device with no TCTA-BVB interlayer is referred to as C2. Performance test was carried out under ambient circumstance with no encapsulation, within 30 min after moving the LEDs out of the glovebox.

Figures 40A, 40B:
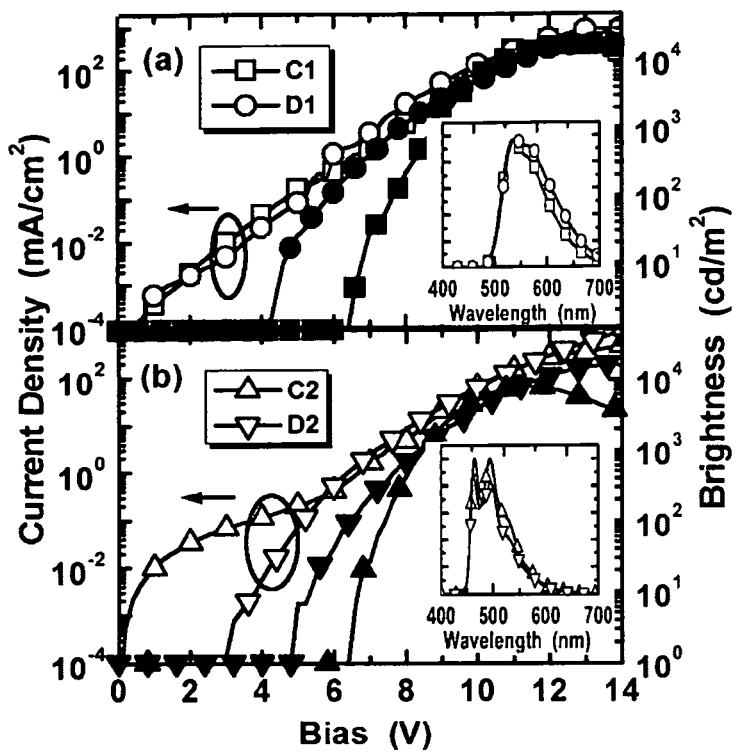
FIG. 40A is the graph comparing current density versus driving-voltage (J-V) and brightness versus driving-voltage (B-V) of LEDs based on PFBT5 with and without 1-TPD interlayer.
FIG. 40B is the graph comparing current-density versus driving-voltage (J-V) characteristics and brightness versus driving-voltage relationships (B-V) of LEDs based on PVK-hosted FIr6 with and without TCTA-BVB interlayer; insets show the normalized EL spectra from these LEDs.
Figures 41A, 41B:
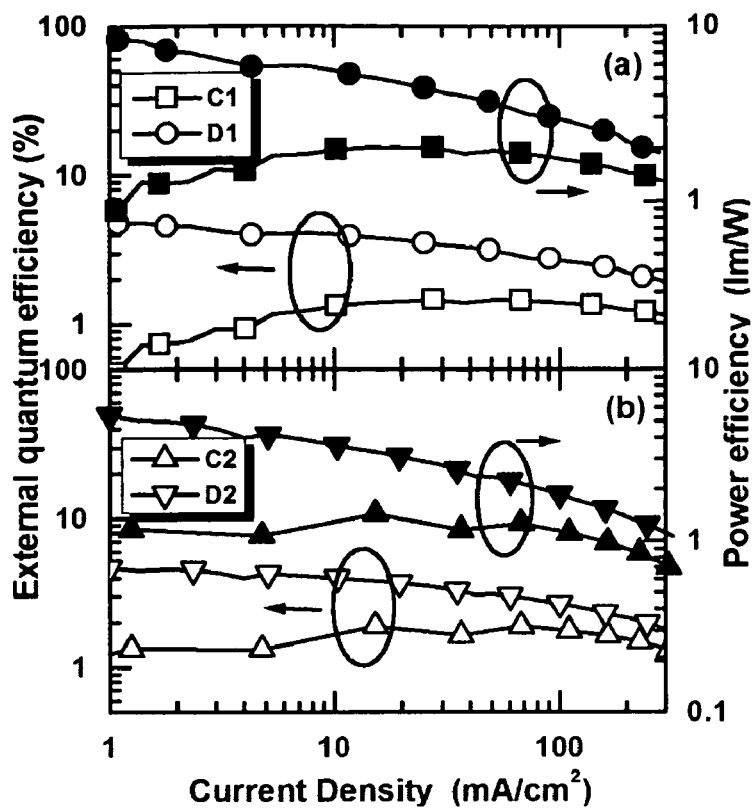
FIG. 41A is the graph comparing external quantum efficiency versus current density (Q-J) and power efficiency versus current density (PE-J) of LEDs based on PFBT5 with and without 1-TPD interlayer.
FIG. 41B is the graph comparing external quantum efficiency versus current density (Q-J) and power efficiency versus current density (PE-J) relationships of LEDs based on PVK-hosted FIr6 with and without TCTA-BVB interlayer.

The current-density versus driving-voltage (J-V) characteristics and brightness versus driving-voltage relationships (B-V) of these LEDs are shown in FIG. 40 with the EL spectra as insets. Benefited from the balanced carrier-injection, the light turn-on voltage ($V_{on}$) of D1 decreased to 4.4 V by adding the 1-TPD layer, in contrast to the 6.6 V of C1 without this interlayer. Similar drop on $V_{on}$ was observed for D2, from the 6.6 V of C2 down to 5.0 V of D2. Correspondingly, both $\eta_{ext}$ and PE presented dramatic enhancements by adding the HTLs, as demonstrated in FIG. 41.

For clarity of comparison, some of the performance data are summarized in Table 5. It is shown that by adding the HTLs, the external quantum efficiencies, both the maximum and those at a brightness of 100 cd/m², could be enhanced about three times. These quantum efficiency enhancements are not yielded at the expense of increased driving voltages as usual. On the contrary, the integration of the conductive PEDOT:PSS layer and the crosslinked HTL with suitably adjusted HOMO levels makes the driving voltage decreased the same time. As a result, the power efficiencies could be enhanced about 4 times the same time.

TABLE 5

Device performance data collection for LEDs based on PF-BT5 with (D1) and without (C1) 1-TPD interlayer as well as LEDs based on PVK-hosted FIr6 with (D2) and without (C2) TCTA-BVB interlayer.

| Device No. | C1 | D1 | C2 | D2 |
|---|---|---|---|---|
| EML | PF-BT5 | | 10% FIr6 in PVK | |
| HTL | no | 1-TPD | no | TCTA-BVB |
| $V_{on}$ | 6.6 | 4.4 | 6.6 | 5.0 |
| Maximums | | | | |
| $\eta_{ext}$ (%) | 1.46 | 5.23 | 1.9 | 5.34 |
| PE (lm/W) | 2.02 | 9.52 | 1.44 | 7.06 |
| LE (cd/A) | 5.2 | 15.8 | 3.09 | 11.3 |

TABLE 5-continued

Device performance data collection for LEDs based
on PF-BT5 with (D1) and without (C1) 1-TPD interlayer
as well as LEDs based on PVK-hosted FIr6 with (D2)
and without (C2) TCTA-BVB interlayer.

| Device No. | C1 | D1 | C2 | D2 |
|---|---|---|---|---|
| at 100 cd/m$^2$ | | | | |
| $\eta_{ext}$ (%) | 0.919 | 4.78 | 1.32 | 4.69 |
| PE (lm/W) | 1.51 | 8.41 | 1.07 | 5.42 |
| LE (cd/A) | 3.28 | 14.4 | 2.15 | 9.93 |

Combining sequential PEDOT:PSS and HTM bilayer between ITO anode and emitting layer as in the present invention has several advantages. Firstly, PEDOT:PSS can smoothen the ITO surface, reduce the electrical shorts and decrease the anode barrier height at the hole-injecting interface. Secondly, insertion of a HTM interlayer between PEDOT:PSS and emissive layer may prevent quenching of radiative excitons at the adjacent PEDOT:PSS interface, provide an electron-blocking effect for improving the charge carriers balance and pave a way for cascade hole-injection and transporting. Therefore, by integrating conductive HIL and crosslinkable HTL together, the present invention achieves low driving voltage, cascade hole-injection, and effective electron-blocking/exciton-confinement in fabricated LEDs. This also translates into devices with high quantum efficiency and power efficiency.

EXAMPLES

Materials. All chemicals are purchased from Aldrich as received unless otherwise specified. Tetrahydrofuran (THF) and ether were distilled under nitrogen from sodium with benzophenone as the indicator. FIr6 and 1,3,5-tris(N-phenyl bezimidazol-2-yl)benzene (TPBI) were synthesized following the literature procedures. Li, J. et al., Polyhedron. 23, 419, 2004; Shi, J. et al., U.S. Pat. No. 5,646,948.

Instruments and Methods. $^1$H and $^{13}$C NMR spectra were measured using a Bruker 300 or 500 FT NMR spectrometer with tetramethylsilane (TMS) as internal reference. High-resolution mass spectrometry (HRMS) was performed by the UW Bio Mass Spectrometry Lab. Elemental analysis was determined at Midwest Microlabs. UV-vis absorption spectra were measured using a Perkin-Elmer Lambda 9 UV/vis/NIR spectrophotometer.

Thermal transitions were measured on TA Instruments differential scanning calorimeter (DSC) 2010 and thermogravimetric analysis (TGA) 2950 under nitrogen atmosphere at a heating rate of 10° C./min. Cyclic voltammetric data were performed on a BAS CV-50W voltammetric analyzer using a conventional three-electrode cell with a thin film spin-coated and cured onto ITO glass as the working electrode. Pt gauze was used as the counter-electrode and Ag/Ag+ was used as the reference electrode with 0.1 M tetrabutylammonium perchlorate (TBAP) in acetonitrile as the electrolyte and ferrocence as the external standard.

Cyclic voltammograms of the TCTA derivatives (0.5 mM) in a 0.1 M electrolyte solution of tetrabutylammonium hexafluorophosphate in dichloroethane were obtained at 100 mV/s sweep rate with platinum working electrode, platinum auxiliary electrode, and Ag$^+$/Ag reference electrode. A Digital Instruments Nanoscope III atomic force microscope installed with etched silicon tips with a typical resonant frequency of 300-350 kHz and an Olympus BX 60 optical microscope were used to probe the film morphology of TCTA derivatives.

Example 1

Synthesis of TCTA Derivatives

In this example, the synthesis of TCTA-TTFV, Bu-TCTA-TTFV, and TCTA-BVB have been described.

Figure 11:
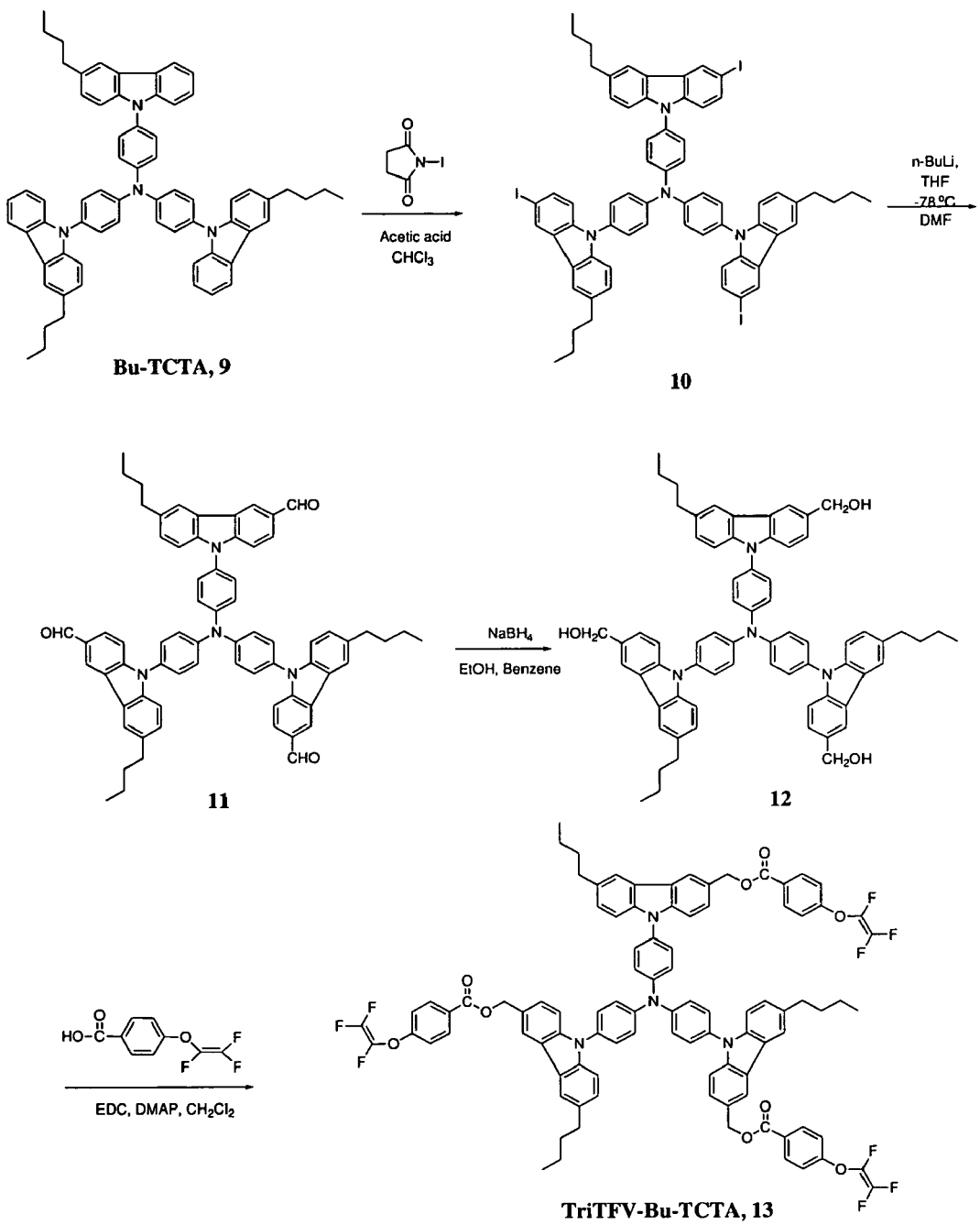
FIG. 11 is a schematic illustration of the preparation of 4,4',4''-tris(N-3-n-butyl-carbazole)triphenylamine-tris(trifluorovinyl) (Bu-TCTA-TTFV), a representative compound of the invention.

The synthesis of TCTA-TTFV is illustrated in FIG. 11. The synthesis of 4,4',4"-tris(N-carbazolyl)triphenyl amine (TCTA) was carried out using a two-step reaction from triphenylamine. First, the triphenylamine was triiodated with N-iodosuccinimide (NIS) in acetic acid. Then, Ullmann reaction between the corresponding amine and carbazole in the presence of copper and potassium carbonate afforded TCTA. Y. Kuwabara, et al. Adv. Mater. 1994, 6, 677; and J. P. Chen, WO 2003/059014.

Direct triformylation of TCTA by POCl$_3$/N'N-dimethylformamide (DMF) under Vilsmeier conditions gave a mono-, di-, tri-formylated TCTA mixture. Alternatively, TCTA was iodinated by three equivalent of NIS; then the formyl groups were introduced into TCTA by the lithiation of TCTA diiodide with n-BuLi, followed by treatment with DMF. The reduction of the resulting TCTA dialdehyde afforded the hydroxy-containing TCTA in quantitative yields. Tris(trifluorovinyl ether)-containing TCTA (TCTA-TTFV) was obtained by reacting TCTA trihydroxide with 4-trifluorovinyloxy-benzoic acid using 1-[3-(dimethylamino)propyl]-3-ethylcarbodiimde hydrochloride (EDC) and 4-(dimethylamino)pyridine (DMAP) as the condensation reagents.

The detailed synthesis of Bu-TCTA is illustrated in FIG. 12. n-Butyl groups were introduced into TCTA to prevent the crystallization during thermal curing. Butyl-substituted TCTA, 4,4',4"-tris(N-3-n-butyl-carbazolyl)triphenylamine (Bu-TCTA) was then synthesized through Ullmann reaction between tris(4-iodophenyl)amine and 3-n-butyl-9H-carbazole, which was obtained by the dehydrogenation of 3-n-butyl-5,6,7,8-9H-carbazole. 3-n-Butyl-5,6,7,8-9H-carbazole was synthesized from cyclohexanone and n-butylphenylhydrazine hydrochloride under acid condition. See A. R. Katrizky, et al. J. Heterocyclic Chem. 1988, 25, 671.

Using similar procedures as described above for TCTA-TTFV, tris(trifluorovinyl ether)-containing Bu-TCTA (Bu-TCTA-TTFV) was prepared as schematically illustrated in FIG. 16.

The synthesis of TCTA-BVB is illustrated in FIG. 17. 4,4',4"-Tris(N-carbazoly)triphenyl amine (TCTA) was iodinated by two equivalent of N-iodosuccinimide (NIS) in acetic acid. Formyl groups were introduced into TCTA by the lithiation of TCTA diiodide with n-BuLi, followed by treatment with DMF. The reduction of the resulting TCTA dialdehyde afforded the hydroxy-containing TCTA. Alternatively, the formyl groups were introduced into TCTA by a Vilsmeier reaction with excess amount of dimethyl formamide (DMF) and phosphorus oxychloride (POCl$_3$). The further reduction of the TCTA dialdehyde afforded dihydroxy-containing TCTA. Etherification of dihydroxy TCTA with 4-vinylbenzyl chloride using sodium hydride as the dehydration reagent yielded bis(vinyl benzyl ether)-containing TCTA (TCTA-BVB).

Tris(4-iodophenyl)amine (1). To a stirred mixture of triphenylamine (7.36 g, 30.0 mmol) and N-iodosuccinimide (NIS, 21.60 g, 96.0 mmol) in chloroform (180 mL) was added acetic acid (120 mL) at room temperature under exclusion of light. The solution was stirred overnight at room temperature.

The reaction mixture was poured into water, washed with sodium thiosulfate, and extracted with methylene chloride. The combined methylene chloride layers were washed with water, dried with $Na_2SO_4$, and concentrated. The crude product was purified over a silica gel column with hexane/methylene chloride (7:1) as eluent to afford a slightly brown solid (16.54 g, 88%). $^1$H NMR (300 MHz, $CDCl_3$): δ 7.56 (d, 6H, J=8.7 Hz), 6.83 (d, 6H, J=9.0 Hz).

4,4',4''-Tris(N-carbazolyl)triphenylamine (TCTA, 2). To a stirred mixture of tris(4-iodophenyl)amine (9.34 g, 15.0 mmol), carbazole (10.03 g, 60.0 mmol), copper powder (750 mg, 11.8 mmol) and potassium carbonate (16.2 g, 117.2 mmol) was added nitrobenzene (40 mL) under nitrogen. The mixture was refluxed for 3 d. The hot solution was filtered and the filtrate was added dropwise into methanol. The precipitate was then filtered and washed with methanol and water successively. It was re-dissolved in benzene and purified through a silica gel column with a gradient solvent of hexane to hexane/toluene (3:2) as eluent to afford a slightly brown solid (7.88 g, 71%). $^1$H NMR (300 MHz, $CDCl_3$): δ 8.17 (d, 6H, J=8.1 Hz), 7.60-7.42 (m, 24H), 7.31 (t, 6H, J=7.5 Hz).

TCTA-3CHO (3). To N',N-dimethylformamide (DMF) (10.97 g, 150 mmol) was added $POCl_3$ (3.78 g, 25 mmol) dropwise at 0° C., the resulting solution was stirred at 0° C. for 2 h, and was added into a solution of TCTA (2) (2.22 g, 3 mmol) in a mixed solvent of methylene chloride and DCE at room temperature. The resulting mixture was refluxed overnight and poured into 150 mL of ice water. NaOAc was added to adjust pH about 7. Aqueous layer was extracted by methylene chloride; organic layers were combined and dried over $Na_2SO_4$. Solvent was removed by rotary evaporator and the crude product was purified through a silica gel flash column with methylene chloride/ethyl acetate (1:1) as eluent to afford 457 mg of 3 as a yellow solid (18%). $^1$H NMR (300 MHz, $CDCl_3$): δ 10.17 (s, 3H), 8.72 (d, 3H, J=1.2 Hz), 8.26 (dd, 3H, J=7.8 Hz, J=1.2 Hz), 8.02 (dd, 3H, J=8.5 Hz, J=1.5 Hz), 7.64-7.54 (m, 21H), 7.46-7.41 (m, 3H).

TCTA-3CH$_2$OH (4). To a solution of 3 (457 mg, 0.55 mmol) in a mixture of 10 mL of THF and 10 mL of ethanol was added $NaBH_4$ (126 mg, 3.30 mmol) at room temperature. The resulting suspension was stirred for 24 hours and solvent was removed by a rotary evaporator. The crude product was purified through a silica gel flash column with ethyl acetate as eluent to afford a yellowish solid (417 mg, 91%). $^1$H NMR (300 MHz, $CDCl_3$): δ 8.18 (d, 6H, J=7.8 Hz), 7.61-7.45 (m, 24H), 7.32 (t, 3H, J=7.8 Hz), 4.92 (s, 6H).

TCTA-TTFV (5). To a stirred solution of 4 (117 mg, 0.14 mmol), 4-trifluorovinyloxy-benzoic acid (107 mg, 0.49 mmol), and 4-(dimethylamino)pyridine (DMAP, 26 mg, 0.20 mmol) in methylene chloride (30 mL) was added 1-[3-(dimethylamino)propyl]-3-ethyl carbodiimide hydrochloride (EDC, 103 mg, 0.54 mmol). The reaction mixture was stirred at room temperature for 20 h. The solvent was evaporated under reduced pressure. The resulting solid was re-dissolved in methylene chloride, washed with water, dried with $Na_2SO_4$, and then concentrated. The crude product was purified by column chromatography using methylene chloride/hexane (8:2) as eluent to afford TCTA-TTFV as a slightly yellowish solid (68 mg, 34%). $^1$H NMR (300 MHz, $CDCl_3$): δ 8.27 (s, 3H), 8.20 (d, 3H, J=7.8 Hz), 7.14 (d, 6H, J=8.5 Hz), 7.61-7.49 (m, 24H), 7.35 (t, 3H, J=7.8 Hz), 7.15 (d, 6H, J=8.1 Hz), 5.59 (s, 6H). Anal. Calcd for $C_{84}H_{51}F_9N_4O_9$: C, 70.49; H, 3.59; N, 3.91. Found: C, 70.65; H, 3.77; N, 3.95.

p-Butylphenylhydrazine (6). Sodium nitrite (11.74 g, 0.17 mol) in water (50 mL) was added over 30 min to an ice-cooled and stirred suspension of 4-n-butylaniline (24.30 g, 0.16 mol) in 6 N hydrochloric acid (190 mL). After an additional 15 min, a suspension of tin chloride dehydrate (108.3 g, 0.4 mol) in 6 N hydrochloric acid (190 mL) was added slowly, and the resulting suspension was stirred at 0° C. for 3 h. The solid was filtered and dissolved in a mixture of 40% potassium hydroxide solution (200 mL) and ethyl acetate (200 mL). The organic layer was separated and the aqueous layer was further extracted with ethyl acetate. The combined organic extracts were washed with 10% hydrochloric acid (120 mL), a solid started to develop in the organic layer. After cooled it to 0° C., the solid was filtered. The organic layer was separated, dried over $Na_2SO_4$, and the solvent was evaporated. The resulting solid was recrystallized from ethanol to afford a white solid (17.35 g, 54%). $^1$H NMR (300 MHz, DMSO-$d_6$): δ 10.18 (s, 3H), 7.10 (d, 2H, J=8.4 Hz), 6.92 (d, 2H, J=8.7 Hz), 2.51 (t, 2H, J=7.5 Hz), 1.50 (pentet, 2H, J=7.5 Hz), 1.27 (sextet, 2H, J=7.8 Hz), 0.88 (t, 3H, J=7.5 Hz).

3-n-Butyl-5,6,7,8-9H-carbazole (7). p-Butylphenylhydrazine (8.31 g, 40 mmol), cyclohexanone (4.32 g, 44 mmol) and acetic acid (16 g) were refluxed for 1 d. The mixture was then cooled to 5° C. The resulting solid was filtered, washed with water, and recrystallized from ethanol to give the title compound (5.64 g, 62%). $^1$H NMR (300 MHz, $CDCl_3$): δ 7.57 (s, 1H), 7.20 (d, 1H, J=8.4 Hz), 6.98 (d, 1H, J=8.1 Hz), 2.73 (t, 6H, J=7.5 Hz), 1.92 (d, 4H, J=5.4 Hz), 1.67 (pentet, 2H, J=7.2 Hz), 1.41 (sextet, 2H, J=7.2 Hz), 0.93 (t, 3H, J=7.5 Hz).

3-n-Butyl-9H-carbazole (8). A mixture of 7 (5.64 g, 24.8 mmol) and 10 wt % Palladium on activated carbon (1.09 g) were heated at 250-260° C. until the evolution of the hydrogen ceased. The mixture was then extracted with THF and the solvent was evaporated. The solid was re-crystallized from ethanol to give 8 as a slightly brown solid (3.85 g, 69%). $^1$H NMR (300 MHz, DMSO-$d_6$): δ 8.03 (d, 1H, J=7.8 Hz), 7.86 (s, 1H), 7.40 (d, 1H, J=8.1 Hz), 7.31 (t, 6H, J=7.5 Hz), 7.17 (dd, J=8.4 Hz, J=1.8 Hz), 7.08 (t, 1H, J=8.1 Hz), 2.69 (t, 2H, J=7.2 Hz), 1.60 (pentet, 2H, J=7.5 Hz), 1.31 (sextet, 2H, J=7.5 Hz), 0.89 (t, 3H, J=7.5 Hz).

Bu-TCTA (9). To a stirred mixture of tris(4-iodophenyl) amine (1.87 g, 3.0 mmol), 3-n-butyl-9H-carbazole (2.68 g, 12.0 mmol), copper powder (86 mg, 1.35 mmol) and potassium carbonate (2.49 g, 18.0 mmol) was added nitrobenzene (10 mL) under nitrogen. The mixture was refluxed for 3 d. The hot solution was filtered and the filtrate was added dropwise into methanol. The precipitate was filtered and washed successively with methanol and water. It was then re-dissolved in benzene and purified through a silica gel column with a gradient solvent, hexane to hexane/benzene (4:1) as eluent to afford a slightly brown solid (943 mg, 34%). $^1$H NMR (300 MHz, $CDCl_3$): δ 8.13 (dd, 3H, J=7.5 Hz, J=0.9 Hz), 7.96 (d, 3H, J=0.9 Hz), 7.58-7.40 (m, 21H), 7.29 (t, 6H, J=6.6 Hz), 2.83 (t, 6H, J=7.8 Hz), 1.73 (pentet, 6H, J=7.8 Hz), 1.43 (sextet, 6H, J=7.5 Hz), 0.97 (t, 9H, J=7.2 Hz).

Bu-TCTA-3I (10). To a stirred mixture of Bu-TCTA (935 mg, 1.03 mmol) and NIS (811 mg, 3.60 mmol) in chloroform (6 mL) was added acetic acid (4 mL) at room temperature under exclusion of light. The solution was stirred overnight at room temperature. The reaction mixture was then poured into water, washed with sodium thiosulfate, and extracted with methylene chloride. The combined methylene chloride layers were washed with water, dried with $Na_2SO_4$, and concentrated. The crude product was purified through a silica gel column with hexane/methylene chloride (6:4) as eluent to afford a slightly brown solid (1.30 g, 98%). $^1$H NMR (300 MHz, $CDCl_3$): δ 8.44 (s, 3H), 7.89 (s, 3H), 7.66-7.50 (m, 21H), 7.29-7.28 (m, 3H) 2.83 (t, 6H, J=7.8 Hz), 1.69 (pentet, 6H, J=7.5 Hz), 1.41 (sextet, 6H, J=7.2 Hz), 0.96 (t, 9H, J=7.8 Hz).

Bu-TCTA-3CH2OH (12). To a solution of 10 (1.38 g, 1.07 mmol) in dry THF (50 mL) was added dropwise n-butyllithium (1.5 mL, 2.5 M in hexane) at −78° C. under a nitrogen atmosphere. The solution was stirred at −78° C. for 2 h followed by the addition of DMF (0.40 mL, 2.1 mmol). The resulting reaction mixture was slowly warmed to room temperature and stirred for two more hours. The reaction was quenched with water and the THF solvent was evaporated under vacuo. The residue was extracted with methylene chloride and the combined organic layers were washed with water, dried with $Na_2SO_4$, and concentrated. The crude compound 11 was reduced by $NaBH_4$ in a mixed solvent of ethanol (10 mL) and benzene (10 mL). The resulting suspension was stirred for 24 hours and solvent was removed by rotary evaporator. The crude product was purified through a silica gel column with methylene chloride/ethyl acetate (9:1) as eluent to afford 12 in 31% yield. $^1$H NMR (300 MHz, $CDCl_3$): δ 8.17 (s, 3H), 7.98 (s, 3H), 7.60-7.44 (m, 21H), 7.29 (dd, 3H, J=8.4 Hz, J=1.5 Hz), 4.90 (s, 6H), 2.84 (t, 6H, J=7.8 Hz), 1.74 (pentet, 6H, J=7.2 Hz), 1.45 (sextet, 6H, J=7.5 Hz), 1.26 (t, 9H, J=6.9 Hz).

Bu-TCTA-TTFV (13). To a solution mixture of 12 (255 mg, 0.26 mmol), 4-trifluorovinyloxy-benzoic acid (184 mg, 0.84 mmol), and DMAP (32 mg, 0.26 mmol) in methylene chloride (10 mL) was added EDC (184 mg, 0.96 mmol). The reaction mixture was stirred at room temperature for 20 h. The solvent was evaporated under reduced pressure. The solid was re-dissolved in methylene chloride, washed with water, dried with $Na_2SO_4$, and then concentrated. The crude product was purified by column chromatography using methylene chloride/hexane (4:1) as eluent to afford Bu-TCTA-TTFV as a slightly yellowish solid (282 mg, 68%). $^1$H NMR (300 MHz, $CDCl_3$): δ 8.25 (s, 3H), 8.14 (d, 6H, J=9.1 Hz), 7.80 (s, 3H), 7.60-7.51 (m, 18H), 7.44 (d, 3H, J=8.4 Hz), 7.33-7.30 (m, 3H), 7.15 (d, 6H, J=8.1 Hz), 5.58 (s, 6H), 2.85 (t, 6H, J=7.2 Hz), 1.74 (pentet, 6H, J=7.2 Hz), 1.46 (sextet, 6H, J=7.8 Hz), 1.01 (t, 9H, J=7.2 Hz). Anal. Calcd for $C_{96}H_{75}F_9N_4O_9$: C, 72.08; H, 4.73; N, 3.50. Found: C, 71.99; H, 4.95; N, 3.43.

TCTA-2I (14). To a stirred mixture of TCTA (1.40 g, 1.89 mmol) and NIS (893 mg, 3.97 mmol) in chloroform (20 mL) was added acetic acid (8 mL) at room temperature under exclusion of light. The solution was stirred overnight at room temperature. The reaction mixture was poured into water, washed with sodium thiosulfate, and extracted with methylene chloride. The combined methylene chloride layers were washed with water, dried with $Na_2SO_4$, and concentrated. The crude product was purified through a silica gel column with hexane/methylene chloride (6:4) as eluent to afford a slightly brown solid (1.36 g, 72%). $^1$H NMR (300 MHz, $CDCl_3$): δ 8.49 (s, 2H, J=1.8 Hz), 8.19 (d, 2H, J=7.8 Hz), 8.12 (d, 2H, J=7.8 Hz), 7.71 (dd, 2H, J=8.7 Hz, J=1.8 Hz), 7.62-7.45 (m, 20H), 7.37-7.31 (m, 6H).

TCTA-2CHO (15). To a solution of 14 (834 mg, 0.84 mmol) in dry THF (30 mL) was added dropwise n-butyllithium (0.74 mL, 2.5 M in hexane) at −78° C. under a nitrogen atmosphere. The solution was stirred at −78° C. for 45 min followed by the addition of DMF (0.16 mL, 2.1 mmol). The resulting reaction mixture was slowly warmed to room temperature and stirred overnight. The reaction was quenched with water and the THF solvent was evaporated under vacuo. The residue was extracted with methylene chloride. The combined organic layers were washed with water, dried with $Na_2SO_4$, and concentrated. The crude product was purified through a silica gel column with a gradient solvent of hexane/methylene chloride (1:1) to methylene chloride as eluent to afford a yellow solid (384 mg, 57%). $^1$H NMR (300 MHz, $CDCl_3$): δ 10.17 (s, 2H), 8.72 (s, 2H), 8.25 (d, 2H, J=7.8 Hz), 8.20 (d, 2H, J=7.8 Hz), 8.02 (dd, 2H, J=8.4 Hz, J=1.2 Hz), 7.67-7.40 (m, 24H), 7.34 (t, 2H, J=6.6 Hz).

TCTA-2CH$_2$OH (16). To a solution of 15 (384 mg, 0.48 mmol) in a mix solvent of benzene (10 mL) and ethanol (10 mL) was added $NaBH_4$ (109 mg, 2.88 mmol) at room temperature. The resulting suspension was stirred for 24 hours and solvent was removed by rotary evaporator. The crude product was purified through a silica gel column with methylene chloride/ethyl acetate (9:1) as eluent to afford a white solid (369 mg, 96%). $^1$H NMR ($CDCl_3$) δ 8.18 (d, 6H, J=7.5 Hz), 7.63-7.45 (m, 24H), 7.34 (t, 4H, J=6.9 Hz), 4.92 (s, 4H).

TCTA-BVB (17). To a solution of 16 (530 mg, 0.69 mmol) was added sodium hydride (53 mg, 2.1 mmol) at room temperature under nitrogen. After stirring for 2.5 h, 4-vinylbenzyl chloride (427 mg, 2.8 mmol) was added, and the mixture was stirred overnight. The suspension was poured into water, and extracted with methylene chloride. The extracts were dried with $Na_2SO_4$, and concentrated. The crude product was purified by column chromatography using hexane/methylene chloride (3:2) as eluent to afford TCTA-BVB as a slightly yellowish solid (371 mg, 52%). $^1$H NMR ($CDCl_3$) δ 8.21 (d, J=6.9 Hz, 6H), 7.64-7.33 (m, 36H), 6.77 (q, 2H, J=10.8 Hz, J=6.9 Hz), 5.80 (d, 2H, J=17.7 Hz), 5.29 (d, 2H, J=10.5 Hz), 4.80 (s, 4H), 4.65 (s, 4H). Anal. Calcd for $C_{74}H_{56}N_4O_2$: C, 86.02; H, 5.46; N, 5.42. Found: C, 85.95; H, 5.54; N, 5.37.

Example 2

Synthesis of TPD and NPD Derivatives

In this example, the syntheses of TPD and NPD derivatives have been described.

N,N'-di-tolyl-N,N'-diphenyl-1,1'-biphenyl-4,4'-diamine (TPD) and N,N'-bis(1-naphthyl)-N,N'-diphenyl-1,1'-biphenyl-4,4'-diamine (α-NPD) contain biphenyl diamine moiety and are widely used as hole-transporting materials due to their high charge carrier mobility. By linking thermally crosslinkable moieties, such as vinyl benzyl, or trifluorovinyl ether, to a TPD or α-NPD core, the present invention provides crosslinkable TPD or α-NPD-based compounds which can undergo in-situ crosslinking reaction and generate solvent-proof networks as hole-transporting layer during spin-coating process.

Figure 8:
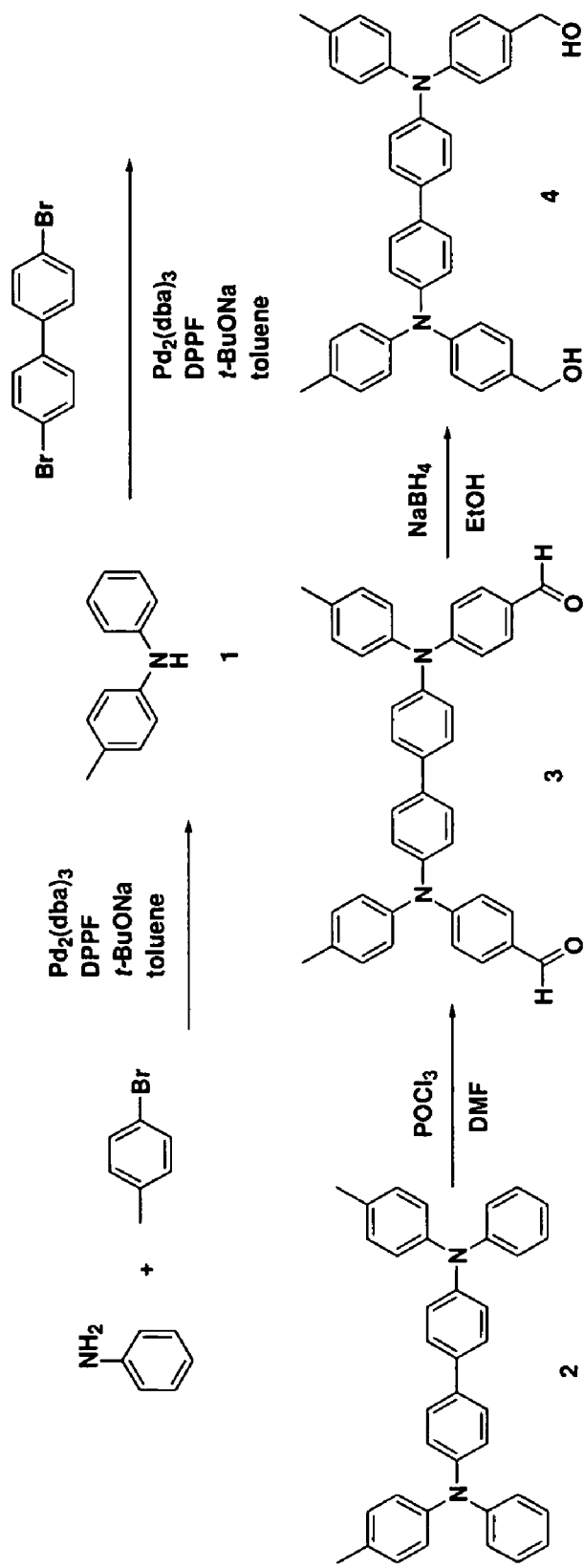
FIG. 8 is a schematic illustration of the preparation of N,N'-diphenyl-N,N'-bis-(3-methylphenyl)-(1,1')-biphenyl-4,4'-diamine (TPD), a compound useful for making crosslinkable compounds of the invention.
Figure 9:
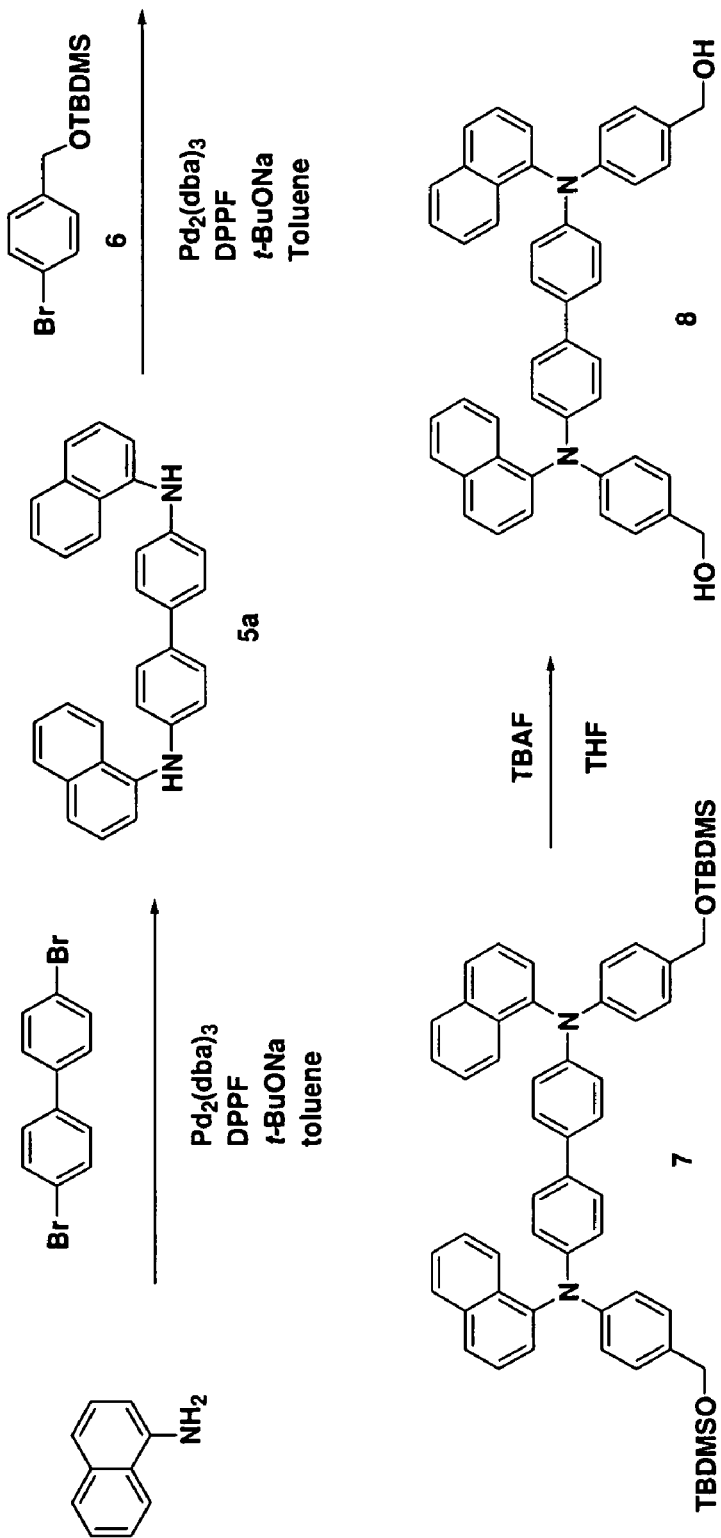
FIG. 9 is a schematic illustration of the preparation of N,N'-diphenyl-N,N'-bis(1-naphthyl)-1,1'-biphenyl-4,4'-diamine (NPD), a compound useful for making crosslinkable compounds of the invention.
Figure 10:
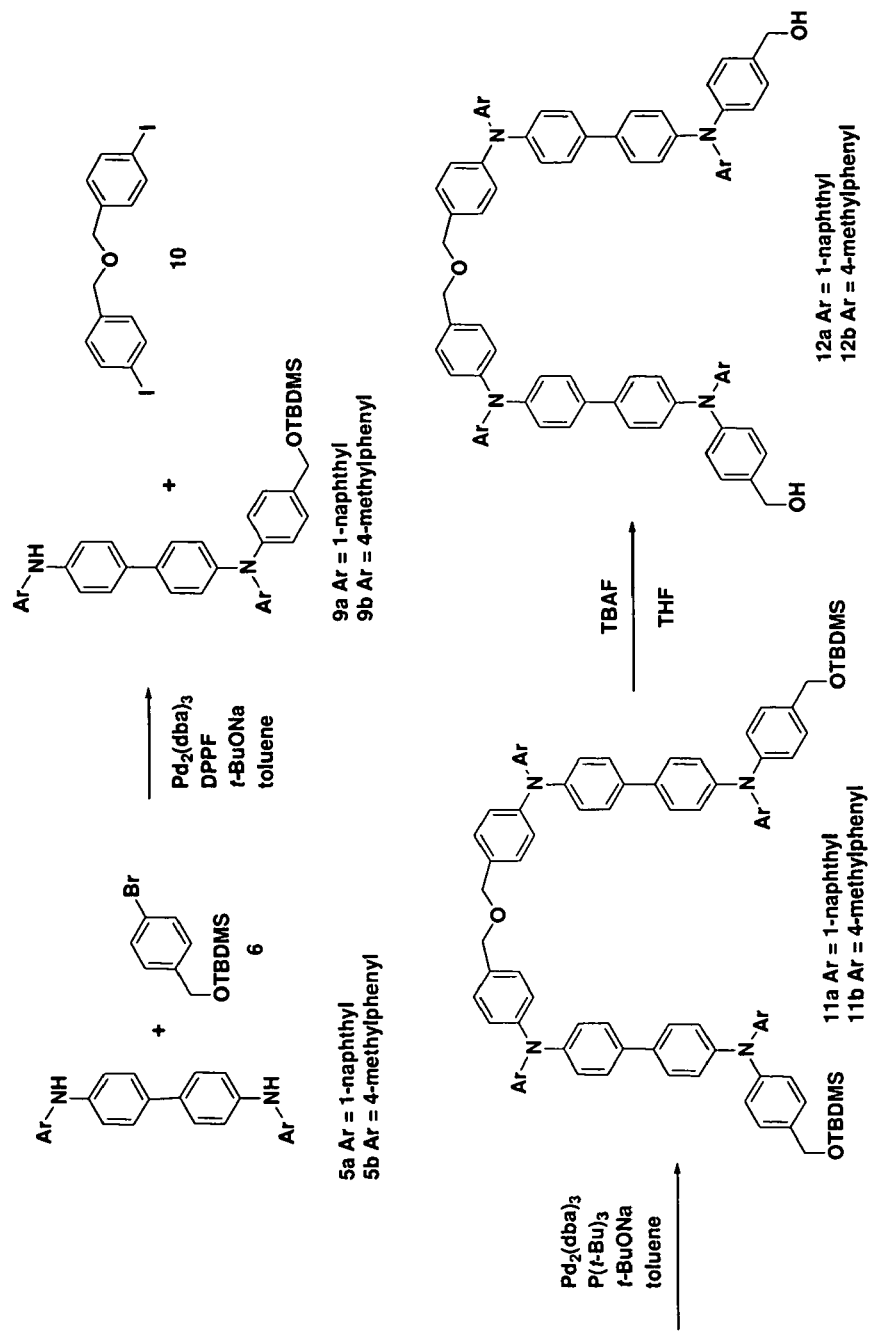
FIG. 10 is a schematic illustration of the preparations of bi-N,N'-diphenyl-N,N'-bis(1-naphthyl)-1,1'-biphenyl-4,4'-diamine (BNPD) and bi-N,N'-diphenyl-N,N'-bis-(3-methylphenyl)-(1,1')-biphenyl-4,4'-diamine compound (BTPD), compounds useful for making crosslinkable compounds of the invention.
Figure 14:
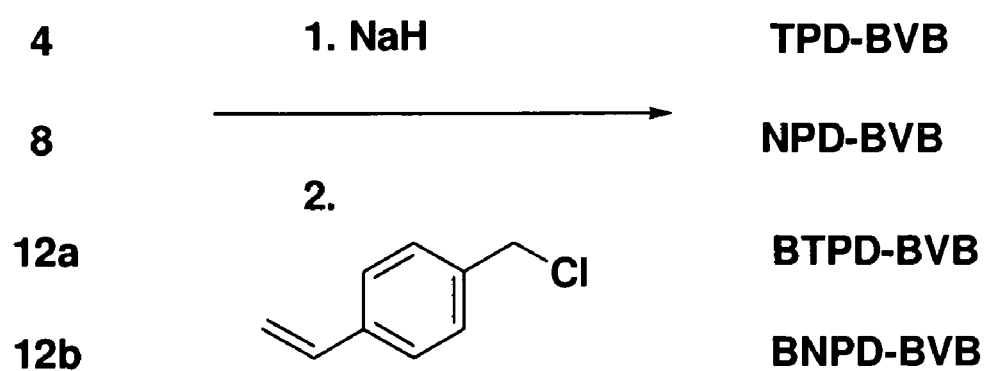
FIG. 14 is a schematic illustration of the preparation of thermally crosslinkable derivatives of TPD, NPD, BTPD, and BNPD derivatives.

The dihydroxy TPD 4 was obtained according to the synthetic scheme in FIG. 8; the dihydroxy NPD 8 was obtained according to the synthetic scheme in FIG. 9; the dihydroxy BNPD 12a and the dihydroxy BTPD 12b were obtained according to the synthetic scheme in FIG. 10. According to FIG. 14, the dihydroxy TPD 4, dihydroxy NPD 8, the dihydroxy BNPD 12a, and the dihydroxy BTPD 12b were then etherified with 4-vinylbenzyl chloride by using NaH as a base to afford the representative compounds, 1-TPD, 1-NPD, 2-TPD, and 2-NPD.

The synthetic details for making TPD are depicted in FIG. 8. In a sequential Hartwig-Buchwald Pd-catalyzed amination, aniline was first coupled with 4-bromotoluene to yield compound 1, which was then allowed to react with 4,4'-dibromobiphenyl to afford 2. Vilsmeier formylation of compound 2 with two equiv of phosphorus oxachloride and DMF yield furnished product 3. Reduction of 3 by sodium borohydride generated TPD-based compound 4.

The synthetic details for making NPD are depicted in FIG. 9. Similarly, Pd-catalyzed coupling of 1-naphthylamine with 4,4'-dibromobiphenyl yield compound 5a, which was then allowed to react with TBDMS protected 4-bromobenzyl alcohol to afford 7. Desilylation of the TBDMS groups in 7 using 1.0 M solution of tetrabutylammoniumfluoride (TBAF) in THF resulted in the formation of NPD-based compound 8.

The synthetic details for making BTPD and BNPD are depicted in FIG. 10. Pd-catalyzed C—N coupling of NPD-based compound 5a and TPD-based compound 5b with one equiv of protected 4-bromobenzyl alcohol 6 generated one-side reacted product 9a and 9b. Then two equiv of secondary amine 9 was coupled with 10 to yield 11, which was deprotected by TBAF to afford connecting dimer BNPD-based compound 12a and BTPD-based compound 12b.

FIG. 9 illustrates the synthesis of representative TPD or α-NPD-based derivatives. Two units of crosslinking group, vinyl benzyl, can be attached to a TPD or α-NPD core to provide a crosslinkable molecule TPD-BVB, or NPD-BVB. It is recognized that the higher the active hole-transporting content, the better the hole-transporting content. To optimize the hole-transporting ability, TPD or α-NPD-based derivatives with higher hole-transporting content, such as BTPD and BNPD-based derivatives, have been synthesized. The representative compounds, BTPD-BVB and BNPD-BV both consist of two connecting diamine molecules with two vinyl benzyl (VB, or styrene) crosslinkers.

Synthesis of compound 3. To a solution of 2 (2.58 g, 5 mmol) and DMF (0.88 mL, 11.4 mmol) in 1,2-dichloroethane (20 mL) was added $POCl_3$ (1.1 mL, 11.8 mmol) by syringe. The mixture was stirred at 90° C. for 13 h. After being cooled down to RT, the solution was poured into NaOAc solution (1 g in 50 mL) and stirred for 30 min. The mixture was extracted with $CH_2Cl_2$ and water. After the removal of organic solvent, the residue was directly purified by column chromatography on silica gel (hexane/ethyl acetate, v/v, 3/1) to obtain product 3 (1.9 g, 66%): $^1$H NMR (500 MHz, $CDCl_3$): δ 2.40 (s, 6H), 7.09 (d, J=8.5 Hz, 2H), 7.14 (d, J=8.5 Hz, 2H), 7.22 (d, J=8.5 Hz, 2H), 7.25 (d, J=8.5 Hz, 2H), 7.55 (d, J=8.5 Hz, 2H), 7.72 (d, J=8.5 Hz, 2H), 9.84 (s, 1H); $^{13}$C NMR (125 MHz, $CDCl_3$): δ 21.0, 119.1, 125.9, 126.6, 127.8, 128.7, 130.4, 131.3, 135.3, 136.4, 143.2, 145.2, 153.2, 190.5; HRMS (ESI) ($M^+$+H, $C_{40}H_{32}N_2O_2$): calcd: 572.2464; found: 572.2458.

Synthesis of compound 4. To a solution of 3 (1.8 g, 3.15 mmol) in EtOH (100 mL) was added $NaBH_4$ (0.95 g, 25.2 mmol). The mixture was refluxed under $N_2$ for 18 h. Water was added to quench the reaction. After the removal of EtOH, the residue was directly purified by column chromatography on silica gel (hexane/ethyl acetate, v/v, 1/1) to obtain product 4 (1.6 g, 88%): $^1$H NMR (500 MHz, $CDCl_3$): δ 2.36 (s, 6H), 4.64 (s, 4H), 7.06 (d, J=8.5 Hz, 2H), 7.09-7.14 (m, 12H), 7.26 (d, J=8.5 Hz, 2H), 7.43 (d, J=9 Hz, 2H); $^{13}$C NMR (125 MHz, $CDCl_3$): δ 20.8, 64.9, 123.4, 123.5, 124.9, 127.1, 128.2, 129.9, 132.9, 134.3, 134.5, 144.3, 146.6, 147.3; HRMS (ESI) ($M^+$+H, $C_{40}H_{36}N_2O_2$): calcd: 576.2777; found: 576.2783.

Synthesis of compound 1-TPD. To a solution of 4 (0.8 g, 1.39 mmol) in dry DMF (10 mL) was added NaH (0.1 g, 4.17 mmol). The mixture was stirred at room temperature for 1 h then cooled to 0° C. 4-vinylbenzyl chloride (0.47 mL, 3.3 mmol) was added to above solution by syringe. The mixture was heated at 60° C. for 24 h. Water was added to quench the reaction. The organic solvent was extracted with $CH_2Cl_2$ and water to remove DMF. After the removal of $CH_2Cl_2$, the residue was directly purified by column chromatography on silica gel (hexane/ethyl acetate, v/v, 8/1) to give a solid 1-TPD (0.6 g, 54%). $^1$H NMR (300 MHz, $CDCl_3$): δ 2.35 (s, 6H), 4.51 (s, 4H), 4.60 (s, 4H), 5.27 (d, J=10.8 Hz, 2H), 5.77 (d, J=17.4 Hz, 2H), 6.75 (dd, $J_1$=10.8 Hz, $J_2$=17.4 Hz, 2H), 7.0-7.2 (m, 16H), 7.2-7.3 (m, 3H), 7.3-7.5 (m, 13H). $^{13}$C NMR (125 MHz, $CDCl_3$): δ 20.8, 71.8, 71.9, 113.8, 123.5, 123.6, 125.0, 126.2, 127.2, 128.0, 129.0, 130.0, 132.0, 132.9, 134.4, 136.6, 137.0, 138.0, 145.0, 146.8, 147.4; HRMS (ESI) ($M^+$+H, $C_{58}H_{52}N_2O_2$): calcd: 808.4029; found: 808.4036.

Synthesis of compound 7. A solution of 5a (2.5 g, 5.73 mmol), 6 (3.8 g, 12.6 mmol), $Pd_2(dba)_3$ (0.19 g, 0.2 mmol), 1,1'-bis(diphenylphosphino)-ferrocene (0.17 g, 0.3 mmol) and t-BuONa (1.8 g, 18.7 mmol) in toluene (100 mL) was stirred at 110° C. for 24 h. The solvent was removed in vacuo and the residue was purified by column chromatography on silica gel (hexane/ethyl acetate, v/v, 9/1) to give a solid 7 (2.3 g, 45%). $^1$H NMR (500 MHz, $CDCl_3$): δ 0.16 (s, 12H), 0.98 (s, 18H), 4.74 (s, 4H), 7.08 (d, J=8 Hz, 4H), 7.10 (d, J=8.5 Hz, 4H), 7.23 (d, J=8.5 Hz, 4H), 7.39 (d, J=7.5 Hz, 4H), 7.42 (d, J=8.5 Hz, 4H), 7.49 (d, J=7.5 Hz, 2H), 7.52 (d, J=7.5 Hz, 2H), 7.82 (d, J=8 Hz, 2H), 7.93 (d, J=8.5 Hz, 2H), 8.01 (d, J=8.5 Hz, 2H); $^{13}$C NMR (125 MHz, $CDCl_3$): δ 18.4, 16.0, 64.8, 121.6, 122.0, 124.3, 126.1, 126.31, 126.34, 127.0, 127.09, 127.10, 128.3, 131.2, 133.6, 134.8, 135.3, 143.5, 147.2, 147.4; HRMS (ESI) ($M^+$+H, $C_{58}H_{64}N_2O_2Si_2$): calcd: 876.4506; found: 876.4514.

Synthesis of compound 8. To a solution of 7 (2.4 g, 2.73 mmol) in THF (20 mL) was added 1 M solution of TBAF in THF (6 mL, 6 mmol). The mixture was stirred at room temperature for 2 h. After the removal of THF, the residue was purified by column chromatography on silica gel (hexane/ethyl acetate, v/v, 1/1 then 3/1) to give product 8 (1.6 g, 90%). $^1$H NMR (500 MHz, $CDCl_3$): δ 4.61 (s, 4H), 7.09 (d, J=8.5 Hz, 8H), 7.23 (d, J=8.5 Hz, 4H), 7.34-7.44 (m, 8H), 7.46-7.55 (m, 4H), 7.81 (d, J=8.5 Hz, 2H), 7.93 (d, J=8.5 Hz, 2H), 7.99 (d, J=8.5 Hz, 2H); $^{13}$C NMR (125 MHz, $CDCl_3$): δ 64.9, 121.8, 121.9, 124.1, 126.1, 126.3, 126.4, 126.5, 127.06, 127.11, 128.2, 128.4, 131.1, 133.8, 134.0, 135.2, 143.3, 147.1, 147.8; HRMS (ESI) ($M^+$+H, $C_{46}H_{36}N_2O_2$): calcd: 648.2777; found: 648.2778.

Synthesis of compound 1-NPD. To a solution of 8 (0.75 g, 1.16 mmol) in dry DMF (8 mL) was added NaH (83.5 mg, 3.48 mmol). The mixture was stirred at room temperature for 1 h then cooled to 0° C. 4-vinylbenzyl chloride (0.4 mL, 2.78 mmol) was added to above solution by syringe. The mixture was heated at 60° C. for 24 h. Water was added to quench the reaction. The organic solvent was extracted with $CH_2Cl_2$ and water to remove DMF. After the removal of $CH_2Cl_2$, the residue was directly purified by column chromatography on silica gel (hexane/ethyl acetate, v/v, 6/1) to give a solid 1-NPD (0.61 g, 60%). $^1$H NMR (500 MHz, $CDCl_3$): δ 4.53 (s, 4H), 4.63 (s, 4H), 5.31 (d, J=10 Hz, 2H), 5.82 (d, J=17.5 Hz, 2H), 6.79 (dd, $J_1$=10 Hz, $J_2$=17.5 Hz, 2H), 7.13 (s, br, 8H), 7.27 (d, J=6 Hz, 4H), 7.35-7.65 (m, 20H), 7.84 (d, J=6.5 Hz, 2H), 7.95 (d, J=6.5 Hz, 2H), 8.03 (d, J=7 Hz, 2H); $^{13}$C NMR (125 MHz, $CDCl_3$): δ 71.8, 113.7, 121.7, 121.9, 124.2, 126.1, 126.2, 126.3, 126.4, 126.5, 127.0, 127.2, 127.9, 128.3, 129.0, 131.1, 131.3, 133.8, 135.2, 136.5, 136.9, 137.9, 143.3, 147.1, 147.8; HRMS (ESI) ($M^+$+H, $C_{64}H_{52}N_2O_2$): calcd: 880.4029; found: 880.4035.

Synthesis of compound 9b. A solution of 5b (2.9 g, 7.95 mmol), 6 (2.4 g, 7.95 mmol), $Pd_2(dba)_3$ (0.12 g, 0.13 mmol), 1,1'-bis(diphenylphosphino)-ferrocene (0.14 g, 0.25 mmol) and t-BuONa (1 g, 10.4 mmol) in toluene (100 mL) was stirred at 110° C. for 24 h. The solvent was removed in vacuo and the residue was purified by column chromatography on silica gel (hexane/ethyl acetate, v/v, 6/1) to give a solid 9b (1.86 g, 40%). $^1$H NMR (500 MHz, $CDCl_3$): δ 0.22 (s, 6H), 1.06 (s, 9H), 2.41 (s, 6H), 4.80 (s, 2H), 7.05-7.25 (m, 14H), 7.31 (d, J=8 Hz, 2H), 7.51 (d, J=5.5 Hz, 2H), 7.54 (d, J=8 Hz, 2H); $^{13}$C NMR (125 MHz, $CDCl_3$): δ −5.0, 18.4, 20.8, 26.0, 64.8, 117.1, 118.9, 123.0, 123.5, 123.8, 124.7, 126.9, 127.1, 129.9, 132.5, 135.4, 145.2, 146.8; HRMS (ESI) ($M^+$+H, $C_{39}H_{44}N_2OSi$): calcd: 584.3223; found: 584.3229.

Synthesis of compound 1b. Pd$_2$(dba)$_3$ (45.8 mg, 0.05 mmol) and tri-tert-butylphosphane (61 mg, 0.3 mmol) were dissolved under N$_2$ in dry toluene (15 mL). After being stirred for 10 min at room temperature, 9b (1.3 g, 2.2 mmol), 10 (0.5 g, 1.1 mmol), and t-BuONa (0.25 g, 2.6 mmol) were added to the solution. The solution was degassed and with N$_2$ for 5 min then was heated at 100° C. for 16 h. After being cooled to room temperature, the solvent was removed in vacuo and the residue was purified by column chromatography on silica gel (hexane/ethyl acetate, v/v, 8/1) to give a solid 11b (0.9 g, 60%). $^1$H NMR (500 MHz, CDCl$_3$): δ 0.17 (s, 12H), 1.01 (s, 18H), 2.38 (s, 12H), 4.57 (s, 4H), 4.76 (s, 4H), 7.08 (d, J=3.5 Hz, 4H), 7.10 (d, J=3.5 Hz, 4H), 7.11-7.18 (m, 24H), 7.26 (d, J=8 Hz, 4H), 7.30 (d, J=8.5 Hz, 4H), 7.46 (d, J=3.5 Hz, 4H), 7.47 (d, J=3.5 Hz, 4H); $^{13}$C NMR (125 MHz, CDCl$_3$): δ −5.2, 18.4, 20.8, 26.0, 64.8, 72.0, 123.3, 123.5, 123.6, 123.9, 124.8, 125.0, 127.13, 127.14, 129.0, 129.89, 129.94, 132.2, 132.7, 132.9, 134.2, 134.5, 135.6, 145.1, 145.2, 146.71, 146.72, 147.0, 147.4; HRMS (ESI) (M$^+$+H, C$_{93}$H$_{99}$N$_3$O$_2$Si$_2$): calcd: 1361.7225; found: 1361.7228.

Synthesis of compound 12b. To a solution of 11b (0.85 g, 0.63 mmol) in THF (10 mL) was added 1 M solution of TBAF in THF (1.4 mL, 1.4 mmol). The mixture was stirred at room temperature for 10 h. After the removal of THF, the residue was purified by column chromatography on silica gel (hexane/ethyl acetate, v/v, 1/1) to give product 12b (0.6 g, 84%). $^1$H NMR (500 MHz, CDCl$_3$): δ 2.37 (s, 12H), 4.57 (s, 4H), 4.66 (s, 4H), 7.06-7.11 (m, 8H), 7.11-7.19 (m, 24H), 7.28 (d, J=7 Hz, 4H), 7.30 (d, J=7.5 Hz, 4H), 7.46 (d, J=8 Hz, 8H); $^{13}$C NMR (125 MHz, CDCl$_3$): δ 20.8, 25.6, 65.0, 71.4, 123.5, 123.5, 123.55, 123.60, 125.0, 127.15, 127.17, 128.2, 129.0, 129.9, 130.0, 132.1, 132.88, 132.93, 134.3, 134.5, 134.7, 144.97, 144.99, 146.7, 146.8, 147.4, 147.5; HRMS (ESI) (M$^+$+H, C$_{81}$H$_{71}$N$_3$O$_3$): calcd: 1133.5495; found: 1133.5483.

Synthesis of compound 2-TPD. To a solution of 12b (0.4 g, 0.35 mmol) in dry DMF (5 mL) was added NaH (25.2 mg, 1.05 mmol). The mixture was stirred at room temperature for 1 h then cooled to 0° C. 4-vinylbenzyl chloride (0.12 mL, 0.84 mmol) was added to above solution by syringe. The mixture was heated at 60° C. for 24 h. Water was added to quench the reaction. The organic solvent was extracted with CH$_2$Cl$_2$ and water to remove DMF. After the removal of CH$_2$Cl$_2$, the residue was directly purified by column chromatography on silica gel (hexane/ethyl acetate, v/v, 5/1) to give a solid 2-TPD (0.34 g, 71%). $^1$H NMR (500 MHz, CDCl$_3$): δ 2.37 (s, 12H), 4.57 (s, 4H), 4.53 (s, 4H), 4.57 (s, 4H), 4.62 (s, 4H), 5.29 (d, J=11 Hz, 2H), 5.80 (d, J=17.5 Hz, 4H), 6.77 (dd, J$_1$=11 Hz, J$_2$=17.5 Hz, 2H), 7.09 (d, J=8 Hz, 8H), 7.11-7.20 (m, 24H), 7.26 (d, J=8.5 Hz, 4H), 7.30 (d, J=7.5 Hz, 4H), 7.47 (d, J=7.5 Hz, 12H); $^{13}$C NMR (125 MHz, CDCl$_3$): δ 20.8, 71.8, 71.9, 72.0, 113.8, 123.49, 123.52, 123.57, 123.59, 125.0, 126.2, 127.2, 128.0, 129.01, 129.04, 129.9, 132.0, 132.2, 132.9, 134.41, 134.44, 136.5, 137.0, 138.0, 145.0, 146.75, 146.77, 147.41, 147.44; HRMS (ESI) (M$^+$+H, C$_{99}$H$_{87}$N$_3$O$_3$): calcd: 1365.6747; found: 1365. 6757.

Synthesis of compound 9a. A solution of 5a (2 g, 4.58 mmol), 6 (1.38 g, 4.58 mmol), Pd$_2$(dba)$_3$ (68 mg, 0.074 mmol), 1,1'-bis(diphenylphosphino)-ferrocene (83 mg, 0.15 mmol) and t-BuONa (0.6 g, 6.2 mmol) in toluene (50 mL) was stirred at 110° C. for 24 h. The solvent was removed in vacuo and the residue was purified by column chromatography on silica gel (hexane/ethyl acetate, v/v, 6/1) to give a solid 9a 1.35 g, 45%). $^1$H NMR (500 MHz, CDCl$_3$): δ 0.16 (s, 6H), 1.00 (s, 9H), 4.73 (s, 2H), 6.02 (s, 1H), 7.03-7.19 (m, 6H), 7.23 (d, J=8 Hz, 2H), 7.37-7.59 (m, 12H), 7.62 (d, J=5.5 Hz, 1H), 7.82 (d, J=8 Hz, 1H), 7.92 (d, J=8.5 Hz, 1H), 7.94 (d, J=8.5 Hz, 1H), 8.03 (d, J=8 Hz, 1H), 8.08 (d, J=8 Hz, 1H); $^{13}$C NMR (125 MHz, CDCl$_3$): δ −5.1, 18.4, 26.0, 64.8, 115.9, 117.7, 121.7, 121.8, 122.0, 124.4, 125.7, 126.0, 126.1, 126.3, 126.4, 127.0, 127.1, 127.4, 127.7, 128.4, 128.5, 131.3, 133.0, 133.9, 134.7, 134.8, 135.3, 138.7, 143.6, 147.3, 147.3; HRMS (ESI) (M$^+$+H, C$_{45}$H$_{44}$N$_2$OSi): calcd: 656.3233; found: 656.3221.

Synthesis of compound 11a. Pd$_2$(dba)$_3$ (23 mg, 0.025 mmol) and tri-tert-butylphosphane (30 mg, 0.15 mmol) were dissolved under N$_2$ in dry toluene (10 mL). After being stirred for 10 min at room temperature, 9a (0.6 g, 0.9 mmol), 10 (0.2 g, 0.45 mmol), and t-BuONa (0.1 g, 1.04 mmol) were added to the solution. The solution was degassed and with N$_2$ for 5 min then was heated at 100° C. for 16 h. After being cooled to room temperature, the solvent was removed in vacuo and the residue was purified by column chromatography on silica gel (hexane/ethyl acetate, v/v, 6/1) to give a solid 11a (0.4 g, 59%). $^1$H NMR (500 MHz, CDCl$_3$): δ 0.17 (s, 12H), 1.01 (s, 18H), 4.53 (s, 4H), 4.75 (s, 4H), 7.04-7.14 (m, 16H), 7.24 (d, J=8 Hz, 4H), 7.25 (d, J=8 Hz, 4H), 7.35-7.46 (m, 16H), 7.46-7.56 (m, 8H), 7.82 (d, J=8.5 Hz, 4H), 7.94 (d, J=6 Hz, 4H), 8.00 (d, J=8 Hz, 2H), 8.02 (d, J=8 Hz, 2H); $^{13}$C NMR (125 MHz, CDCl$_3$): δ −5.2, 18.4, 26.0, 64.8, 71.9, 121.6, 121.7, 121.9, 122.0, 124.25, 124.33, 126.08, 126.11, 126.3, 126.35, 126.38, 126.5, 127.0, 127.1, 127.2, 128.3, 129.0, 131.2, 131.5, 133.5, 133.9, 134.9, 135.2, 143.4, 143.5, 147.1, 147.2, 147.4, 147.8; HRMS (ESI) (M$^+$+H, C$_{104}$H$_{98}$N$_4$O$_3$Si$_2$): calcd: 1506.7177; found: 1506.7167.b Synthesis of compound 12a. To a solution of 11a (0.4 g, 0.27 mmol) in THF (10 mL) was added 1 M solution of TBAF in THF (0.58 mL, 0.58 mmol). The mixture was stirred at room temperature for 3 h. After the removal of THF, the residue was purified by column chromatography on silica gel (hexane/ethyl acetate, v/v, 1/1) to give product 12a (0.27 g, 80%). $^1$H NMR (500 MHz, CDCl$_3$): δ 4.50 (s, 4H), 4.64 (s, 4H), 7.03-7.18 (m, 16H), 7.22 (d, J=6.5 Hz, 4H), 7.24 (d, J=6.4 Hz, 4H), 7.35-7.45 (m, 16H), 7.45-7.6 (m, 8H), 7.80 (d, J=6.5 Hz, 2H), 7.81 (d, J=7 Hz, 2H), 7.91 (d, J=7 Hz, 2H), 7.92 (d, J=6.5 Hz, 2H), 7.95-8.2 (m, 4H); $^{13}$C NMR (125 MHz, CDCl$_3$): δ 65.0, 71.9, 121.7, 121.8, 121.9, 122.0, 124.16, 124.21, 126.10, 126.13, 126.3, 126.38, 126.41, 126.47, 126.51, 127.05, 127.08, 127.14, 127.15, 128.2, 128.35, 128.38, 129.0, 131.12, 131.13, 131.5, 133.7, 133.95, 133.98, 135.22, 135.24, 143.28, 143.30, 147.1, 147.2, 147.8, 147.9; HRMS (ESI) (M$^+$+H, C$_{92}$H$_{70}$N$_4$O$_3$): calcd: 1278.5448; found: 1278.5461.

Synthesis of compound 2-NPD. To a solution of 12a (0.22 g, 0.17 mmol) in dry DMF (8 mL) was added NaH (12.5 mg, 0.52 mmol). The mixture was stirred at room temperature for 1 h then cooled to 0° C. 4-vinylbenzyl chloride (0.07 mL, 0.52 mmol) was added to above solution by syringe. The mixture was heated at 60° C. for 24 h. Water was added to quench the reaction. The organic solvent was extracted with CH$_2$Cl$_2$ and water to remove DMF. After the removal of CH$_2$Cl$_2$, the residue was directly purified by column chromatography on silica gel (hexane/CH$_2$Cl$_2$, V/V, 1/4) to give a solid 2-NPD (0.1 g, 39%). $^1$H NMR (500 MHz, CDCl$_3$): δ 4.50 (s, 4H), 4.51 (s, 4H), 4.60 (s, 4H), 5.28 (d, J=11 Hz, 2H), 5.79 (d, J=17.5 Hz, 2H), 6.76 (d, J$_1$=11 Hz, J$_2$=17.5 Hz, 2H), 7.03-7.14 (m, 16H), 7.23 (d, J=8 Hz, 4H), 7.24 (d, J=8 Hz, 4H), 7.35-7.46 (m, 24H), 7.46-7.56 (m, 8H), 7.805 (d, J=8 Hz, 2H), 7.813 (d, J=8 Hz, 2H), 7.91 (d, J=8 Hz, 2H), 7.92 (d, J=8 Hz, 2H), 7.97 (d, J=8 Hz, 2H), 7.98 (d, J=8 Hz, 2H); $^{13}$C NMR (125 MHz, CDCl$_3$): δ 71.81, 71.84, 71.9, 113.7, 121.71, 121.7, 121.89, 121.94, 124.2, 126.2, 126.3, 126.4, 126.5, 127.1, 127.2, 128.0, 128.4, 129.01, 129.03, 130.0, 131.2, 131.3, 131.5, 133.8, 133.9, 135.3, 136.5, 136.9, 138.0, 143.4, 147.2, 147.2, 147.8, 147.9; HRMS (ESI) (M$^+$+H, C$_{110}$H$_{86}$N$_4$O$_3$): calcd: 1510.6700; found: 1510.6734.

Example 3

Representative PLED Devices with Hole-Transporting Bilayers

In this example, representative PLED devices with a hole-transporting bilayer were constructed. In the hole-transporting bilayer, the first layer includes crosslinked polystyrene-N,N'-diphenyl-N,N'-bis-(3-methylphenyl)-(1,1')-biphenyl-4,4'-diamine-trifluoro vinyl ether (PS-TPD-TFV), and the second layer contains either crosslinked TCTA-TTFV or crosslinked Bu-TCTA-TTFV.

The PLEDs were fabricated on pre-cleaned and $O_2$ plasma-treated ITO covered glass substrates. After the plasma treatment, the substrates were moved into a glove box and all the subsequent film-forming processes were performed in it under argon-protection. For the LED with double-HTLs, the first HTL was formed by spin-coating the PS-TPD-TFV solution onto ITO and then thermally crosslinking it on a hotplate at 235° C. for 40 min. A robust uniform film with good solvent-resistance can thus be formed and we refer this crosslinked hole-transport network as PS-TPD-PFCB. On top of this layer, the second HTL was formed via spin-coating, either from the TCTA-TTFV or Bu-TCTA-TTFV and then thermally crosslinked them at 225° C. for 40 min, or from TCTA-BVB solution and crosslinked at 180° C. for 30 min. A 40 nm-thick EML was then spin-coated on top of the HTL(s). In a vacuum below $1\times10^{-6}$ torr, a layer of TPBI with thickness of 25 nm was sublimed. Cesium fluoride (CsF) with thickness of 1 nm and Al of 200 nm were evaporated subsequently as cathode.

The performance test was carried out at room temperature in air without encapsulation. Current density-voltage (J-V) characteristics were measured on a Hewlett-Packard 4155B semiconductor parameter analyzer. The PL and EL spectra were recorded by a spectrometer (Instaspec IV, Oriel Co.). The light power of the EL emission was measured using a calibrated Si-photodiode and a Newport 2835-C multifunctional optical meter. Photometric units ($cd/m^2$) were calculated using the forward output power together with the EL spectra of the devices under assumption of the emission's Lambertian space distribution.

Example 4

Representative Device with the Integrated Hole-Injection and Hole-Transporting Bilayers In this example, representative PLED devices with an integrated hole-injection and hole-transporting layer was constructed by spin coating and crosslinking TCTA-VB on top of the pre-dried PEDOT:PSS layer. The PEDOT:PSS layer is the hole-injection layer. The crosslinked TCTA-VB molecules form the hole-transporting layer.

Device fabrication. The HTL layer was formed by spin-coating solutions of TCTA-BVB in 1,2-dichloroethane on top of the pre-dried (125° C. for 10 min) PEDOT:PSS layer. After fully crosslinked at 180° C. for 30 min, the electroluminescent (EL) layer with thickness around 30 nm was spin-coated on top of the HIL/HTL bilayer. In a vacuum below $1\times10^{-6}$ torr, the ETL composed of 1,3,5-tris(N-phenylbenzimidazol-2-yl)benzene (TPBI, about 25 nm) was sublimed. Cesium fluoride with thickness of 1 nm and aluminum of 200 nm were evaporated subsequently as cathode.

Performance measurement. The device testing was carried out in air at room temperature. EL spectra were recorded by the Oriel Instaspec IV spectrometer with CCD detector. Current-voltage (I-V) characteristics were measured on a Hewlett-Packard 4155B semiconductor parameter analyzer. The power of the EL emission in the normal direction of the ITO side was measured using a calibrated Si-photodiode and a Newport 2835-C multifunctional optical meter. Relationship of forward brightness and efficiencies were calculated from the forward output power together with the EL spectra of the devices under assumption of the emission's Lambertian space distribution.[35] Forward emission LE and PE thereafter were recalibrated with the directly measured brightness-current density relationship by a PR-650 Spectra Colorimeter (Photo Research Co.). The CIE coordinates were measured with the PR-650 the same time.

AFM and XPS characterizations. For reliable comparison, one piece of PEDOT:PSS on ITO was sliced into four and the TCTA-VB layer with different thickness was then formed on them via spin-coating and thermally annealing respectively. Tapping-mode measurements in air were made using a Nanoscope III AFM (Digital Instruments). XPS measurements were made at the standard analysis angle (350) using a X-Probe (Surface Sciences Instruments) with Al K-α source in a vacuum chamber with pressures of about $5\times10^{-9}$ Torr.

While illustrative embodiments have been illustrated and described, it will be appreciated that various changes can be made therein without departing from the spirit and scope of the invention.

The embodiments of the invention in which an exclusive property or privilege is claimed are defined as follows:

1. A compound selected from the group consisting of:
   (a) tris(4-carbazole)triphenylamine-tri(trifluorovinyl ether),
   (b) tris(4-(3-n-butyl-carbazole))triphenylamine-tri(trifluorovinyl ether),
   (c) tris(4-carbazole)triphenylamine-bi(vinyl benzyl ether),
   (d) N,N-diphenyl-N,N-bis-(3-methylphenyl)-(1,1')-biphenyl-4,4'-diamine-bis(vinyl benzyl ether),
   (e) bis-N,N-diphenyl-N,N-bis-(3-methylphenyl)-(1,1')-biphenyl-4,4'-diamine-bi(vinyl benzyl ether),
   (f) N,N'-diphenyl-N,N'-bis(1-naphthyl)-1,1'-biphenyl-4,4'-diamine-bis(vinyl benzyl ether), and
   (g) bis-N,N'-diphenyl-N,N'-bis(1-naphthyl)-1,1'-biphenyl-4,4'-diamine-bis(vinyl benzyl ether).

2. A compound having the formula:

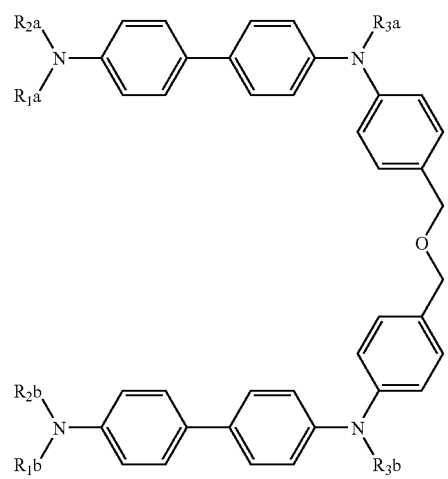

wherein
$R_{1a}$ is $Ar_{1a}$ or $Ar_{1a}\text{-}(L_{1a})_n\text{-}L$;
$R_{1b}$ is $Ar_{1b}$ or $Ar_{1b}\text{-}(L_{1b})_n\text{-}L$;
$R_{2a}$ is $Ar_{2a}$ or $Ar_{2a}\text{-}(L_{2a})_o\text{-}L$;
$R_{2b}$ is $Ar_{2b}$ or $Ar_{2b}\text{-}(L_{2b})_o\text{-}L$;
$R_{3a}$ is $Ar_{3a}$ or $Ar_{3a}\text{-}(L_{3a})_p\text{-}L$;
$R_{3b}$ is $Ar_{3b}$ or $Ar_{3b}\text{-}(L_{3b})_p\text{-}L$;
$Ar_{1a}$, $Ar_{1b}$, $Ar_{2a}$, $Ar_{2b}$, $Ar_{3a}$, and $Ar_{3b}$ are independently selected from unsubstituted and substituted aryl groups;

$L_{1a}$, $L_{1b}$, $L_{2a}$, $L_{2b}$, $L_{3a}$, and $L_{3b}$ are linker moieties that covalently couple L to $Ar_{1a}$, $Ar_{1b}$, $Ar_{2a}$, $Ar_{2b}$, $Ar_{3a}$, and $Ar_{3b}$, respectively;

n, o, and p are independently selected from 0 or 1;

L is a crosslinkable moiety, and wherein the compound has two or more L groups.

3. The compound of claim 2, wherein $Ar_{1a}$, $Ar_{1b}$, $Ar_{2a}$, $Ar_{2b}$, $Ar_{3a}$, and $Ar_{3b}$ are selected from the group consisting of substituted or unsubstituted phenyl, substituted or unsubstituted naphthyl, and substituted or unsubstituted 4-carbazole phenyl.

4. The compound of claim 2, wherein the crosslinkable moiety is selected from the group consisting of trifluorovinyl ether and vinyl benzyl ether.

5. A hole-transporting layer, comprising a crosslinked hole-transporting material derived from a compound of claim 2.

6. A hole-transporting bilayer structure, comprising:
(a) a first layer comprising a crosslinked hole-transporting material and having a first solid state ionization potential;
(b) a second layer comprising a crosslinked hole-transporting material and having a second solid state ionization potential,
wherein the first solid state ionization potential is less than the second solid state ionization potential, and
wherein at least one of the first or second layers comprises a crosslinked hole-transporting material derived from a compound of claim 2.

7. The structure of claim 6, wherein the difference between the second solid state ionization potential and the first solid state ionization potential is from about 0.2 eV to about 0.4 eV.

8. The structure of claim 6, wherein the first layer comprises N,N-diphenyl-N,N-bis-(3-methylphenyl)-(1,1')-biphenyl-4,4'-diamine moieties or N,N'-diphenyl-N,N'-bis(1-naphthyl)-1,1'-biphenyl-4,4'-diamine moieties.

9. An integrated hole-injection and hole-transporting layer, comprising:
(a) a hole-injection layer, and
(b) a hole-transporting layer, wherein the hole-transporting layer comprises a crosslinked hole-transporting material derived from a compound of claim 2, and wherein the crosslinked hole-transporting material is formed by crosslinking on the surface of the hole-injection layer.

10. A device, comprising:
(a) an anode;
(b) a cathode;
(c) an emissive layer intermediate the anode and the cathode; and
(d) a hole-transporting layer intermediate the anode and the emissive layer, wherein the hole-transporting layer comprises a crosslinked hole-transporting material derived from a compound of claim 2.

11. A device, comprising:
(a) an anode;
(b) a cathode;
(c) an emissive layer intermediate the anode and the cathode; and
(d) a hole-transporting layer intermediate the anode and the emissive layer, wherein the hole-transporting layer comprises a bilayer structure comprising:
(i) a first layer comprising a crosslinked hole-transporting material and having a first solid state ionization potential;
(ii) a second layer comprising a crosslinked hole-transporting material and having a second solid state ionization potential,
wherein the first solid state ionization potential is less than the second solid state ionization potential, and
wherein at least one of the first or second layers comprises a crosslinked hole-transporting material derived from a compound of claim 2.

12. A device, comprising:
(a) an anode;
(b) a cathode;
(c) an emissive layer intermediate the anode and the cathode; and
(d) an integrated hole-injection and hole-transporting layer intermediate the anode and the emissive layer, wherein the integrated hole-injection and hole-transporting layer comprises a hole-injection layer, and a hole-transporting layer, wherein the hole-transporting layer comprise crosslinked hole-transporting material derived from a compound of claim 2.

* * * * *